(12) United States Patent
Jeon et al.

(10) Patent No.: US 12,342,669 B2
(45) Date of Patent: Jun. 24, 2025

(54) DISPLAY DEVICE AND METHOD FOR FABRICATING THE SAME

(71) Applicant: Samsung Display Co., LTD., Yongin-si (KR)

(72) Inventors: Hyung Il Jeon, Seoul (KR); Sung Kook Park, Suwon-si (KR); Ki Seong Seo, Seoul (KR); Dae Ho Song, Hwaseong-si (KR); So Yeon Yoon, Uijeongbu-si (KR); Ok Yi Lee, Seoul (KR); Jin Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 638 days.

(21) Appl. No.: 17/565,056

(22) Filed: Dec. 29, 2021

(65) Prior Publication Data
US 2022/0352241 A1    Nov. 3, 2022

(30) Foreign Application Priority Data
Apr. 30, 2021    (KR) .......................... 10-2021-0056563

(51) Int. Cl.
| H10H 29/14 | (2025.01) |
| H10H 20/01 | (2025.01) |
| H10H 20/831 | (2025.01) |
| H10H 20/851 | (2025.01) |

(52) U.S. Cl.
CPC .......... *H10H 29/142* (2025.01); *H10H 20/01* (2025.01); *H10H 20/8312* (2025.01); *H10H 20/8512* (2025.01); *H10H 20/032* (2025.01); *H10H 20/0361* (2025.01)

(58) Field of Classification Search
CPC ... H01L 25/0753; H01L 27/156; H10H 20/01; H10H 20/0361; H10H 20/032; H10H 20/8512; H10H 20/8312; H10H 29/143; H10H 29/851–8517
See application file for complete search history.

(56) References Cited

U.S. PATENT DOCUMENTS

| 10,096,647 | B2 | 10/2018 | Takeya et al. |
| 10,643,980 | B2 | 5/2020 | Hsieh et al. |
| 2013/0126081 | A1 | 5/2013 | Hu et al. |
| 2013/0126589 | A1 | 5/2013 | Bibl et al. |
| 2013/0126891 | A1 | 5/2013 | Bibl et al. |
| 2017/0358624 | A1* | 12/2017 | Takeya .................. H01L 33/42 |
| 2018/0074372 | A1* | 3/2018 | Takeya .............. G02F 1/133514 |
| 2022/0165921 | A1* | 5/2022 | Choi ..................... H01L 33/505 |

FOREIGN PATENT DOCUMENTS

| JP | 2017161604 A | * | 9/2017 |
| KR | 10-2017-0064775 A | | 6/2017 |
| KR | 10-2018-0078940 A | | 7/2018 |
| WO | WO 2017217703 A1 | | 12/2017 |

* cited by examiner

*Primary Examiner* — Mariceli Santiago
(74) *Attorney, Agent, or Firm* — Womble Bond Dickinson (US) LLP

(57) ABSTRACT

A display device includes a substrate, pixel electrodes on the substrate, light emitting elements on corresponding ones of the pixel electrodes, a first partition wall around sides of each of the light emitting elements, a common electrode on an upper surface of each of the light emitting elements, wavelength conversion layers on the common electrode, and a second partition wall around sides of each of the wavelength conversion layers. The first partition wall has conductivity.

20 Claims, 52 Drawing Sheets

DISPLAY DEVICE AND METHOD FOR FABRICATING THE SAME

CROSS-REFERENCE TO RELATED APPLICATION

This application claims priority to, and the benefit of, Korean Patent Application No. 10-2021-0056563 filed on Apr. 30, 2021, in the Korean Intellectual Property Office (KIPO), the entire content of which is incorporated by reference herein.

BACKGROUND

1. Field

The present disclosure relates to a display device and a method for fabricating the same.

2. Description of the Related Art

With the advancement of the information age, the demand for a display device for displaying an image has increased with various forms. The display device may be a flat panel display device such as a liquid crystal display device, a field emission display device, and a light emitting display panel. The light emitting display device may include an organic light emitting display device including an organic light emitting diode (OLED) element as a light emitting element, an inorganic light emitting display device including an inorganic semiconductor element as a light emitting element, or a micro light emitting diode element as a light emitting element.

Recently, a head mounted display including a light emitting display device has been developed. The head mounted display (HMD) is a glasses type monitor device of a virtual reality (VR) or augmented reality (AR), which is worn by a user in the form of glasses or helmet and forms a focus at a distance close to eyes of the user.

A high-resolution micro light emitting diode display panel including a micro light emitting diode element is applied to a head mounted display. In order to prevent light emitted from the micro light emitting diode element from being mixed with light emitted from another micro light emitting diode element adjacent thereto, a partition wall may be disposed between the micro light emitting diode elements. However, because a width of the partition wall may be reduced due to high integration of the micro light emitting diode elements, it may be difficult to fabricate the partition wall.

SUMMARY

Aspects and features of embodiments of the present disclosure provide a display device and a method for fabricating the same, in which a partition wall between light emitting elements may easily be fabricated.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, pixel electrodes on the substrate, light emitting elements on corresponding ones of the pixel electrodes, a first partition wall around sides of each of the light emitting elements, a common electrode on an upper surface of each of the light emitting elements, wavelength conversion layers on the common electrode, and a second partition wall around sides of each of the wavelength conversion layers. The first partition wall has conductivity.

The common electrode may be in contact with the first partition wall and the second partition wall.

The second partition wall may overlap the first partition wall in a thickness direction of the substrate.

The common electrode may be between the first partition wall and the second partition wall.

Any one of the wavelength conversion layers may overlap any one of the light emitting elements in a thickness direction of the substrate.

A width of the wavelength conversion layer in a first direction is wider than that of the light emitting element.

The second partition wall may have conductivity.

The first partition wall and the second partition wall may include an opaque metal material.

The first partition wall and the second partition wall include a same material.

The second partition wall may include a light-shielding material that absorbs or shields light.

The first partition wall may be in contact with the second partition wall.

A distance between the common electrodes that are adjacent to each other in a first direction may be shorter than a distance between the light emitting elements that are adjacent to each other in the first direction.

A distance between the common electrodes adjacent to each other in a first direction may be shorter than a width of the first partition wall and a width of the second partition wall in the first direction.

According to one or more embodiments of the present disclosure, there is provided a display device including a substrate, a first partition wall on the substrate, a second partition wall on the first partition wall, a light emitting element in a light emission area partitioned by the first partition wall and the second partition wall on the substrate and extended in a thickness direction of the substrate, and a wavelength conversion layer on the light emitting element in the light emission area to convert a wavelength of light emitted from the light emitting element. The second partition wall has conductivity.

A thickness of the light emitting element may be different from that of the second partition wall.

A thickness of the light emitting element may be the same as that of the first partition wall.

The light emitting element includes a first semiconductor layer on the substrate, an active layer on the first semiconductor layer, and a second semiconductor layer on the active layer.

The first partition wall may include a first sub-partition wall having a same material as that of the first semiconductor layer, a second sub-partition wall having a same material as that of the active layer, and a third sub-partition wall having a same material as that of the second semiconductor layer.

The display device may further include a common electrode between the light emitting element and the wavelength conversion layer and between the first partition wall and the second partition wall.

According to one or more embodiments of the present disclosure, there is provided a method for fabricating a display device, the method including forming a first connection electrode layer on a first substrate, and forming a second connection electrode layer on a light emitting material layer of a second substrate, forming a connection electrode layer by bonding the first connection electrode layer to the second connection electrode layer, and removing the second substrate, forming a mask pattern on the light emitting material layer, and etching the light emitting material layer and the connection electrode layer in accordance with the mask pattern to form light emitting elements, forming an insulating film on the light emitting elements, forming a partition wall material layer on the insulating film, and exposing upper surfaces of the light emitting elements using a polishing process to form a first partition wall around sides of each of the light emitting elements, forming a common electrode on the upper surfaces of the light emitting elements and the first partition wall, forming a photoresist pattern overlapping the light emitting elements on the common electrode in a thickness direction of the first substrate, forming a second partition wall on at least a portion of the common electrode that is not covered by the photoresist pattern, and removing the photoresist pattern, and forming a wavelength conversion layer in an area partitioned by the second partition wall.

According to the aforementioned and other embodiments of the present disclosure, as a partition wall is formed of a conductive material, heat generated from a light emitting element may be emitted to the partition wall, whereby wavelength conversion particles of a wavelength conversion layer may be prevented from being damaged due to the heat emission of the light emitting element.

According to the aforementioned and other embodiments of the present disclosure, a partition wall may be formed of a metal material having high reflectance, whereby light emitted from a light emitting element may be reflected from a connection electrode and the partition wall and then output to an upper portion of the light emitting element. Therefore, emission efficiency of the light from the light emitting element may be enhanced due to a first partition wall.

According to the aforementioned and other embodiments of the present disclosure, after light emitting elements are formed, a partition wall material layer is formed to be filled between the light emitting elements by electro-plating or electroless-plating, and an upper surface of each of the light emitting elements is exposed through a polishing process such as a CMP process, whereby a partition wall having a very thin width may more easily be formed between the light emitting elements.

According to the aforementioned and other embodiments of the present disclosure, after photoresist patterns are formed, a partition wall material layer is formed to be filled between the photoresist patterns by electro-plating or electroless-plating, and an upper surface of the photoresist patterns is exposed through a polishing process such as a CMP process, whereby a partition wall having a very thin width may more easily be formed between the photoresist patterns.

According to the aforementioned and other embodiments of the present disclosure, the photoresist pattern is removed, and a wavelength conversion layer is formed in each of first light emission area, a second light emission area and a third light emission area, which are partitioned by a partition wall, by one time process, whereby a fabricating process may be simplified.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
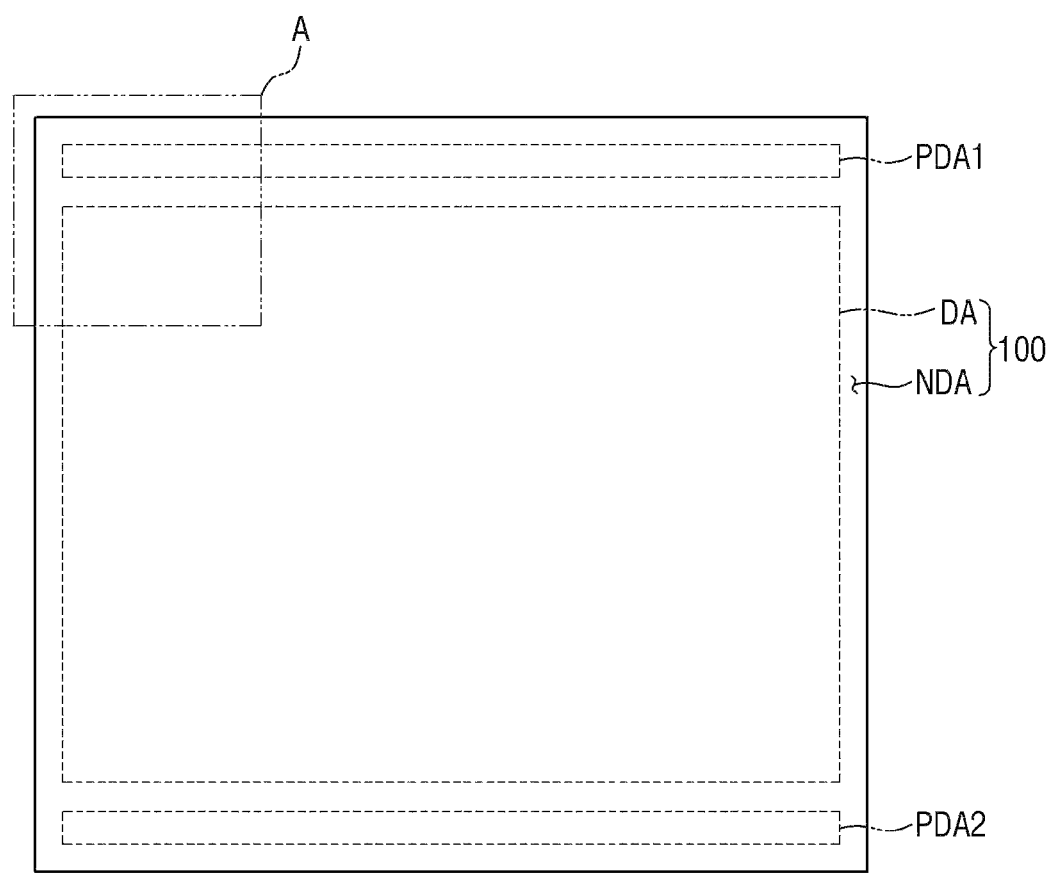
FIG. 1 is a layout view of a display device according to one or more embodiments of the present disclosure.
Figure 1:
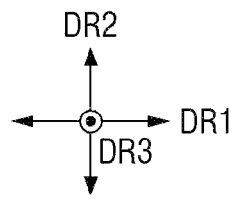

Aspects and features of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
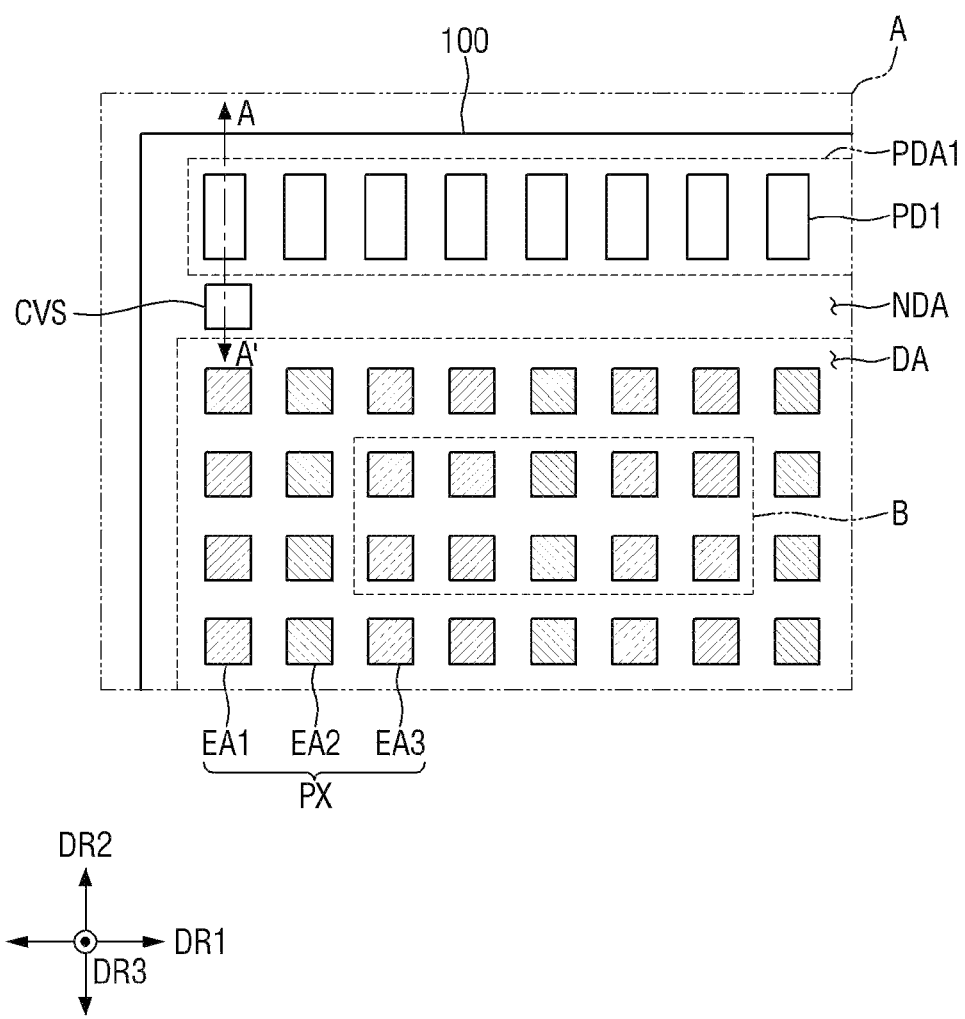
FIG. 2 is a detailed layout view illustrating an area A of FIG. 1.

FIG. 1 is a layout view of a display device according to one or more embodiments of the present disclosure. FIG. 2 is a detailed layout view illustrating an area A of FIG. 1, and FIG. 3 is a layout view illustrating pixels of a display panel according to one or more embodiments of the present disclosure.

Figure 3:
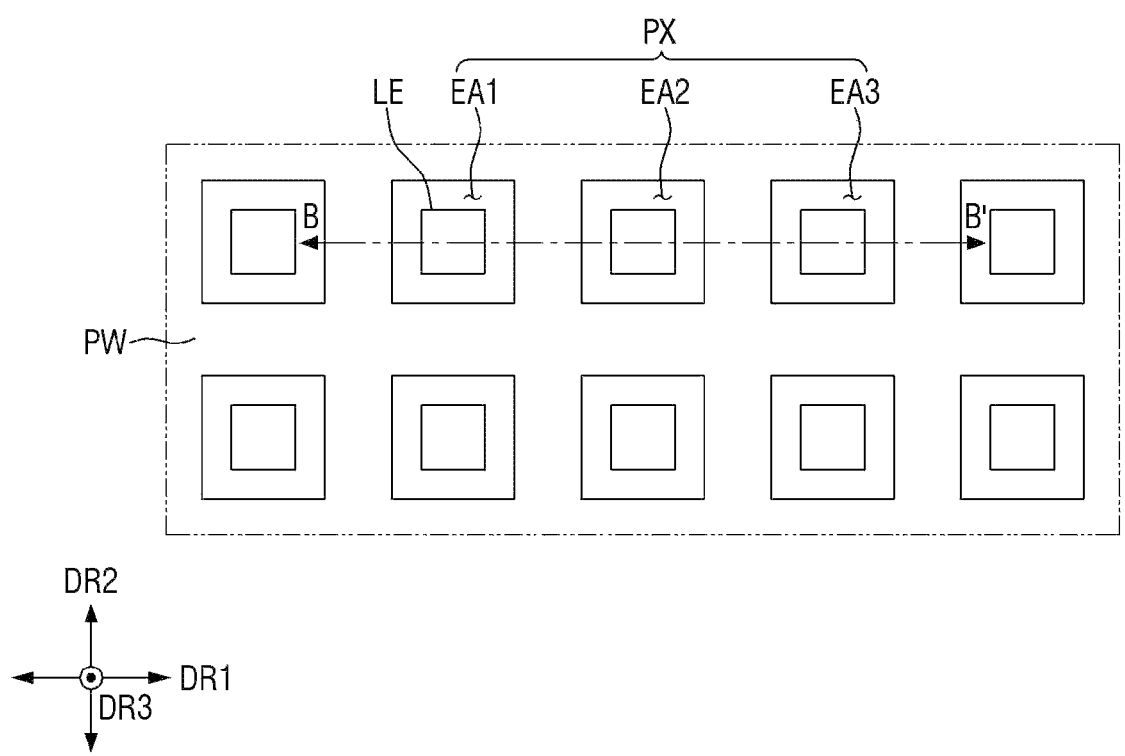
FIG. 3 is a layout view illustrating pixels of a display panel according to one or more embodiments of the present disclosure.

Although the display device according to one or more embodiments of the present disclosure is a micro light emitting diode display device (or nano light emitting diode display device) including a micro light emitting diode as a light emitting element in FIGS. 1 to 3, the present disclosure is not limited thereto.

Also, although the display device according to one or more embodiments of the present disclosure is a light emitting diode on Silicon (LEDoS) having light emitting diodes disposed on a semiconductor circuit board 110 formed by a semiconductor process as light emitting elements in FIGS. 1 to 3, it should be noted that the present disclosure is not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, "left," "right," "up," and "down," indicate directions when the display panel 100 is viewed from the plane. For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to one or more embodiments includes a display panel 100 including a display area DA and a non-display area NDA.

The display panel 100 may have a rectangular plane shape having a long side of the first direction DR1 and a short side of the second direction DR2, but the plane shape of the display panel 100 is not limited thereto, and may have another polygonal shape in addition to the rectangular shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example of FIG. 1, the plane shape of the display area DA is a rectangular shape. The display area DA may be disposed in a central area of the display panel 100. The non-display area NDA may be disposed in the vicinity of the display area DA. The non-display area NDA may be disposed to be around (e.g., surround) the display area DA along the edge or periphery of the display area DA.

The display area DA of the display panel 100 may include a plurality of pixels PX. The pixels PX may be defined as a minimum light emission unit capable of displaying white light.

Each of the plurality of pixels PX may include a plurality of light emission areas EA1, EA2, and EA3 that emit light. In one or more embodiments of the present disclosure, each of the plurality of pixels PX includes three light emission areas EA1, EA2, and EA3, but is not limited thereto. For example, each of the plurality of pixels PX may include four light emission areas.

Each of the plurality of light emission areas EA1, EA2, and EA3 may include a light emitting element LE for emitting first light. Although the light emitting element LE has a rectangular plane shape, the present disclosure is not limited thereto. For example, the light emitting element LE may have a polygonal shape in addition to a rectangular shape, a circular shape, an oval shape, or an irregular shape.

Each of the first light emission areas EA1 indicates an area for emitting first light. Each of the first light emission areas EA1 may output the first light output from the light emitting element LE as it is. The first light may be the light of a blue wavelength band. For example, the blue wavelength band may range from 370 nm to 460 nm, approximately, but the present disclosure is not limited thereto.

Each of the second light emission areas EA2 indicates an area for emitting second light. Each of the second light emission areas EA2 may convert a portion of the first light output from the light emitting element LE into the second light and output the second light. The second light may be the light of a green wavelength band. For example, the green wavelength band may range from 480 nm to 560 nm, approximately, but the present disclosure is not limited thereto.

Each of the third light emission areas EA3 indicates an area for emitting third light. Each of the third light emission areas EA3 may convert a portion of the first light output from the light emitting element LE into the third light and output the third light. The third light may be the light of a red wavelength band. For example, the red wavelength band may range from 600 nm to 750 nm, approximately, but the present disclosure is not limited thereto.

The first light emission areas EA1, the second light emission areas EA2, and the third light emission areas EA3 may be alternately arranged along the first direction DR1. For example, the first light emission areas EA1, the second light emission areas EA2, and the third light emission areas EA3 may be disposed in the first direction DR1 in due order.

The first light emission areas EA1 may be arranged along the second direction DR2. The second light emission areas EA2 may be arranged along the second direction DR2. The third light emission areas EA3 may be arranged along the second direction DR2.

Figure 5:
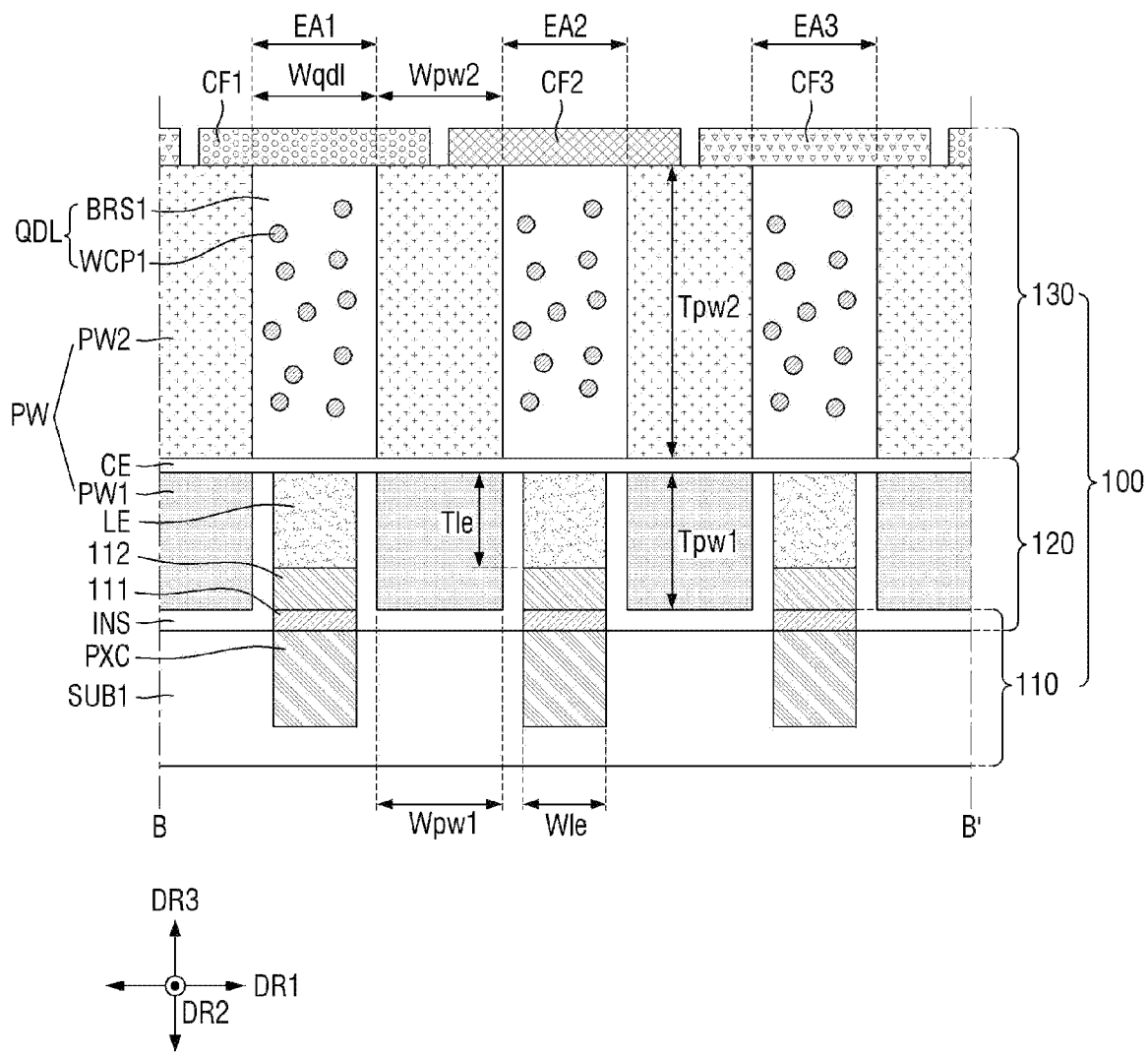
FIG. 5 is a cross-sectional view illustrating an example of a display panel taken along line the B-B' of FIG. 3.

The display area DA of the display panel may further include a partition wall PW that partitions the plurality of light emission areas EA1, EA2, and EA3. The partition wall PW may be disposed to be around (e.g., surround) the light emitting element LE. The partition wall PW may be disposed to be spaced from the light emitting element LE. The partition wall PW may have a meshed plane shape, a net plane shape, or a lattice plane shape. The partition wall PW may include a first partition wall PW1 (FIG. 5) and a second partition wall PW2 (FIG. 5).

Although FIGS. 2 and 3 illustrate that each of the plurality of light emission areas EA1, EA2 and EA3 defined by the partition wall PW has a rectangular plane shape, the present disclosure is not limited thereto. For example, each of the plurality of light emission areas EA1, EA2, and EA3 defined by the partition wall PW may have a polygonal shape in addition to the rectangular shape, a circular shape, an oval shape, or an irregular plane shape.

The non-display area NDA may include a common voltage supply portion CVS, a first pad area PDA1, and a second pad area PDA2.

The first pad area PDA1 may be disposed above the display panel 100 in the second direction DR2. The first pad area PDA1 may include first pads PD1 connected with an external circuit board CB.

The second pad area PDA2 may be disposed below the display panel 100 in the second direction DR2. The second pad area PDA2 may include second pads for connection with the external circuit board CB. In one or more embodiments, the second pad area PDA2 may be omitted.

Figure 4:
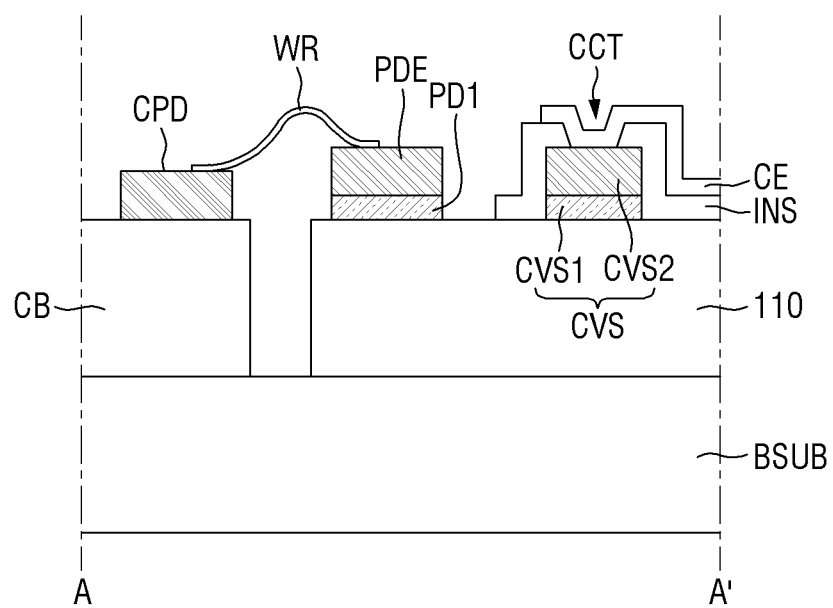
FIG. 4 is a cross-sectional view illustrating an example of a display panel taken along the line A-A' of FIG. 2.
Figure 4:
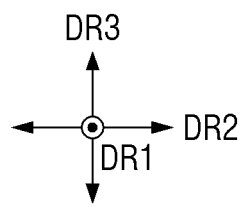

The common voltage supply portion CVS may be disposed between the first pad area PDA1 and the display area DA. The common voltage supply portion CVS may be disposed between the second pad area PDA2 and the display area DA. The common voltage supply portion CVS may be connected to the common electrode CE (FIGS. 4 and 5). For this reason, a common voltage of the common voltage supply portion CVS may be supplied to the common electrode CE (FIGS. 4 and 5). The common voltage supply portion CVS may be electrically connected to any one of first pads PD1 of the first pad area PDA1. Alternatively, the common voltage supply portion CVS may be electrically connected to any one of second pads PD2 of the second pad area PDA2.

Figure 6:
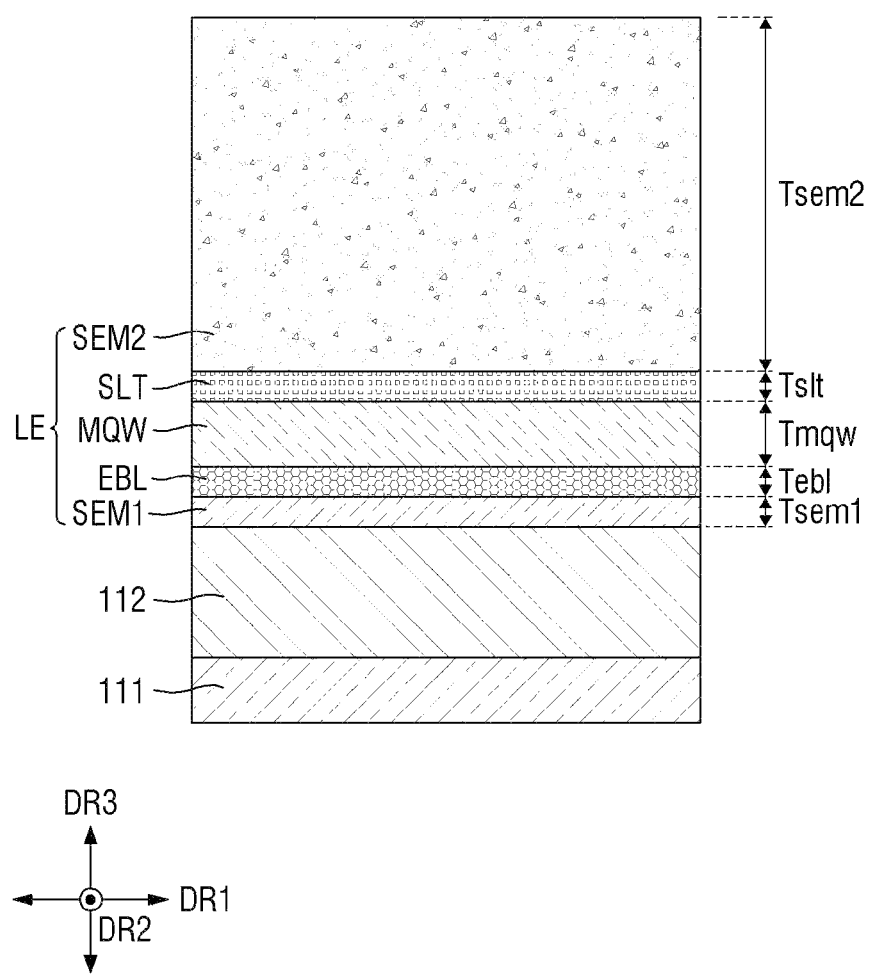
FIG. 6 is a detailed enlarged cross-sectional view illustrating an example of a pixel electrode, a connection electrode and a light emitting element.

FIG. 4 is a cross-sectional view illustrating an example of a display panel taken along the line A-A' of FIG. 2. FIG. 5 is a cross-sectional view illustrating an example of a display panel taken along the line B-B' of FIG. 3. FIG. 6 is a detailed enlarged cross-sectional view illustrating an example of a pixel electrode, a connection electrode, and a light emitting element.

Referring to FIGS. 4 to 6, the display panel 100 may include a semiconductor circuit board 110, a light emitting element layer 120, and a color control layer 130.

The semiconductor circuit board 110 may include a first substrate SUB1, a plurality of pixel circuit areas PXC, pixel electrodes 111, a first pad PD1, and a first common voltage supply portion CVS1 of a common voltage supply portion CVS.

The first substrate SUB1 may be a silicon wafer substrate. The first substrate SUB1 may be made of single crystal silicon.

Each of the plurality of pixel circuit areas PXC may be disposed on the first substrate SUB1. Each of the plurality of pixel circuit areas PXC may include a complementary metal-oxide-semiconductor (CMOS) circuit formed using a semiconductor process. Each of the plurality of pixel circuit areas PXC may include at least one transistor formed by the semiconductor process. Each of the plurality of pixel circuit areas PXC may further include at least one capacitor formed by the semiconductor process.

The plurality of pixel circuit areas PXC may be disposed in the display area DA. Each of the plurality of pixel circuit areas PXC may be connected to its corresponding pixel electrode 111. That is, the plurality of pixel circuit areas PXC and the plurality of pixel electrodes 111 may be connected to each other in a one-to-one correspondence. Each of the pixel circuit areas PXC may apply a pixel voltage or an anode voltage to the pixel electrode 111.

Each of the pixel electrodes 111 may be disposed on its corresponding pixel circuit area PXC. Each of the pixel electrodes 111 may be an exposed electrode exposed from the pixel circuit area PXC. That is, each of the pixel electrodes 111 may be protruded from an upper surface of the pixel circuit area PXC. Each of the pixel electrodes 111 may integrally be formed with the pixel circuit area PXC. Each of the pixel electrodes 111 may be supplied with a pixel voltage or an anode voltage from the pixel circuit area PXC. The pixel electrodes 111 may be formed of aluminum (Al).

Each of the first pad PD1 and the first common voltage supply portion CVS1 may be an exposed electrode exposed from the first substrate SUB1. Each of the first pad PD1 and the first common voltage supply portion CVS1 may include the same material as that of the pixel electrodes 111. For example, each of the first pad PD1 and the first common voltage supply portion CVS1 may include aluminum (Al).

Because the second pads of the second pad area PDA2 are substantially the same as the first pad PD1 described with reference to FIG. 4, their description will be omitted.

The light emitting element layer 120 may be a layer emitting a desired light (e.g., a predetermined light) by including light emitting elements LE. The light emitting element layer 120 may include connection electrodes 112, a pad connection electrode PDE, a second common voltage supply portion CVS2 of the common voltage supply portion CVS, light emitting elements LE, a common connection electrode CE, an insulating film INS, and a first partition wall PW1 of the partition wall PW.

Each of the connection electrodes 112 may be disposed on its corresponding pixel electrode 111. That is, the connection electrodes 112 may include a metal material for bonding the pixel electrodes 111 to the light emitting elements LE. For example, the connection electrodes 112 may include at least one of gold (Au), copper (Cu), aluminum (Al), silver (Ag), or tin (Sn). Alternatively, the connection electrodes 112 may include a first layer including any one of gold (Au), copper (Cu), aluminum (Al), silver (Ag) and tin (Sn), and a second layer including the other one of gold (Au), copper (Cu), aluminum (Al), silver (Ag) and tin (Sn). In this case, the second layer may be disposed on the first layer.

The pad connection electrode PDE may be disposed on the first pad PD1, and the second common voltage supply portion CVS2 may be disposed on the first common voltage supply portion CVS1. The pad connection electrode PDE may be in contact with an upper surface of the first pad PD1, and the second common voltage supply portion CVS2 may be in contact with an upper surface of the first common voltage supply portion CVS1. The pad connection electrode PDE and the second common voltage supply portion CVS2 may include the same material as that of the connection electrodes 112. For example, each of the pad connection electrode PDE and the second common voltage supply portion CVS2 may include at least one of gold (Au), copper (Cu), aluminum (Al), silver (Ag) or tin (Sn). When each of the connection electrodes 112 includes the first layer and the second layer, each of the pad connection electrode PDE and the second common voltage supply portion CVS2 may include the first layer and the second layer.

The pad connection electrode PDE may be connected to a pad CPD of the circuit board CB through a conductive connection member such as a wire WR. That is, the first pad PD1, the pad connection electrode PDE, the wire WR, and the pad CPD of the circuit board CB may electrically be connected to one another.

The semiconductor circuit board 110 and the circuit board CB may be disposed on a base substrate BSUB. The semiconductor circuit board 110 and the circuit board CB may be attached to an upper surface of the base substrate BSUB by an adhesive member such as a pressure sensitive adhesive.

The circuit board CB may be a flexible printed circuit board (FPCB), a printed circuit board (PCB), a flexible printed circuit (FPC), or a flexible film such as a chip on film (COF).

The light emitting element layer 120 may include the first light emission areas EA1, the second light emission areas EA2, and the third light emission areas EA3, which are partitioned by the partition wall PW. The light emitting element LE may be disposed in each of the first light emission areas EA1, the second light emission areas EA2, and the third light emission areas EA3. The partition wall PW include a first partition wall PW1 of the light emitting element layer 120 and a second partition wall PW2 of the color control layer 130.

The light emitting element LE may be disposed on the connection electrode 112 in each of the first light emission areas EA1, the second light emission areas EA2, and the third light emission areas EA3. The light emitting element LE may be a vertical light emitting diode element extended in the third direction DR3. That is, a length of the light emitting element LE in the third direction DR3 may be longer than a length in a horizontal direction. The length in the horizontal direction indicates a length in the first direction DR1 or a length in the second direction DR2. For example, the length of the light emitting element LE in the third direction DR3 may be 1 μm to 5 μm, approximately.

The light emitting element LE may be a micro light emitting diode element. The light emitting element LE includes a first semiconductor layer SEM1, an electron blocking layer EBL, an active layer MQW, a superlattice layer SLT, and a second semiconductor layer SEM2 arranged along the third direction DR3 as shown in FIG. 6.

The first semiconductor layer SEM1, the electron blocking layer EBL, the active layer MQW, the superlattice layer SLT, and the second semiconductor layer SEM2 may be sequentially deposited in the third direction DR3.

The first semiconductor layer SEM1 may be disposed on the connection electrode 112. The first semiconductor layer SEM1 may be doped with a first conductive type dopant such as Mg, Zn, Ca, Se, and Ba. For example, the first semiconductor layer SEM1 may be p-GaN doped with p-type Mg. A thickness Tsem1 of the first semiconductor layer SEM1 may be 30 nm to 200 nm, approximately.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness Tebl of the electron blocking layer EBL may be 10 nm to 50 nm, approximately. In one or more embodiments, the electron blocking layer EBL may be omitted.

The active layer MQW may be disposed on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light having a main peak wavelength band ranging from 450 nm to 495 nm, that is, light of a blue wavelength band.

The active layer MQW may include a single or multiple quantum well structure material. When the active layer MQW includes a multiple quantum well structure material, a plurality of well layers and a plurality of barrier layers may be alternately deposited. In this case, the well layer may be formed of, but not limited to, InGaN, and the barrier layer may be formed of, but not limited to, GaN or AlGaN. A thickness of the well layer may be 1 nm to 4 nm, approximately, and a thickness of the barrier layer may be 3 nm to 10 nm, approximately.

Alternately, the active layer MQW may have a structure in which semiconductor materials having a large band gap energy and semiconductor materials having a low band gap energy are alternately deposited, and may include different Group III to Group V semiconductor materials depending on a wavelength range of light that is emitted. The light emitted from the active layer MQW is not limited to the first light (e.g., light of a blue wavelength band), and may emit second light (e.g., light of a green wavelength band) or third light (e.g., light of red wavelength band) as the case may be.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness Tslt of the superlattice layer SLT may be 50 nm to 200 nm, approximately. In one or more embodiments, the superlattice layer SLT may be omitted.

The second semiconductor layer SEM2 may be disposed on the superlattice layer SLT. The second semiconductor layer SEM2 may be doped with a second conductive type dopant such as Si, Ge, and Sn. For example, the second semiconductor layer SEM2 may be n-GaN doped with n-type Si. A thickness Tsem2 of the second semiconductor layer SEM2 may be 2 μm to 4 μm, approximately.

The insulating film INS may be formed on sides of each of the light emitting elements LE. The insulating film INS may not be disposed on an upper surface of each of the light emitting elements LE. Also, the insulating film INS may be formed on sides of each of the connection electrodes 112 and/or the pixel electrodes 111. Also, the insulating film INS may be disposed on the first substrate SUB1. Alternatively, the insulating film INS disposed on the first substrate SUB1 may be omitted. The insulating film INS may be formed of an inorganic film such as a silicon oxide film ($SiO_2$), an aluminum oxide film ($Al_2O_3$), or a hafnium oxide film (HfOX), but is not limited thereto.

The first partition wall PW1 may be disposed between the light emitting elements LE that are adjacent to each other in the first direction DR1 and the second direction DR2. The first partition wall PW1 may be around (e.g., surround) the sides of each of the light emitting elements LE. The first partition wall PW1 may be disposed on the insulating film INS. Sides of the first partition wall PW1 may be in contact with the insulating film INS disposed on the sides of each of the light emitting elements LE. A lower surface of the first partition wall PW1 may be in contact with the insulating film INS disposed on the first substrate SUB1. Alternatively, when the insulating film INS disposed on the first substrate SUB1 is omitted, the lower surface of the first partition wall PW1 may be in contact with the first substrate SUB1.

An upper surface of the first partition wall PW1, an upper surface of the insulating film INS, and an upper surface of the light emitting element LE may be connected to one another to be flat. The insulating film INS is disposed between the first partition wall PW1 and the first substrate SUB1, whereas the pixel electrode 111 and the connection electrode 112 are disposed between the light emitting element LE and the first substrate SUB1. Therefore, a height Tpw1 of the first partition wall PW1 in the third direction DR3 may be greater than a height Tle of the light emitting element LE.

The first partition wall PW1 may include a conductive material. For example, the first partition wall PW1 may be formed of a metal material having a high heat conduction rate. In this case, because heat generated from the light emitting element LE may be emitted to the first partition wall PW1, the wavelength conversion particles WCP1 of the wavelength conversion layer QDL may be prevented from being damaged due to heat emission of the light emitting element LE.

Also, the first partition wall PW1 may include a metal material having high reflectance. In this case, light emitted from the light emitting element LE may be reflected from the connection electrode 112 and the first partition wall PW1 and then output to the upper portion of the light emitting element LE. Therefore, emission efficiency of the light of the light emitting element LE may be enhanced due to the first partition wall PW1.

The first partition wall PW1 may include an opaque metal material such as molybdenum (Mo), aluminum (Al), chromium (Cr), gold (Au), titanium (Ti), nickel (Ni), neodymium (Nd), and copper (Cu).

The common electrode CE may be disposed on the upper surface of each of the light emitting elements LE, the upper surface of the insulating film INS, and the upper surface of the first partition wall PW1. The common electrode CE may include a transparent conductive material. For example, the common electrode CE may include a transparent conductive oxide (TCO) such as indium tin oxide (ITO) or indium zinc oxide (IZO).

The common electrode CE may be electrically connected with the first partition wall PW1. In this case, because resistance of the common electrode CE may be lowered by the first partition wall PW1, a voltage drop of a common voltage applied to the common electrode CE due to resistance may be reduced or prevented from occurring.

The color control layer 130 controls the first light emitted from the light emitting elements LE of the light emitting element layer 120 as the first light, the second light, and the third light in accordance with the light emission areas EA1, EA2, and EA3. For example, the color control layer 130 may output the first light emitted from the light emitting element LE in each of the first light emission areas EA1 as it is, convert a portion of the first light emitted from the light emitting element LE in each of the second light emission areas EA2 into the second light and output the second light, and convert a portion of the first light emitted from the light emitting element LE in each of the third light emission areas EA3 into the third light and output the third light.

The color control layer 130 may include wavelength conversion layers QDL, a second partition wall PW2 of the partition wall PW, and a plurality of color filters CF1, CF2, and CF3.

The wavelength conversion layer QDL may be disposed on the common electrode CE in each of the first light emission areas EA1, the second light emission areas EA2, and the third light emission areas EA3. The wavelength conversion layer QDL may overlap the light emitting element LE in the third direction DR3.

The wavelength conversion layer QDL may convert a portion of the first light incident from the light emitting element LE into fourth light and emit the fourth light. For example, the fourth light may be the light of a yellow wavelength band. The fourth light may be the light that includes both a green wavelength band and a red wavelength band. That is, the fourth light may be the mixture of light of the second light and the third light.

The wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic resin, a cardo-based resin, or an imide-based resin.

The first wavelength conversion particles WCP1 may convert the first light incident from the light emitting element LE into the fourth light. For example, the first wavelength conversion particles WCP1 may convert the light of the blue wavelength band into the light of the yellow wavelength band. The first wavelength conversion particles WCP1 may be quantum dots (QD), quantum rods, fluorescent materials, or phosphorescent materials. The quantum dots may include Group IV nanocrystal, Group II-VI compound nanocrystal, Group III-V compound nanocrystal, Group IV-VI nanocrystal, or their combination.

The quantum dots may include a core and a shell that over-coats the core. For example, the core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si, or Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, or PbTe.

The wavelength conversion layer QDL may further include a scatterer for scattering the light of the light emitting element LE in a random direction. In this case, the scatterer may include metal oxide particles or organic particles. For example, the metal oxide may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin. A diameter of the scatterer may be several nanometers to several tens of nanometers.

The second partition wall PW2 may partition the first light emission areas EA1, the second light emission areas EA2, and the third light emission areas EA3 together with the first partition wall PW1. The second partition wall PW2 may be disposed between the wavelength conversion layers QDL adjacent to each other in the first direction DR1 and the second direction DR2. The second partition wall PW2 may be around (e.g., surround) the sides of each of the wavelength conversion layers QDL. Sides of the second partition wall PW2 may be in contact with the sides of each of the wavelength conversion layers QDL.

The second partition wall PW2 may be disposed on the common electrode CE at a location adjacent to the first light emission areas EA1, the second light emission areas EA2, and the third light emission areas EA3. A lower surface of the second partition wall PW2 may be in contact with the common electrode CE.

The second partition wall PW2 may include a conductive material. For example, the second partition wall PW2 may be formed of a metal material having a high heat conduction rate. In this case, because heat generated from the light emitting element LE may be emitted to the second partition wall PW2 through the first partition wall PW1 and the common electrode CE, the wavelength conversion particles WCP1 of the wavelength conversion layer QDL may be prevented from being damaged due to heat emission of the light emitting element LE.

Also, the second partition wall PW2 may include a metal material having high reflectance. In this case, the light converted by the first wavelength conversion particles WCP1 of the wavelength conversion layer QDL and the light scattered by the scatterer may be reflected from the second partition wall PW2 and then emitted by passing through the color filters CF1, CF2, and CF3. Therefore, emission efficiency of the light from the light emitting element LE may be enhanced due to the second partition wall PW2.

The second partition wall PW2 may be formed of the same material as that of the first partition wall PW1, or may be formed of a material different from that of the first partition wall PW1. The second partition wall PW2 may include an opaque metal material such as molybdenum (Mo), aluminum (Al), chromium (Cr), gold (Au), titanium (Ti), nickel (Ni), neodymium (Nd), and copper (Cu).

Alternatively, the second partition wall PW2 may include a light-shielding material that absorbs or shields light. The light-shielding material may be an inorganic black pigment or an organic black pigment, such as carbon black. In this case, due to the second partition wall PW2, the light emitted from the light emitting elements adjacent to each other may be prevented from being mixed. Therefore, when the second partition wall PW2 includes a light-shielding material, a black matrix disposed among the plurality of color filters CF1, CF2, and CF3 may be omitted.

The upper surface of the second partition wall PW2 and upper surfaces of the wavelength conversion layers QDL may be connected to each other to be flat. As a thickness Tpw2 of the second partition wall PW2 is increased, a content of the first wavelength conversion particles WCP1 contained in the wavelength conversion layer QDL is increased, whereby light conversion efficiency of the wavelength conversion layer QDL may be increased. Therefore, in order to enhance light conversion efficiency of the light emitting element LE, the thickness Tpw2 of the second partition wall PW2 may be greater than the thickness Tpw1 of the first partition wall PW1, but the present disclosure is not limited thereto. The thickness Tpw2 of the second partition wall PW2 may be set in consideration of light conversion efficiency of the wavelength conversion layer QDL.

The second partition wall PW2 may overlap the first partition wall PW1 in the third direction DR3. In order to enhance efficiency of the light from the light emitting element LE, which is converted by the wavelength conversion layer QDL, a width Wqdl of the wavelength conversion layer QDL may be wider than a width Wle of the light emitting element LE, and a width Wpw2 of the second partition wall PW2 may be equal to or less than a width Wpw1 of the first partition PW1.

The plurality of color filters CF1, CF2, and CF3 may include first color filters CF1, second color filters CF2, and third color filters CF3.

Each of the first color filters CF1 may be disposed on the wavelength conversion layer QDL in the first light emission area EA1. Also, each of the first color filters CF1 may be disposed on the second partition wall PW2. Each of the first color filters CF1 may transmit the first light and absorb or block the fourth light. For example, each of the first color filters CF1 may transmit light of the blue wavelength band and absorb or block light of the green and red wavelength bands. Therefore, each of the first color filters CF1 may transmit the first light, which is not converted by the wavelength conversion layer QDL, among the first light emitted from the light emitting element LE, and may absorb or block the fourth light converted by the wavelength conversion layer QDL. Therefore, each of the first light emission areas EA1 may emit the first light.

Each of the second color filters CF2 may be disposed on the wavelength conversion layer QDL in the second light emission area EA2. Also, each of the second color filters CF2 may be disposed on the partition wall PW. Each of the second color filters CF2 may transmit the second light, and may absorb or block the first light and the third light. For example, each of the second color filters CF2 may transmit the light of the green wavelength band and absorb or block the light of the blue and red wavelength bands. Therefore, each of the second color filters CF2 may absorb or block the first light that is not converted by the wavelength conversion layer QDL among the first light emitted from the light emitting element LE. In addition, each of the second color filters CF2 may transmit the second light corresponding to the green wavelength band among the fourth light converted by the wavelength conversion layer QDL, and may absorb or block the third light corresponding to the red wavelength band. Therefore, each of the second light emission areas EA2 may emit the second light.

Each of the third color filters CF3 may be disposed on the wavelength conversion layer QDL in the third light emission area EA3. Also, each of the third color filters CF3 may be disposed on the partition wall PW. Each of the third color filters CF3 may transmit the third light and absorb or block the first light and the second light. For example, each of the third color filters CF3 may transmit the light of the red wavelength band and absorb or block the light of the blue and green wavelength bands. Therefore, each of the third color filters CF3 may absorb or block the first light that is not converted by the wavelength conversion layer QDL among the first light emitted from the light emitting element LE. In addition, each of the third color filters CF3 may transmit the third light corresponding to the red wavelength band among the fourth light converted by the wavelength conversion layer QDL, and may absorb or block the second light corresponding to the green wavelength band. Therefore, each of the third light emission areas EA3 may emit the third light.

In one or more embodiments, a black matrix may be disposed among (e.g., between) the plurality of color filters CF1, CF2 and CF3. For example, the black matrix may be disposed between the first color filter CF1 and the second color filter CF2, between the second color filter CF2 and the third color filter CF3, and between the first color filter CF1 and the third color filter CF3. The black matrix may include inorganic black pigments or organic black pigments, such as carbon black.

As shown in FIGS. 4 to 6, as the first partition wall PW1 is formed of a conductive material, heat emitted from the light emitting element LE may be emitted to the first partition wall PW1, whereby the wavelength conversion particles WCP1 of the wavelength conversion layer QDL may be prevented from being damaged due to heat emission of the light emitting element LE.

Also, as the first partition wall PW1 is formed of a metal material having high reflectance, the light emitted from the light emitting element LE may be reflected from the connection electrode 112 and the first partition wall PW1 and then output to the upper portion of the light emitting element LE. Therefore, emission efficiency of the light from the light emitting element LE may be enhanced due to the first partition wall PW1.

Also, as the second partition wall PW2 is formed of a conductive material, heat emitted from the light emitting element LE may be emitted to the second partition wall PW2 through the first partition wall PW1 and the common electrode CE, whereby the wavelength conversion particles WCP1 of the wavelength conversion layer QDL may be prevented from being damaged due to heat emission of the light emitting element LE.

Also, as the second partition wall PW2 is formed of a metal material having high reflectance, the light converted by the first wavelength conversion particles WCP1 of the wavelength conversion layer QDL and the light scattered by the scatterer may be reflected from the second partition wall PW2 and then emitted by passing through the color filter CF1/CF2/CF3. Therefore, emission efficiency of the light from the light emitting element LE may be enhanced due to the second partition wall PW2.

Figure 7:
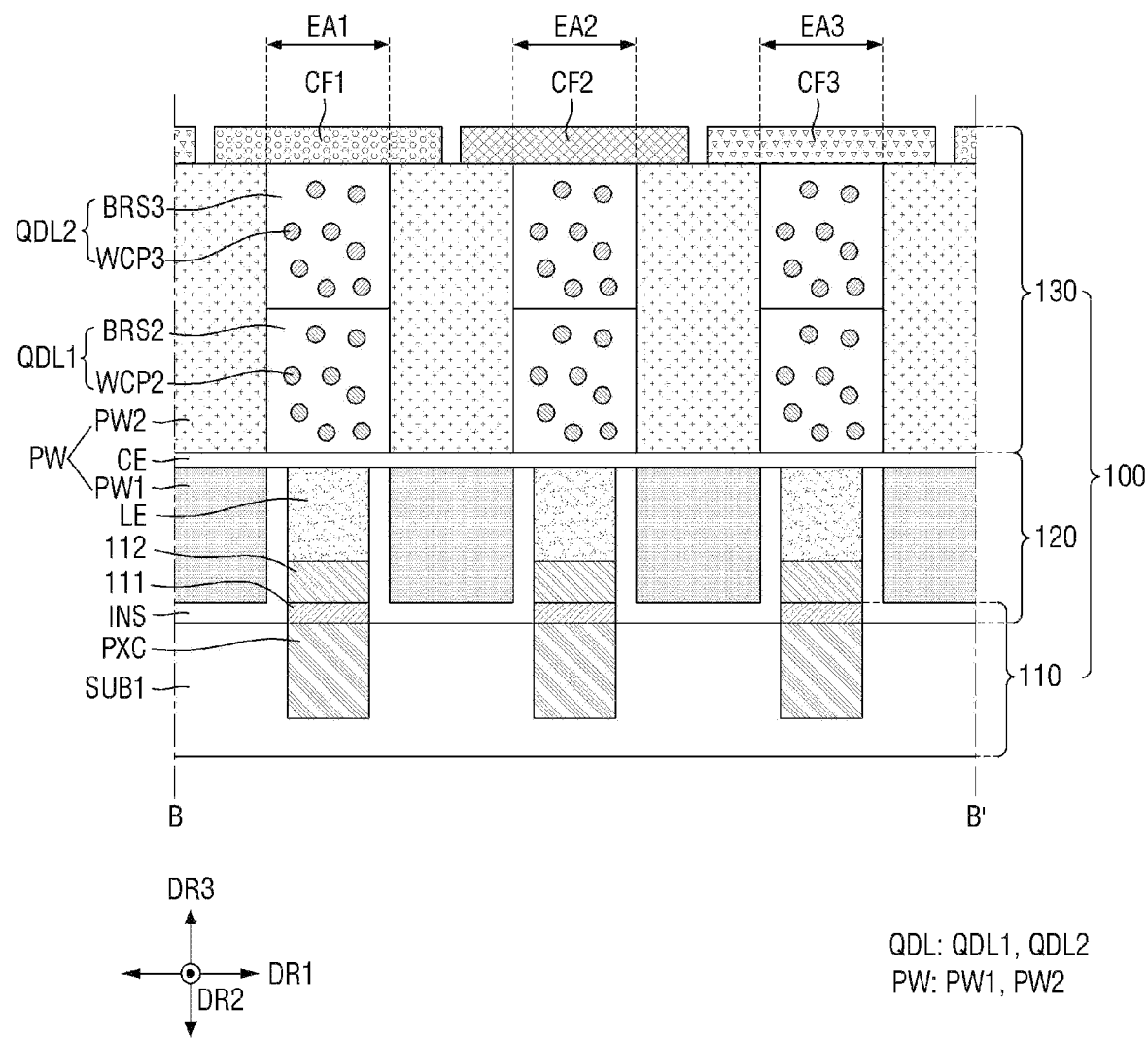
FIG. 7 is a cross-sectional view illustrating an example of a display panel taken along the line B-B' of FIG. 3.

FIG. 7 is a cross-sectional view illustrating an example of a display panel taken along the line B-B' of FIG. 3.

The embodiment of FIG. 7 is different from the embodiment of FIG. 5 in that the wavelength conversion layer QDL includes a first wavelength conversion layer QDL1 and a second wavelength conversion layer QDL2 in each of the first light emission areas EA1, the second light emission areas EA2, and the third light emission areas EA3. In FIG. 7, the description duplicated with the embodiment of FIG. 5 will be omitted.

Referring to FIG. 7, the first wavelength conversion layer QDL1 may include a second base resin BRS2 and second wavelength conversion particles WCP2. The second base resin BRS2 may include a light-transmissive organic material. For example, the second base resin BRS2 may include an epoxy-based resin, an acrylic resin, a cardo-based resin, or an imide-based resin. The second base resin BRS2 may substantially be the same as the first base resin BRS1, but is not limited thereto. The second wavelength conversion particles WCP2 may convert the first light incident from the light emitting element LE into the second light. For example, the second wavelength conversion particles WCP2 may convert the light of the blue wavelength band into the light of the green wavelength band. The second wavelength conversion particles WCP2 may be quantum dots (QD), quantum dots, quantum rods, fluorescent materials, or phosphorescent materials.

The second wavelength conversion layer QDL2 may be disposed on the first wavelength conversion layer QDL1. The second wavelength conversion layer QDL2 may include a third base resin BRS3 and third wavelength conversion particles WCP3. The third base resin BRS3 may include a light-transmissive organic material. For example, the third base resin BRS3 may include an epoxy-based resin, an acrylic resin, a cardo-based resin, or an imide-based resin. The third base resin BRS3 may substantially be the same as the first base resin BRS1, but is not limited thereto. The third wavelength conversion particles WCP3 may convert the first light incident from the light emitting element LE into the third light. For example, the third wavelength conversion particles WCP3 may convert the light of the blue wavelength band into the light of the red wavelength band. The third wavelength conversion particles WCP3 may be quantum dots (QD), quantum rods, fluorescent materials, or phosphorescent materials.

The first light that is not converted by the first wavelength conversion layer QDL1 and the second wavelength conversion layer QDL2 among the first light emitted from the light emitting element LE may transmit through the first color filter CF1. The second light produced (or generated) by converting the first light emitted from the light emitting element LE by the first wavelength conversion layer QDL1 and the third light converted by the second wavelength conversion layer QDL2 may be absorbed or blocked by the first color filter CF1. Therefore, the first light emission area EA1 may emit the first light.

The first light that is not converted by the first wavelength conversion layer QDL1 and the second wavelength conversion layer QDL2 among the first light emitted from the light emitting element LE may be absorbed or blocked by the second color filter CF2. In addition, the second light produced (or generated) by converting the first light emitted from the light emitting element LE by the first wavelength conversion layer QDL1 may transmit through the second color filter CF2 but the third light converted by the second wavelength conversion layer QDL2 may be absorbed or blocked by the second color filter CF2. Therefore, the second light emission area EA2 may emit the second light.

The first light that is not converted by the first wavelength conversion layer QDL1 and the second wavelength conversion layer QDL2 among the first light emitted from the light emitting element LE may be absorbed or blocked by the third color filter CF3. In addition, the second light produced (or generated) by converting the first light emitted from the light emitting element LE by the first wavelength conversion layer QDL1 is absorbed or blocked by the second color filter CF2 but the third light produced (or generated) by the second wavelength conversion layer QDL2 may transmit through the third color filter CF3. Therefore, the third light emission area EA3 may emit the third light.

Although FIG. 7 illustrates that the second wavelength conversion layer QDL2 is disposed on the first wavelength conversion layer QDL1, the present disclosure is not limited thereto. That is, the first wavelength conversion layer QDL1 may be disposed on the second wavelength conversion layer QDL2.

Figure 8:
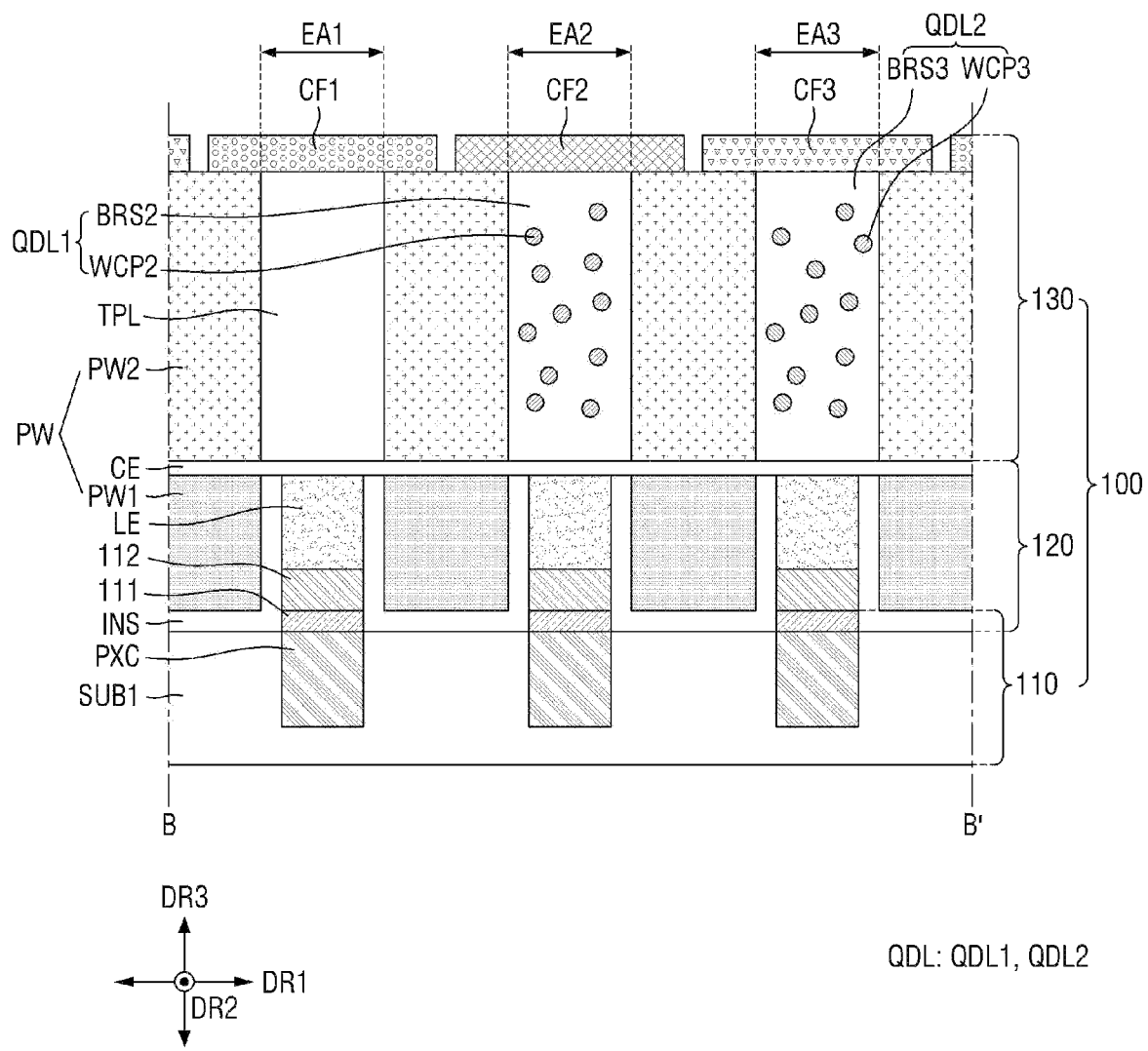
FIG. 8 is a cross-sectional view illustrating an example of a display panel taken along the line B-B' of FIG. 3.

FIG. 8 is a cross-sectional view illustrating an example of a display panel taken along the line B-B' of FIG. 3.

The embodiment of FIG. 8 is different from the embodiment of FIG. 5 in that a light transmitting layer TPL is disposed in each of the first light emission areas EA1, a first wavelength conversion layer QDL1 is disposed in each of the second light emission areas EA2, and a second wavelength conversion layer QDL2 is disposed in each of the third light emission areas EA3. In FIG. 8, the description duplicated with the embodiment of FIG. 5 will be omitted.

Referring to FIG. 8, the light transmitting layer TPL may be disposed on the protective film PTF in each of the first light emission areas EA1. The light transmitting layer TPL may include a light-transmissive organic material. For example, the light transmitting layer TPL may include an epoxy-based resin, an acrylic resin, a cardo-based resin, or an imide-based resin.

The first wavelength conversion layer QDL1 may be disposed on the common electrode CE in each of the second light emission areas EA2. The first wavelength conversion layer QDL1 may include a second base resin BRS2 and second wavelength conversion particles WCP2. The second base resin BRS2 and the second wavelength conversion particles WCP2 may be substantially the same as those described with reference to FIG. 7. Therefore, the description of the second base resin BRS2 and the second wavelength conversion particles WCP2 will be omitted.

The second wavelength conversion layer QDL2 may be disposed on the common electrode CE in each of the third light emission areas EA3. The second wavelength conversion layer QDL2 may include a third base resin BRS3 and third wavelength conversion particles WCP3. The third base resin BRS3 and the third wavelength conversion particles WCP3 may be substantially the same as those described with reference to FIG. 7. Therefore, the description of the third base resin BRS3 and the third wavelength conversion particles WCP3 will be omitted.

The first light emitted from the light emitting element LE in the first light emission area EA1 may transmit through the first color filter CF1 via the light transmitting layer TPL. That is, because the first light emitted from the light emitting element LE in the first light emission area EA1 is not converted by a separate wavelength conversion layer, the first light may transmit through the first color filter CF1. Therefore, the first light emission area EA1 may emit the first light.

The second light converted by the first wavelength conversion layer QDL1 from the first light emitted from the light emitting element LE in the second light emission area EA2 may transmit through the second color filter CF2. The first light emitted from the light emitting element LE that is not converted by the first wavelength conversion layer QDL1 in the second light emission area EA2 may be absorbed or blocked by the second color filter CF2. Therefore, the second light emission area EA2 may emit the second light.

The third light produced (or generated) by converting the first light emitted from the light emitting element LE by the second wavelength conversion layer QDL2 in the third light emission area EA3 may transmit through the third color filter CF3. The first light that is not converted by the second wavelength conversion layer QDL2 from among the first light emitted from the light emitting element LE in the third light emission area EA3 may be absorbed or blocked by the third color filter CF3. Therefore, the third light emission area EA3 may emit the third light.

Figure 9:
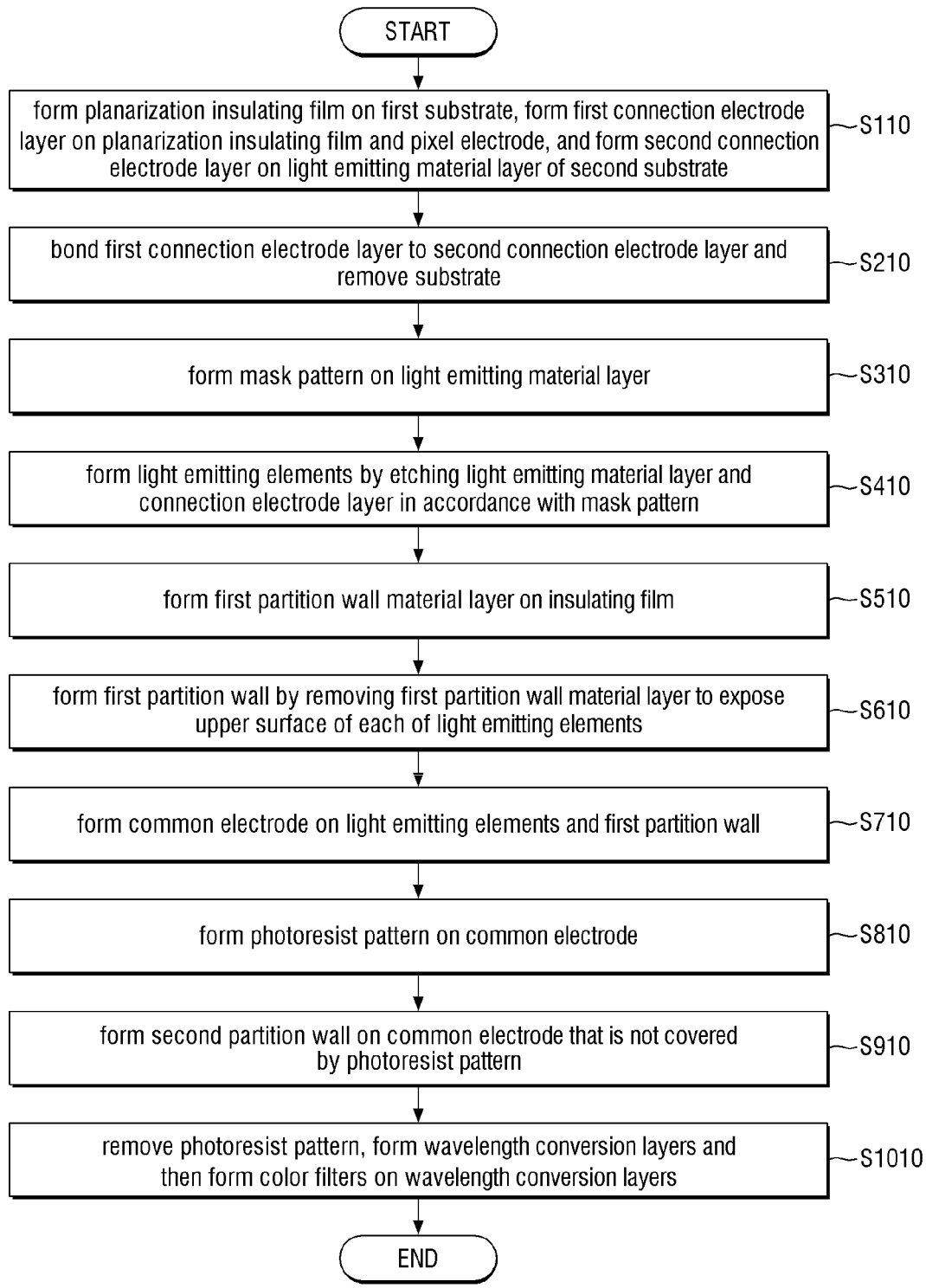
FIG. 9 is a flow chart illustrating a method for fabricating a display device according to one or more embodiments of the present disclosure.

FIG. 9 is a flow chart illustrating a method for fabricating a display device according to one or more embodiments of the present disclosure, and FIGS. 10 to 19 are cross-sectional views illustrating a method for fabricating a display device according to one or more embodiments of the present disclosure. In FIGS. 10 to 19, cross-sectional views of a display panel taken along the line B-B' of FIG. 3 are shown. Hereinafter, a method for fabricating a display panel according to one or more embodiments of the present disclosure will be described in detail with reference to FIGS. 9 to 19.

Figure 10:
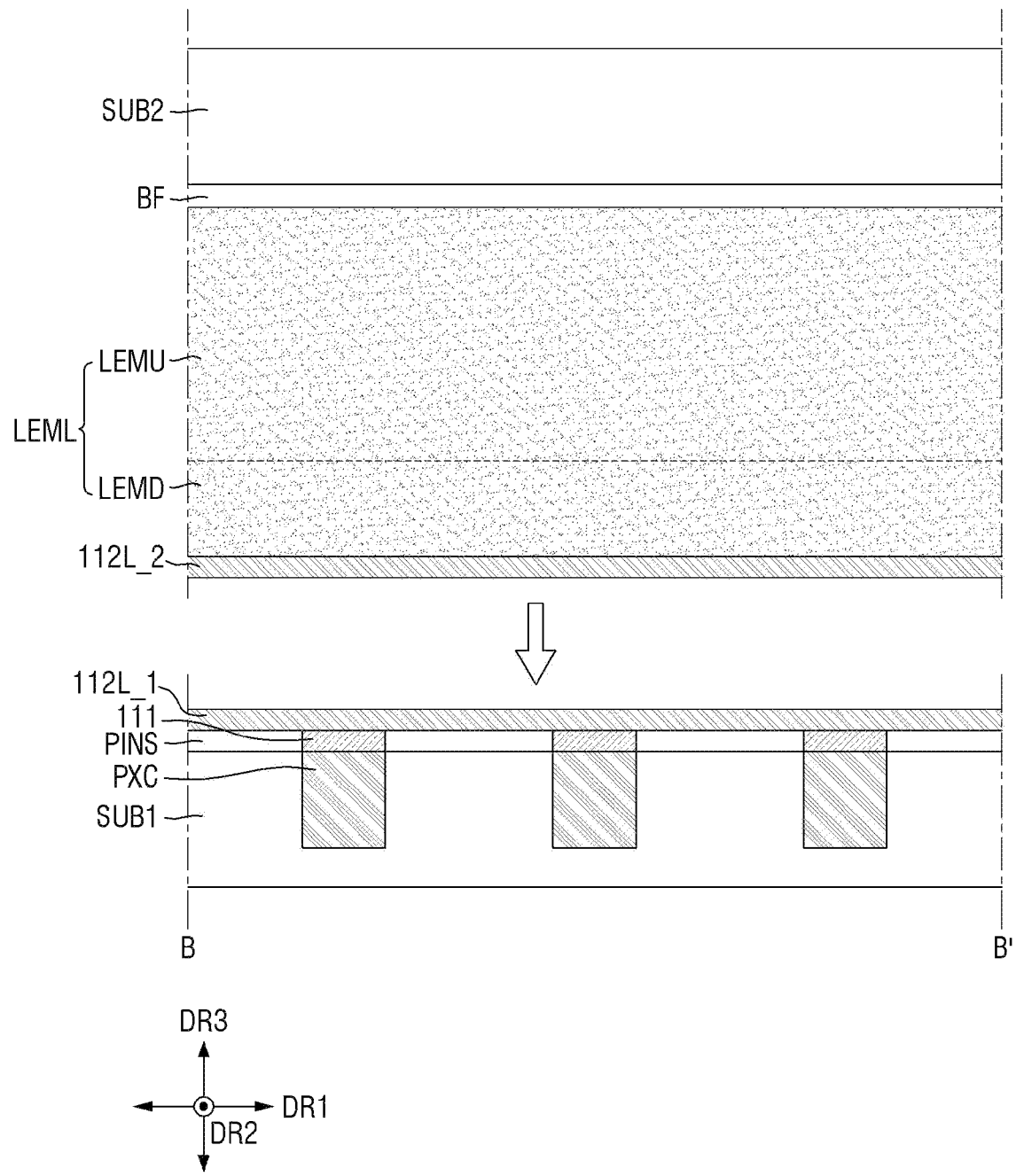
FIGS. 10 to 19 are cross-sectional views illustrating a method for fabricating a display device according to one or more embodiments of the present disclosure.
Figure 15:
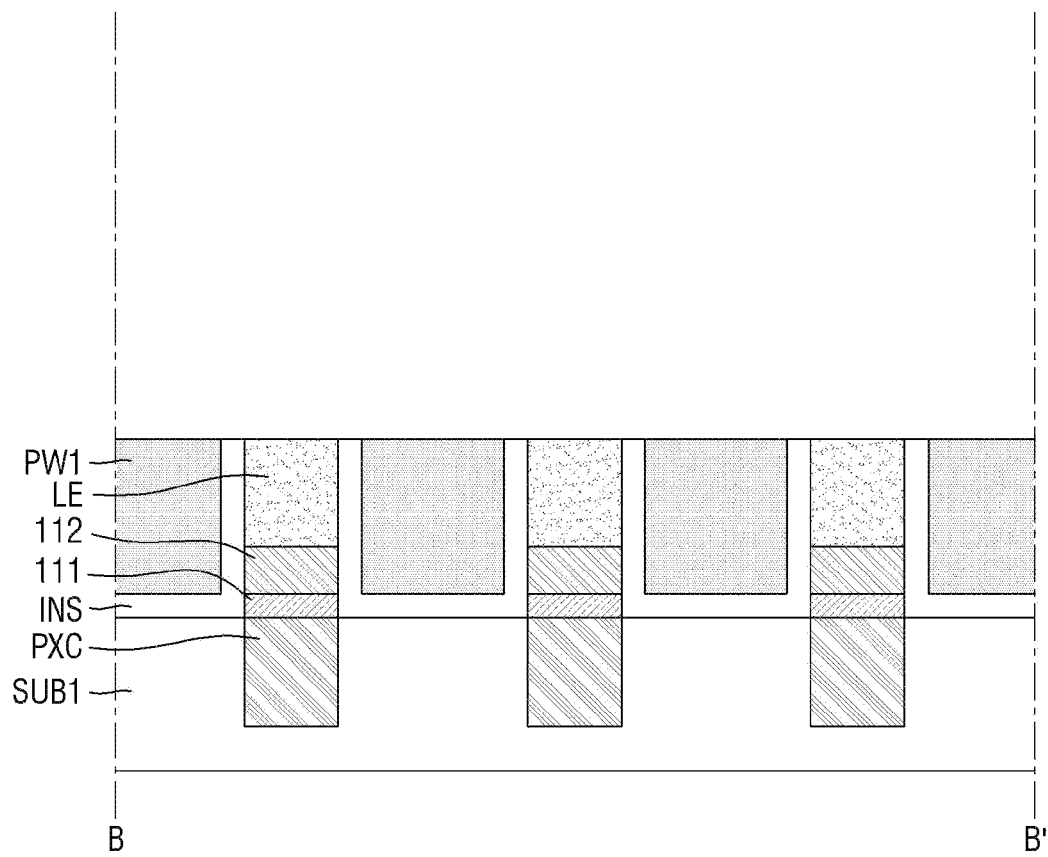

First, as shown in FIG. 10, a planarization insulating film PINS is formed on a first substrate SUB1, a first connection electrode layer 112L_1 is formed on the planarization insulating film PINS and a pixel electrode 111, and a second connection electrode layer 112L_2 is formed on a light emitting material layer LEML of a second substrate SUB2 (S110 of FIG. 15).

A height difference may exist between an upper surface of the first substrate SUB1 and an upper surface of the pixel electrode 111. In order to eliminate the height difference between the upper surface of the first substrate SUB1 and the upper surface of the pixel electrode 111, the planarization insulating film PINS may be disposed on the upper surface of the first substrate SUB1. In this case, an upper surface of the planarization insulating film PINS and the upper surface of the pixel electrode 111 may be connected to each other to be flat. The planarization insulating film PINS may be formed of an inorganic film such as a silicon oxide film ($SiO_2$), an aluminum oxide film ($Al_2O_3$), or a hafnium oxide film (HfOX).

Then, the first connection electrode layer 112L_1 is deposited on the planarization insulating film PINS and the pixel electrodes 111. The first connection electrode layer 112L_1 may include gold (Au), copper (Cu), aluminum (Al), silver (Ag) or tin (Sn).

A buffer film BF may be formed on one surface of the second substrate SUB2. The second substrate SUB2 may be a silicon substrate or a sapphire substrate. The buffer film BF may be formed of an inorganic film such as a silicon oxide film ($SiO_2$), an aluminum oxide film ($Al_2O_3$), or a hafnium oxide film (HfOX).

The light emitting material layer LEML may be disposed on the buffer film BF. The light emitting material layer LEML may include a first semiconductor material layer LEMD and a second semiconductor material layer LEMU. The second semiconductor material layer LEMU may be disposed on the buffer film BF, and the first semiconductor material layer LEMD may be disposed on the second semiconductor material layer LEMU.

As shown in FIG. 6 with respect to the light emitting element LE, the first semiconductor material layer LEMD may include a first semiconductor layer SEM1, an electron blocking layer EBL, an active layer MQW, a superlattice layer SLT, and a second semiconductor layer SEM2. The second semiconductor material layer LEMU may be formed of a semiconductor layer that is not doped with a dopant, that is, an undoped semiconductor layer. For example, the second semiconductor material layer LEMU may be undoped-GaN that is not doped with a dopant. A thickness of the second semiconductor material layer LEMU may be thicker than that of the first semiconductor material layer LEMD.

The second connection electrode layer 112L_2 may be deposited on the first semiconductor material layer LEMD. The second connection electrode layer 112L_2 may include gold (Au), copper (Cu), aluminum (Al), silver (Ag), or tin (Sn).

Figure 11:
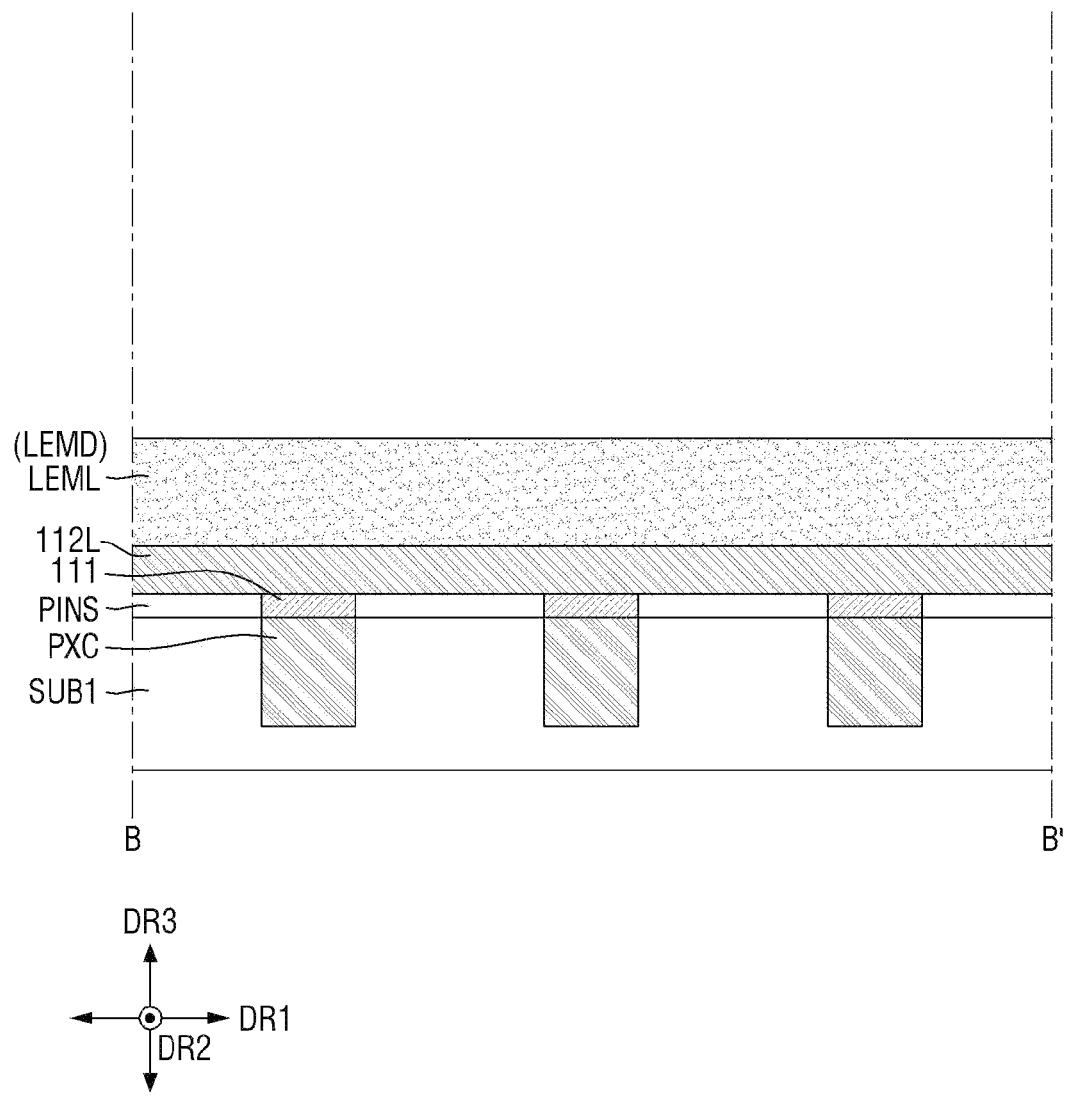

Second, as shown in FIG. 11, the first connection electrode layer 112L_1 and the second connection electrode layer 112L_2 are bonded to each other, and the second substrate SUB2 is removed (S210 of FIG. 9).

The first connection electrode layer 112L_1 of the first substrate SUB1 and the second connection electrode layer 112L_2 of the second substrate SUB2 are brought into contact with each other. Then, the first connection electrode layer 112L_1 and the second connection electrode layer 112L_2 are subjected to melt bonding at a suitable temperature (e.g., a predetermined temperature) to form one connection electrode layer 112L. That is, the connection electrode layer 112L is disposed between the pixel electrodes 111 of the first substrate SUB1 and the light emitting material layer LEML of the second substrate SUB2 and serves as a bonding metal layer for bonding the pixel electrodes 111 of the first substrate SUB1 to the light emitting material layer LEML of the second substrate SUB2.

Then, the second substrate SUB2 and the buffer film BF may be removed through a polishing process, such as a chemical mechanical polishing (CMP) process, and/or an etching process. In addition, the second semiconductor material layer LEMU of the light emitting material layer LEML may be removed through the polishing process such as the CMP process.

Figure 12:
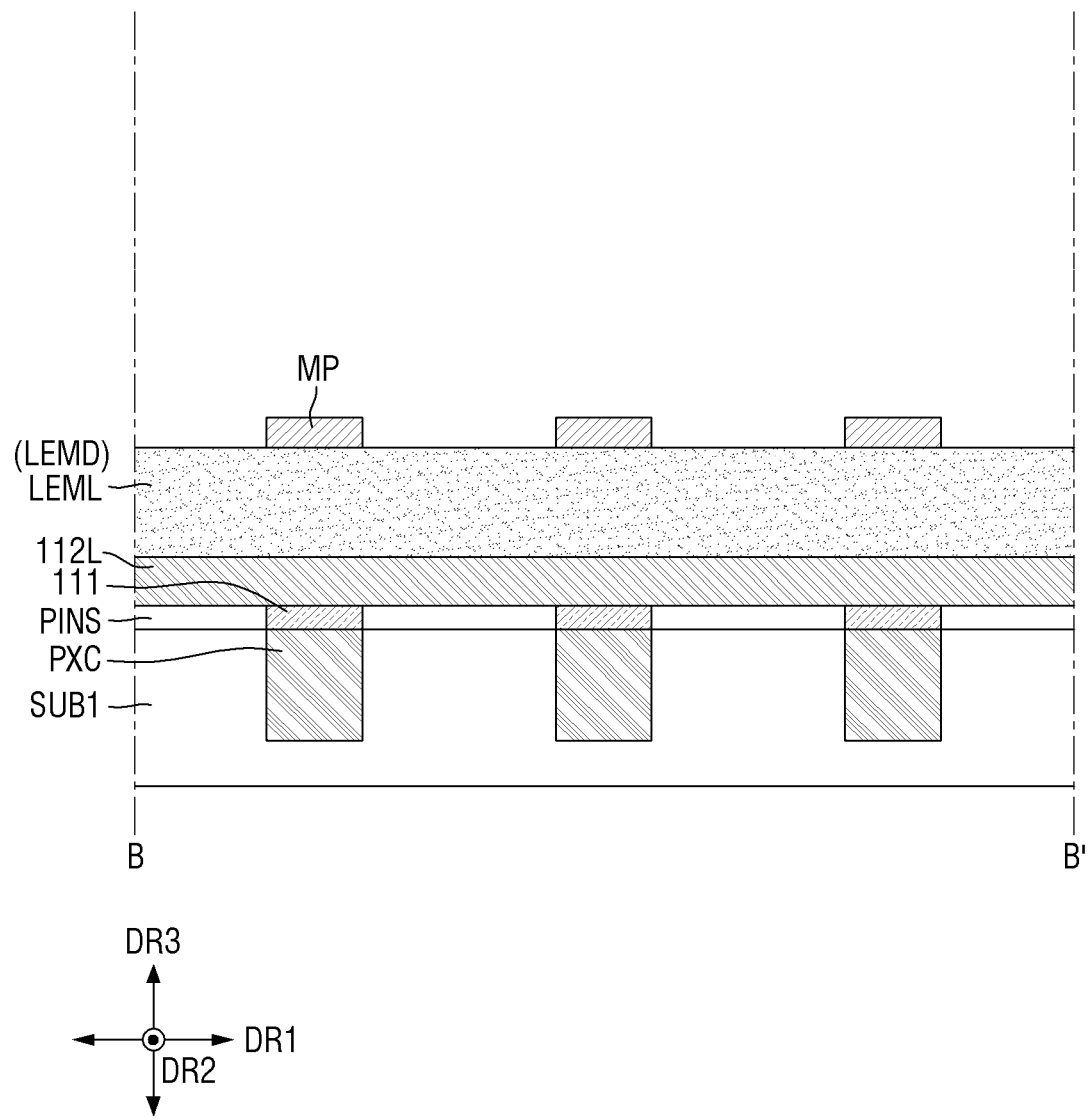

Third, as shown in FIG. 12, a mask pattern MP is formed on the light emitting material layer LEML (S310 of FIG. 9).

The mask pattern MP is formed on an upper surface of the light emitting material layer LEML. The upper surface of the light emitting material layer LEML may be a surface upwardly exposed by removing the second substrate SUB2, the buffer film BF, and the second light emitting material layer LEMU. The mask pattern MP may be disposed in an area where the light emitting element LE is to be formed. As a result, the mask pattern MP may overlap the pixel electrode 111 in the third direction DR3. The mask pattern MP may include a conductive material such as nickel (Ni). A thickness of the mask pattern MP may be 0.01 μm to 1 μm, approximately.

Figure 13:
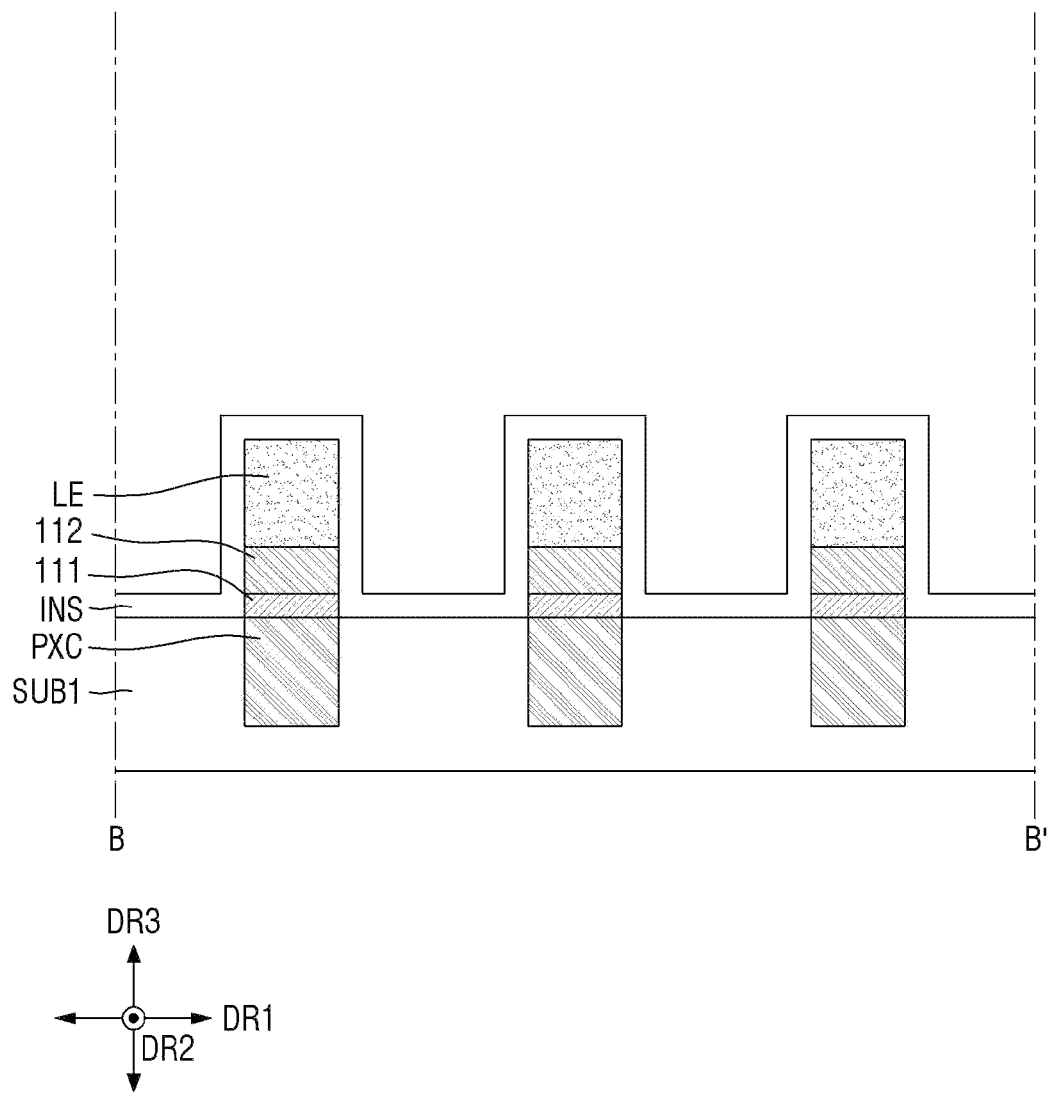

Fourth, as shown in FIG. 13, the light emitting material layer LEML and the connection electrode layer 112L are etched in accordance with the mask pattern MP to form the light emitting elements LE, and the insulating film INS is formed on the light emitting element LE (S410 of FIG. 9).

The mask pattern MP may not be etched by a first etching material for etching the light emitting material layer LEML and a second etching material for etching the connection electrode layer 112L and the planarization insulating film PINS. For this reason, the light emitting material layer LEML and the connection electrode layer 112L of the area where the mask pattern MP is disposed may not be etched. Therefore, the connection electrode 112 and the light emitting element LE may be formed on each the pixel electrode 111.

Otherwise, the connection electrode layer 112L is etched by the second etching material, whereas the planarization insulating film PINS may remain without being etched by the second etching material. In this case, the planarization insulating film PINS may be etched by a third etching material, whereas the mask pattern MP may not be etched by the third etching material. Alternatively, the planarization insulating film PINS may remain without being etched. In this case, the planarization insulating film PINS may be disposed between the first substrate SUB1 and the insulating film INS.

Otherwise, the light emitting material layer LEML and the connection electrode layer 112L may be concurrently (or simultaneously) etched by a fourth etching material. Also, the planarization insulating film PINS may be etched by the fourth etching material, whereas the mask pattern MP may not be etched by the fourth etching material. Alternatively, the planarization insulating film PINS may remain without being etched. In this case, the planarization insulating film PINS may be disposed between the first substrate SUB1 and the insulating film INS.

Then, the insulating film INS is formed on the upper surface and sides of each of the light emitting elements LE. Also, the insulating film INS may be formed on the sides of each of the pixel electrodes 111 and the sides of each of the connection electrodes 112. Also, when the planarization insulating film PINS remains without being etched, the insulating film INS may be disposed on the planarization insulting film PINS.

Figure 14:
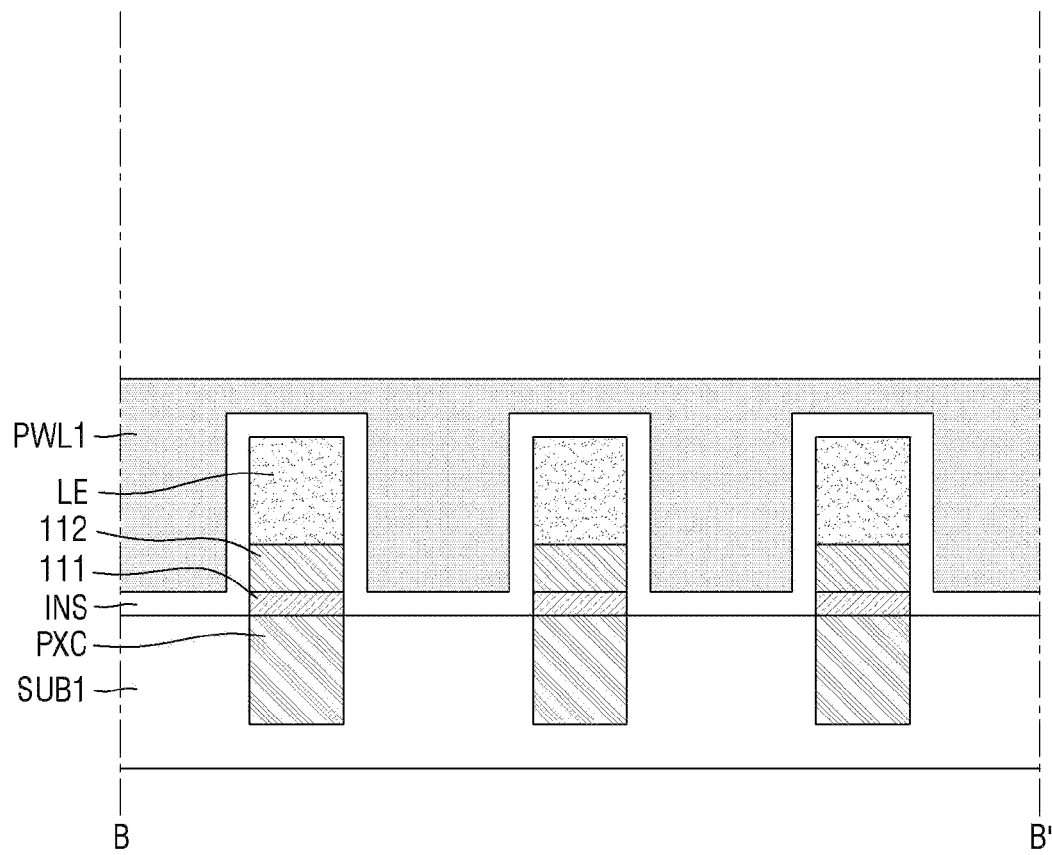
Figure 14:
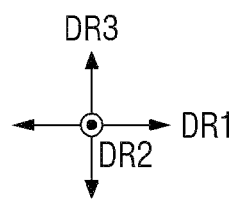

Fifth, as shown in FIG. 14, a first partition wall material layer PWL1 is formed on the insulating film INS (S510 of FIG. 9).

The first partition wall material layer PWL1 may be formed by electro-plating or electroless-plating. A thickness of the first partition wall material layer PWL1 may be thicker than that of each of the light emitting elements LE. For example, the insulating film INS disposed on the upper surface of each of the light emitting elements LE may be covered by the first partition wall material layer PWL1.

The first partition wall material layer PWL1 may include a conductive material, for example, an opaque metal material such as molybdenum (Mo), aluminum (Al), chromium (Cr), gold (Au), titanium (Ti), nickel (Ni), neodymium (Nd), and copper (Cu).

Sixth, as shown in FIG. 15, the first partition wall material layer PWL1 is removed to expose the upper surface of each of the light emitting elements LE, whereby the first partition wall PW1 is formed (S610 of FIG. 9).

The first partition wall material layer PWL1 disposed on the upper surfaces of the light emitting elements is removed by a polishing process such as a CMP process. For this reason, the upper surface of each of the light emitting elements LE may be exposed without being covered by the first partition wall PW1. Also, the upper surface of the insulating film INS disposed on the sides of each of the light emitting elements LE may be exposed without being covered by the first partition wall PW1. The upper surface of each of the light emitting elements LE, the upper surface of the insulating film INS and the upper surface of the first partition wall PW1 may be connected to one another to be flat.

Also, the first partition wall PW1 may be disposed between the light emitting elements LE adjacent to each other in the first direction DR1 and the second direction DR2. The first partition wall PW1 may be around (e.g., surround) the sides of each of the light emitting elements LE. The first partition wall PW1 may be disposed on the insulating film INS. The sides of the first partition wall PW1 may be in contact with the insulating film INS disposed on the sides of each of the light emitting elements LE. The lower surface of the first partition wall PW1 may be in contact with the insulating film INS disposed on the first substrate SUB1. Alternatively, when the insulating film INS disposed on the first substrate SUB1 is omitted, the lower surface of the first partition wall PW1 may be in contact with the first substrate SUB1.

Figure 16:
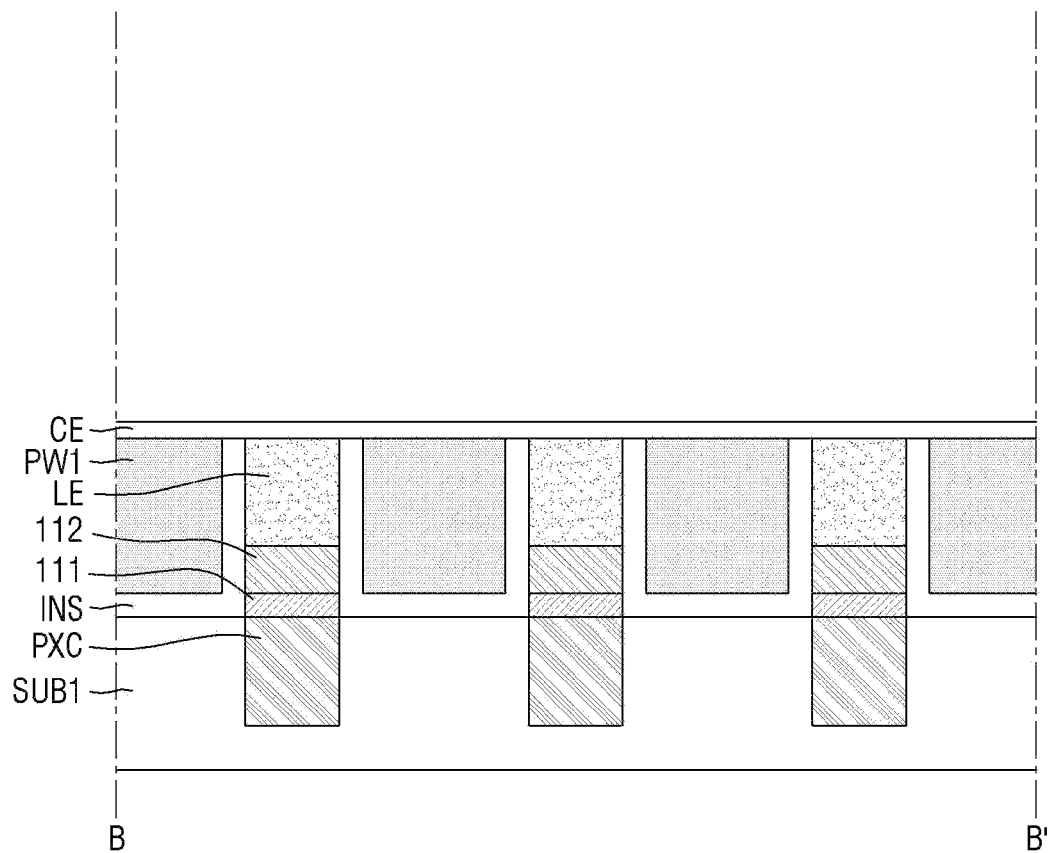
Figure 16:
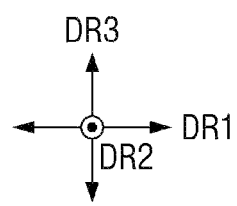

Seventh, as shown in FIG. 16, the common electrode CE is formed on the light emitting elements LE and the first partition wall PW1 (S710 of FIG. 9).

The common electrode CE may be deposited on the upper surface of each of the light emitting elements LE, the upper surface of the insulating film INS and the upper surface of the first partition wall PW1. As shown in FIG. 4, the common electrode CE may be connected to the common voltage supply portion CVS in the non-display area NDA through a common connection hole CCT passing through the insulating film INS. The common electrode CE may include a transparent conductive oxide (TCO) such as indium tin oxide (ITO) or indium zinc oxide (IZO).

Figure 17:
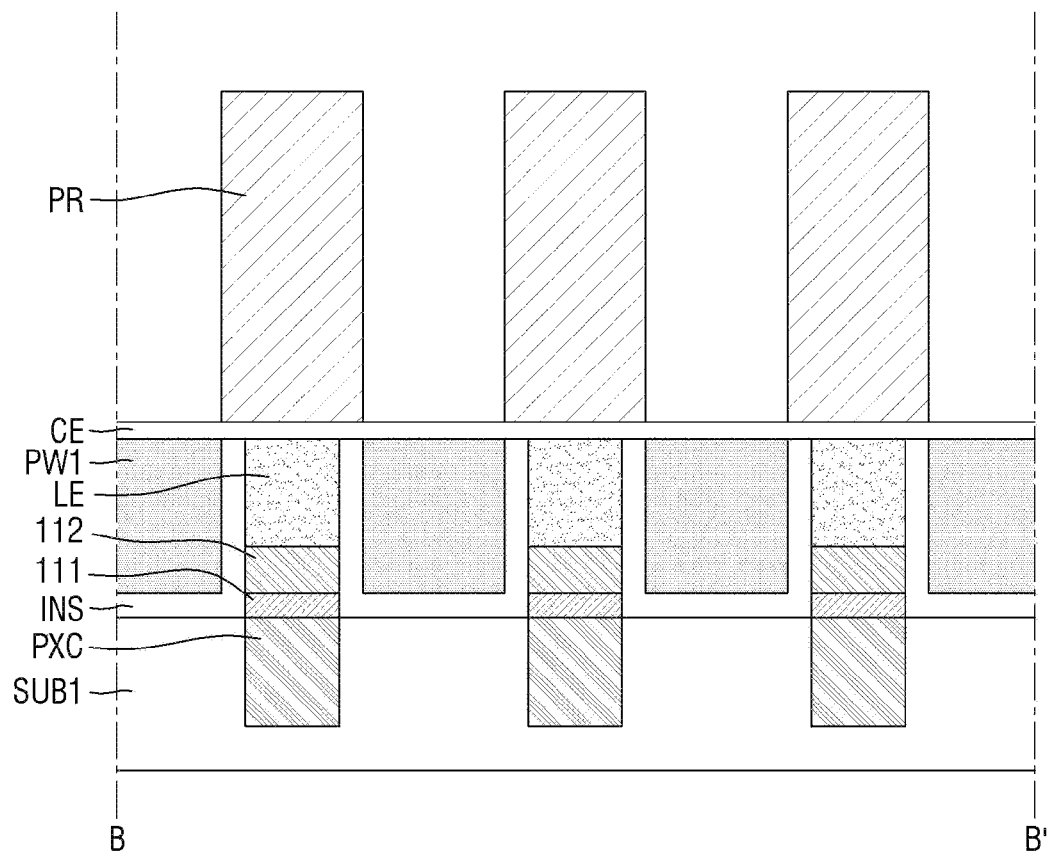

Eighth, as shown in FIG. 17, a photoresist pattern PR is formed on the common electrode CE (S810 of FIG. 9).

A photoresist layer is formed on the common electrode CE, a photo mask pattern is formed on the photoresist layer, and light is irradiated to the photoresist layer that is not covered by the photo mask pattern. Then, the photo mask pattern is removed, and the photoresist layer is etched by an etching material, whereby the photoresist pattern PR may be formed. At this time, the photoresist layer may be a negative photosensitive resin in which an area to which light is irradiated remains, or may be a positive photosensitive resin from which an area to which light is irradiated is removed. The photoresist pattern PR may be formed to overlap the light emitting elements LE in the third direction DR3.

Figure 18:
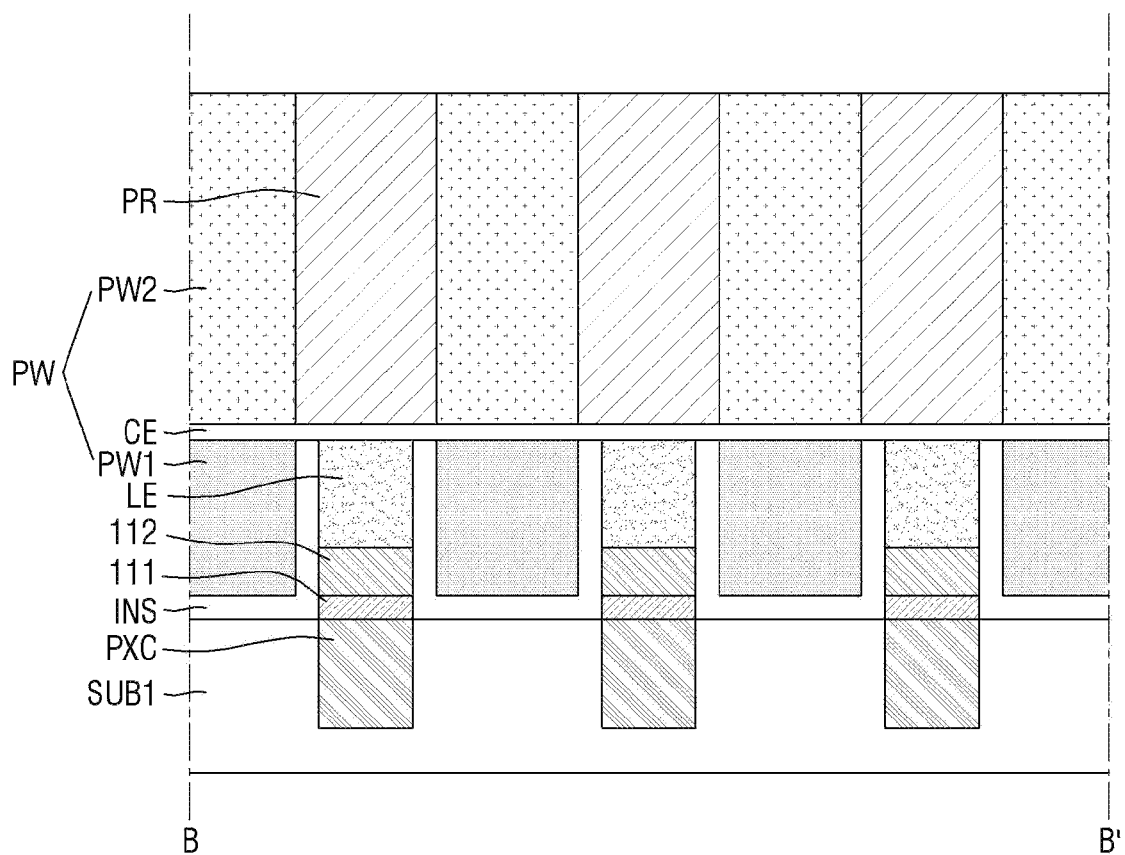
Figure 18:
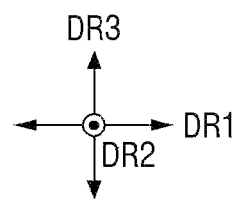

Ninth, as shown in FIG. 18, the second partition wall PW2 is formed on the common electrode CE that is not covered by the photoresist pattern PR (S910 of FIG. 9).

A second partition wall material layer may be formed on the photoresist pattern PR by electro-plating or electroless-plating. At this time, a thickness of the second partition wall material layer may be thicker than that of the photoresist pattern PR. For example, an upper surface of the photoresist pattern PR may be covered by the second partition wall material layer. The second partition wall material layer may include a conductive material, for example, an opaque metal material such as molybdenum (Mo), aluminum (Al), chromium (Cr), gold (Au), titanium (Ti), nickel (Ni), neodymium (Nd), and copper (Cu).

Then, the second partition wall material layer is removed to expose the upper surface of the photoresist pattern PR, whereby the second partition wall PW2 is formed. The second partition wall material layer disposed on the upper surface of the photoresist pattern PR is removed by a polishing process such as a CMP process. For this reason, the upper surface of the photoresist pattern PR may be exposed without being covered by the second partition wall PW2. The upper surface of the photoresist pattern PR and the upper surface of the second partition wall PW2 may be connected to each other to be flat.

The second partition wall PW2 may be around (e.g., surround) sides of the photoresist pattern PR. The lower surface of the second partition wall PW2 may be in contact with the common electrode CE.

Figure 19:
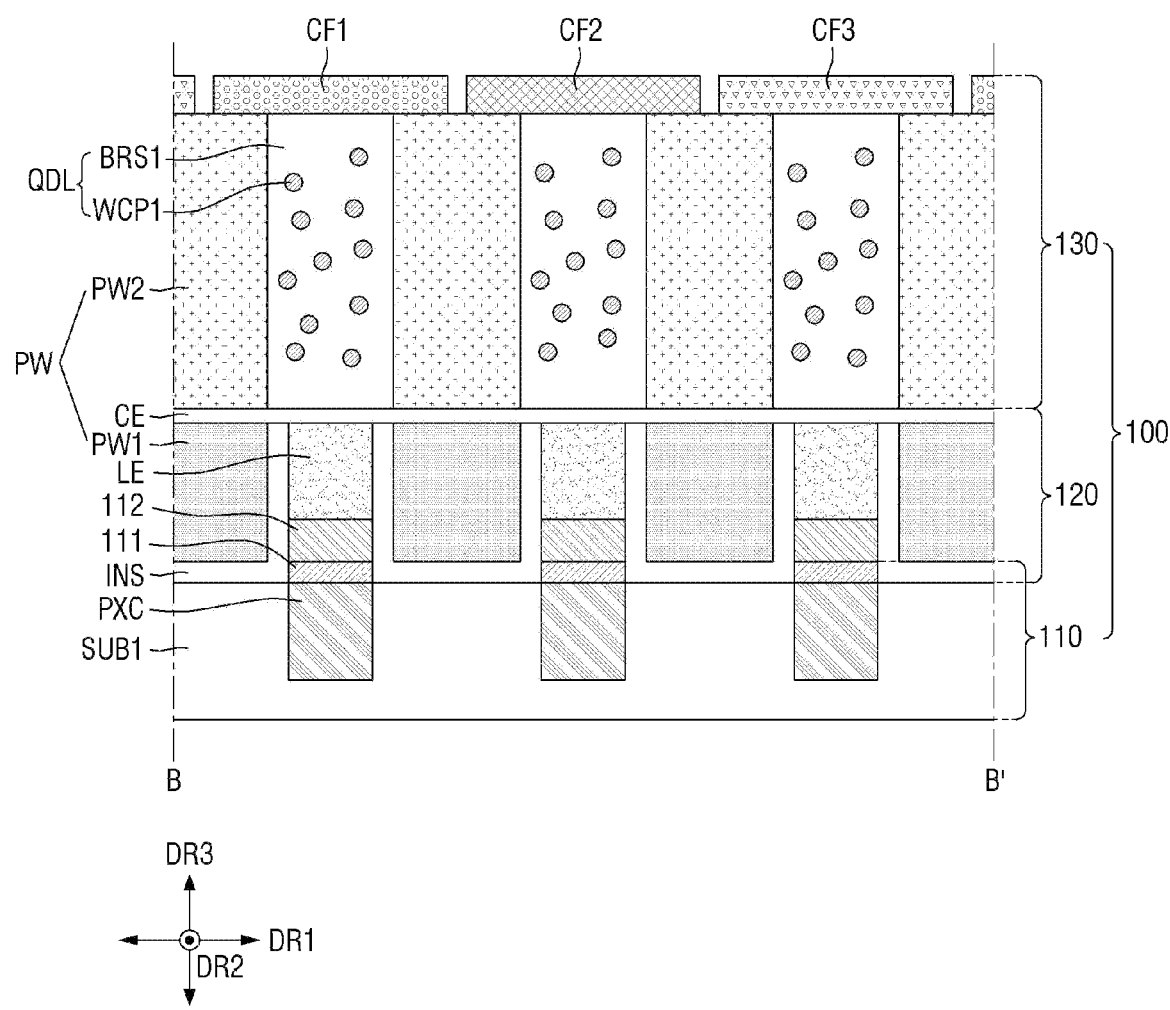

Tenth, as shown in FIG. 19, the photoresist pattern PR is removed, a wavelength conversion layer QDL is formed in the area partitioned by the second partition wall PW2, and color filters CF1, CF2, and CF3 are formed on the wavelength conversion layer QDL (S1010 of FIG. 9).

The wavelength conversion layer QDL is formed in the area remaining after the photoresist pattern PR is removed. The wavelength conversion layer QDL is formed in each of the first light emission areas EA1, the second light emission areas EA2, and the third light emission areas EA3, which are partitioned by the second partition wall PW2. In this case, because the same wavelength conversion layer QDL is formed in each of the first light emission areas EA1, the second light emission areas EA2, and the third light emission areas EA3, the wavelength conversion layer QDL may be formed in each of the first light emission areas EA1, the second light emission areas EA2, and the third light emission areas EA3 by one time process.

When the upper surface of the second partition wall PW2 is covered by the wavelength conversion layer QDL, the wavelength conversion layer QDL disposed on the upper surface of the second partition wall PW2 may be removed by the polishing process such as the CMP process. For this reason, the upper surface of the second partition wall PW2 may be exposed without being covered by the wavelength conversion layer QDL. The upper surface of each of the wavelength conversion layers QDL and the upper surface of the second partition wall PW2 may be connected to each other to be flat.

Then, the first color filter CF1 may be formed on the wavelength conversion layer QDL in the first light emission area EA1, the second color filter CF2 may be formed on the wavelength conversion layer QDL in the second light emission area EA2, and the third color filter CF3 may be formed on the wavelength conversion layer QDL in the third light emission area EA3.

As described with reference to FIGS. 9 to 19, after the light emitting elements LE are formed, the first partition wall material layer PWL1 is formed to be filled between the light emitting elements LE by electro-plating or electroless-plating, and the upper surface of each of the light emitting elements LE is exposed through a polishing process such as a CMP process, whereby the first partition wall PW1 having a very thin width may more easily be formed between the light emitting elements LE.

Also, after the photoresist patterns PR are formed, the second partition wall material layer is formed to be filled between the photoresist patterns PR by electro-plating or electroless-plating, and the upper surface of the photoresist pattern PR is exposed through a polishing process such as a CMP process, whereby the second partition wall PW2 having a very thin width may more easily be formed between the photoresist patterns PR.

Moreover, the wavelength conversion layer QDL is formed in the area remaining after the photoresist pattern PR is removed. That is, because the wavelength conversion layer QDL is formed in each of the first light emission areas EA1, the second light emission areas EA2, and the third light emission areas EA3, which are partitioned by the second partition wall PW2, by one time process, the fabricating process may be simplified.

Figure 20:
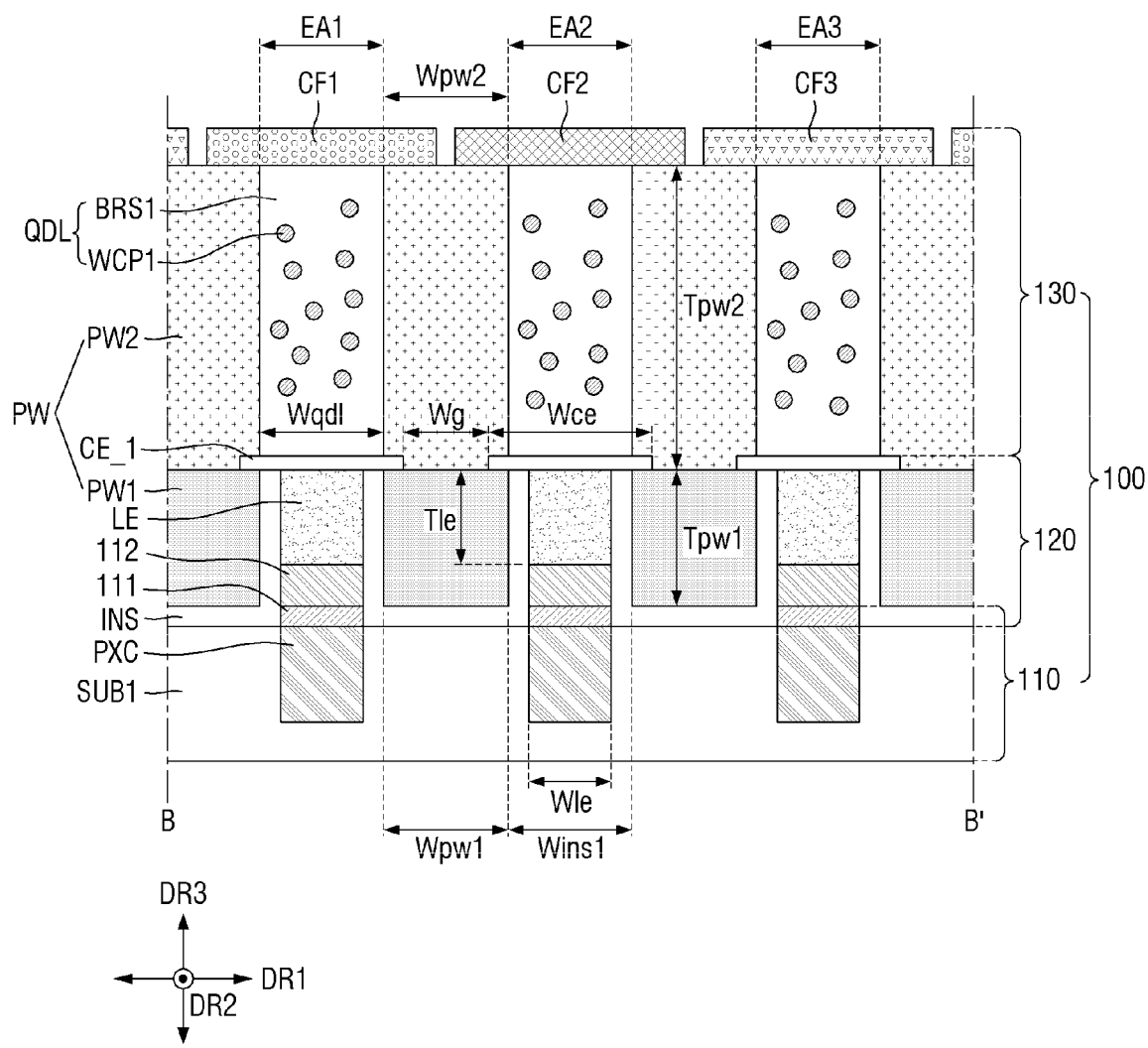
FIG. 20 is a cross-sectional view illustrating an example of a display panel taken along the line B-B' of FIG. 3.

FIG. 20 is a cross-sectional view illustrating an example of a display panel taken along the line B-B' of FIG. 2.

The embodiment of FIG. 20 is different from the embodiment of FIG. 5 in that each of common electrodes CE_1 is disposed on the light emitting element LE and the first partition wall PW1 and the second partition wall PW2 are in direct contact with each other. In FIG. 20, the description duplicated with the embodiment of FIG. 5 will be omitted.

Referring to FIG. 20, each of the common electrodes CE_1 may be disposed between the light emitting element LE and the wavelength conversion layer QDL. A width Wce of each of the common electrodes CE_1 may be wider than a width Wle of the light emitting element LE, and may be wider than a width Wqdl of the wavelength conversion layer QDL. Also, a distance Wg between the common electrodes CE_1 that are adjacent to each other in the first direction DR1 may be shorter than the width Wce of each of the common electrodes CE_1. The distance Wg between the common electrodes CE_1 that are adjacent to each other in the first direction DR1 may be shorter than the width Wpw1 of the first partition wall PW1, and may be shorter than the width Wpw2 of the second partition wall PW2. For this reason, the first partition wall PW1 may be in contact (e.g., direct contact) with the second partition wall PW2. Because heat generated from the light emitting element LE may be emitted to the first partition wall PW1 and the second partition wall PW2 due to a contact between the first partition wall PW1 and the second partition wall PW2, the wavelength conversion particles WCP1 of the wavelength conversion layer QDL may be prevented from being damaged due to heat emission of the light emitting element LE.

Also, an edge of the common electrode CE_1 in the first direction DR1 may be in contact with the first partition wall PW1 and the second partition wall PW2. For this reason, the common electrode CE_1 may electrically be connected with the first partition wall PW1. Therefore, because resistance of the common electrode CE may be lowered by the first partition wall PW1, a voltage drop of a common voltage applied to the common electrode CE due to resistance may be reduced or prevented from occurring.

Figure 21:
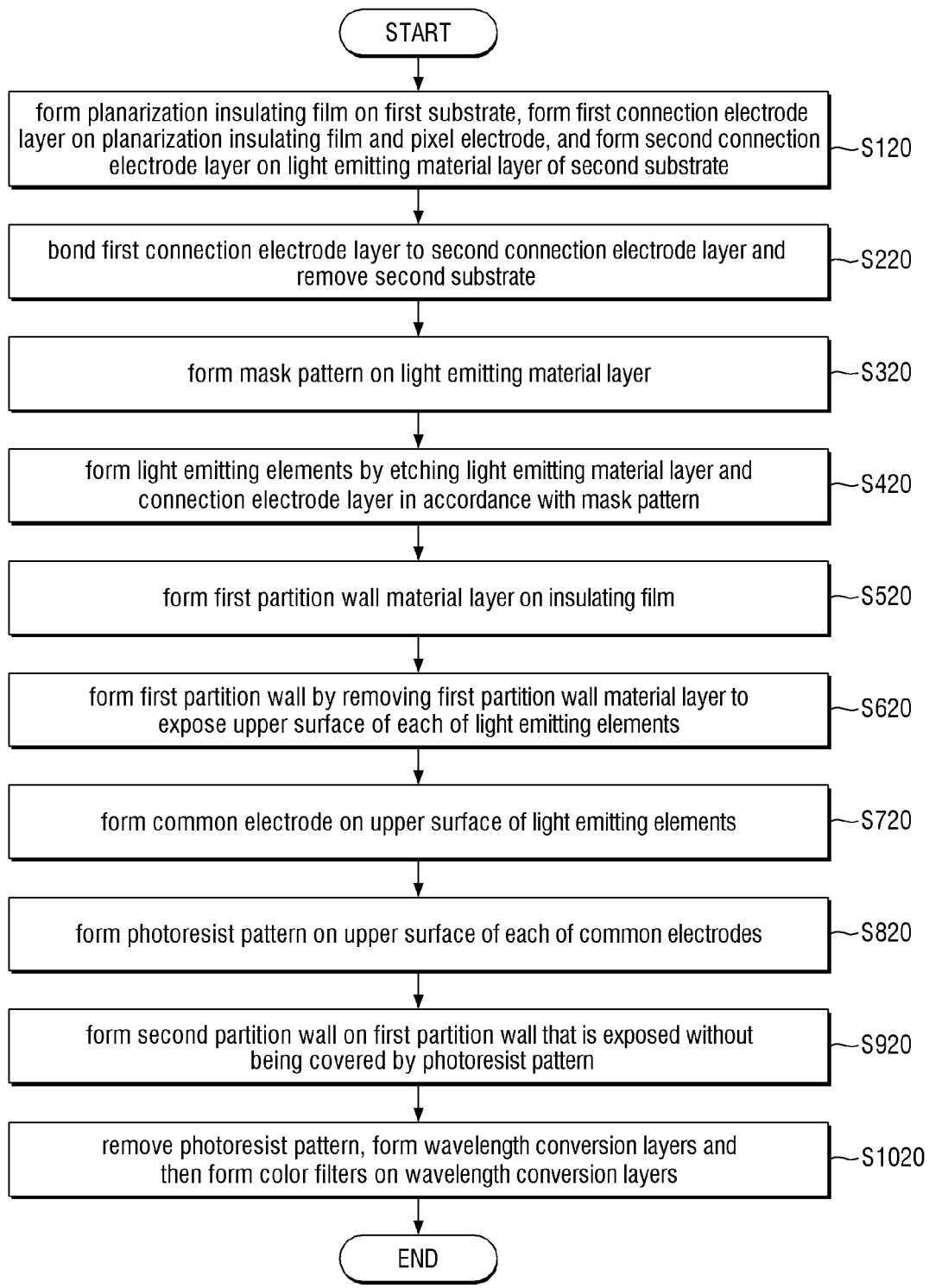
FIG. 21 is a flow chart illustrating a method for fabricating a display device according to one or more embodiments of the present disclosure.

FIG. 21 is a flow chart illustrating a method for fabricating a display device according to one or more embodiments of the present disclosure. FIGS. 22 to 25 are cross-sectional views illustrating a method for fabricating a display device according to one or more embodiments of the present disclosure. In FIGS. 22 to 25, cross-sectional views of a display panel taken along the line B-B' of FIG. 3 are shown. Hereinafter, a method for fabricating a display panel according to one or more embodiments of the present disclosure will be described in detail with reference to FIGS. 21 to 26.

Because, steps S120, S220, S320, S420, S520, and S620 of FIG. 21 are substantially the same as the steps S110, S210, S310, S410, S510, and S610 as discussed with respect to FIG. 9, their description will be omitted.

Figure 22:
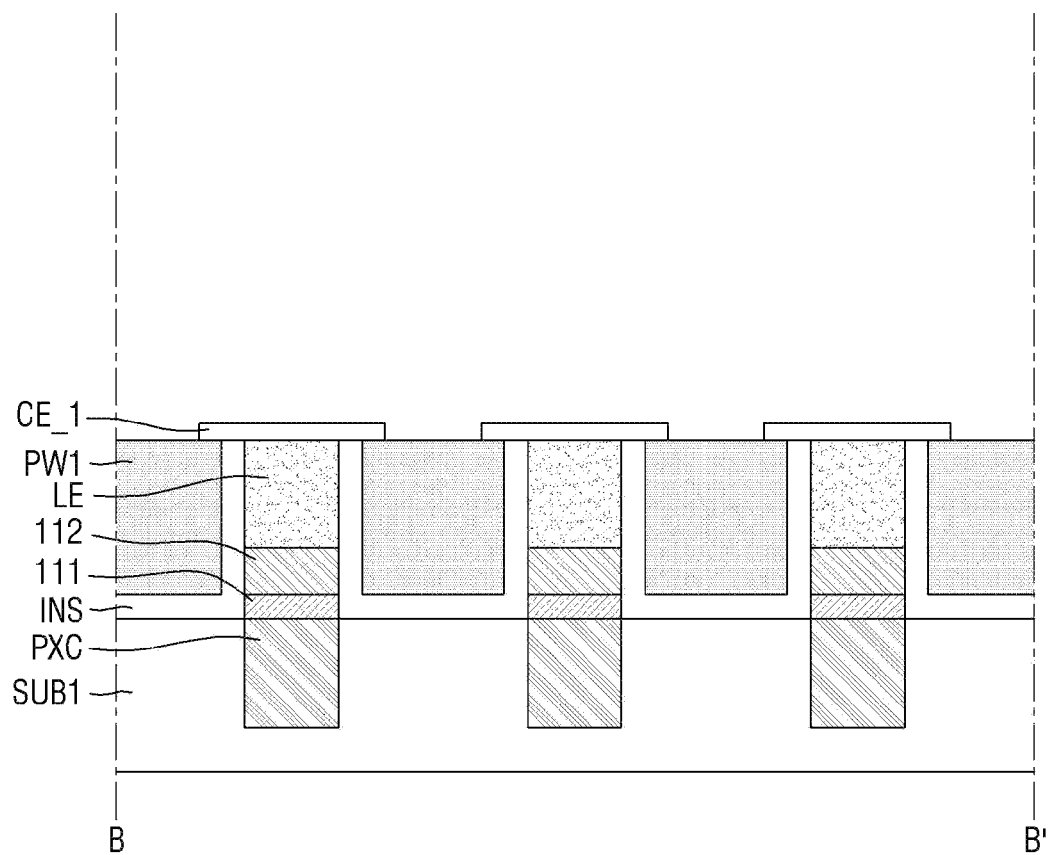
FIGS. 22 to 25 are cross-sectional views illustrating a method for fabricating a display device according to one or more embodiments of the present disclosure.

First of all, as shown in FIG. 22, the common electrode CE_1 is formed on the upper surface of each of the light emitting elements LE (S720 of FIG. 21).

A common electrode layer is deposited on the upper surface of the light emitting element LE, the upper surface of the insulating film INS and the upper surface of the first partition wall PW1, a common mask pattern is formed on the common electrode layer, and the common electrode layer is etched in accordance with the common mask pattern, whereby the common electrode CE_1 disposed on the upper surface of each of the light emitting elements LE may be formed.

The common electrode CE_1 may be formed to completely cover the upper surface of the light emitting element LE and the upper surface of the insulating film INS. Also, the common electrode CE_1 may be formed to cover a portion of the upper surface of the first partition wall PW1. Both edges of the common electrode CE_1 in the first direction DR1 may be in contact with the first partition wall PW1. The common electrode CE may include a transparent conductive oxide (TCO) such as indium tin oxide (ITO) or indium zinc oxide (IZO).

Figure 23:
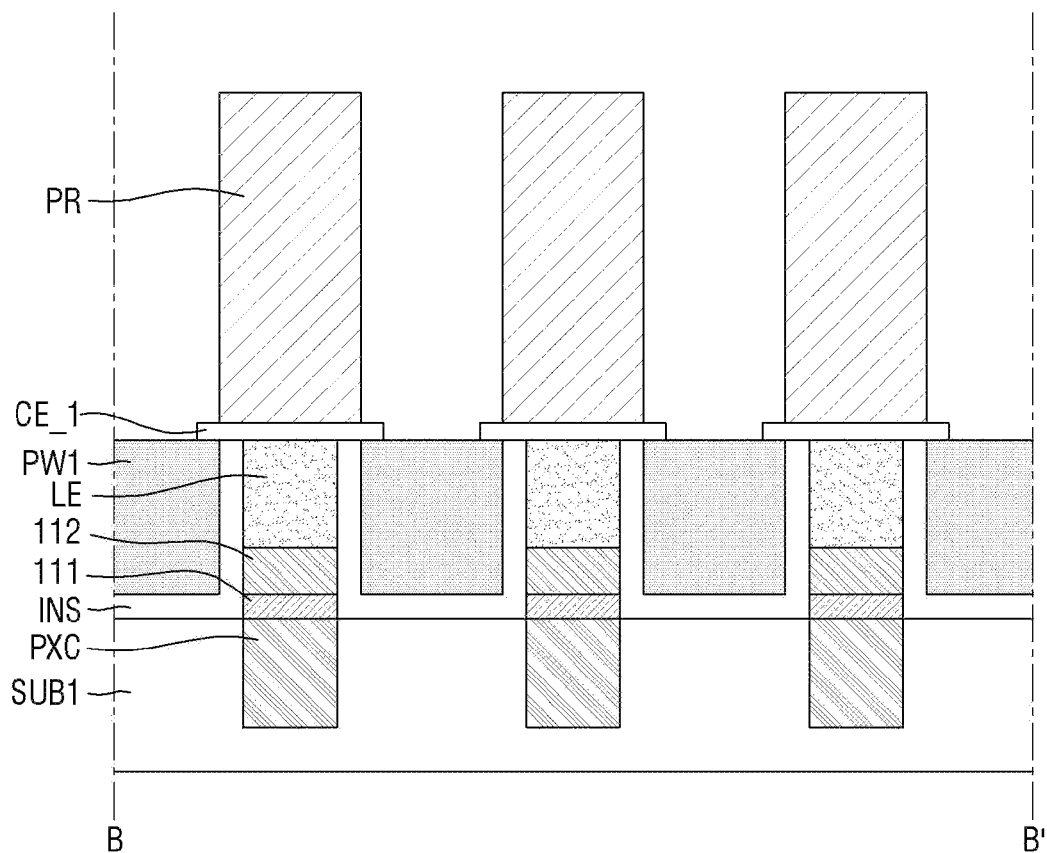

Then, as shown in FIG. 23, a photoresist pattern PR is formed on the upper surface of each of the common electrodes CE_1 (S820 of FIG. 21).

A photoresist layer is formed on the common electrodes CE_1 and the first partition wall PW1, a photo mask pattern is formed on the photoresist layer, and light is irradiated to the photoresist layer that is not covered by the photo mask pattern. Then, the photo mask pattern is removed, and the photoresist layer is etched by an etching material, whereby the photoresist pattern PR disposed on the upper surface of each of the common electrodes CE_1 may be formed. At this time, the photoresist layer may be a negative photosensitive resin in which an area to which light is irradiated remains, or may be a positive photosensitive resin from which an area to which light is irradiated is removed. The photoresist pattern PR may be formed to overlap the light emitting elements LE in the third direction DR3.

Figure 24:
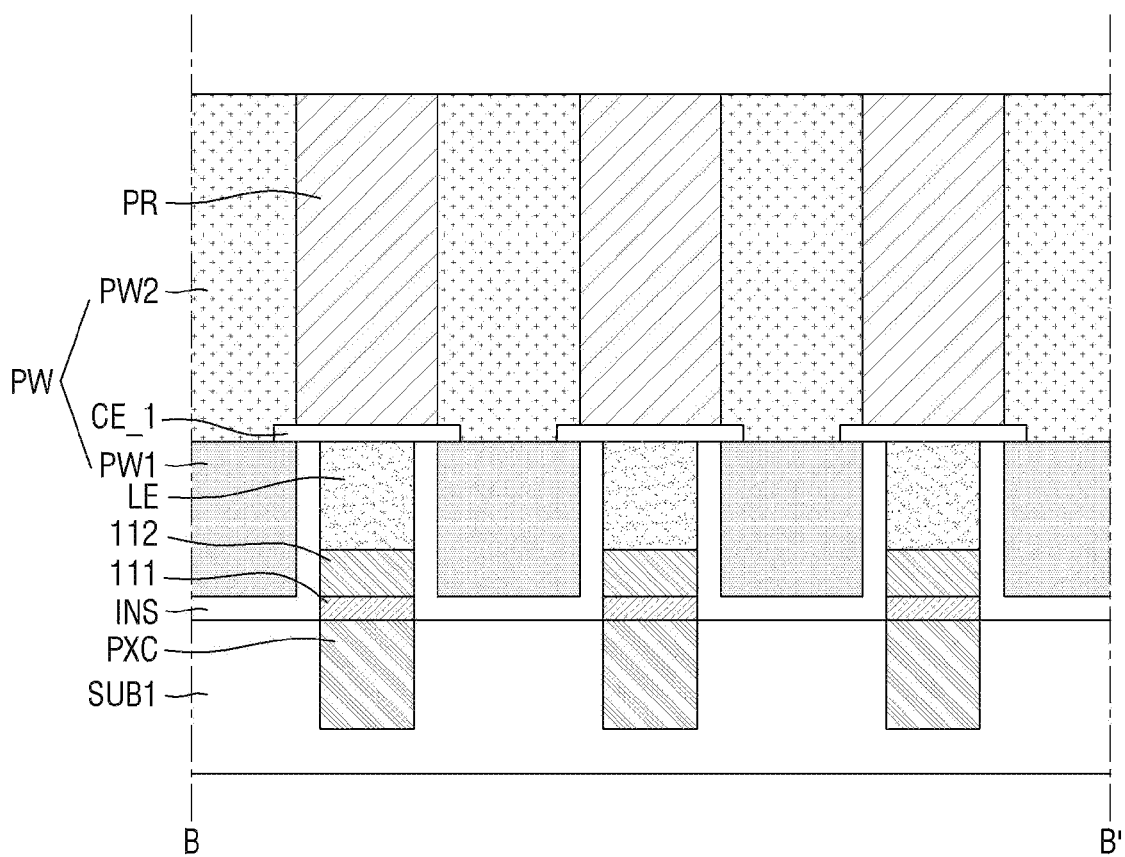

Then, as shown in FIG. 24, the second partition wall PW2 is formed on the first partition wall PW1 that is not covered by the photoresist pattern PR (S920 of FIG. 21).

A second partition wall material layer may be formed on the photoresist pattern PR by electro-plating or electroless-plating. At this time, a thickness of the second partition wall material layer may be thicker than that of the photoresist pattern PR. For example, an upper surface of the photoresist pattern PR may be covered by the second partition wall material layer. The second partition wall material layer may include a conductive material, for example, an opaque metal material such as molybdenum (Mo), aluminum (Al), chromium (Cr), gold (Au), titanium (Ti), nickel (Ni), neodymium (Nd), and copper (Cu).

Then, the second partition wall material layer is removed to expose the upper surface of the photoresist pattern PR, whereby the second partition wall PW2 is formed. The second partition wall material layer disposed on the upper surface of the photoresist pattern PR is removed by a polishing process such as a CMP process. For this reason, the upper surface of the photoresist pattern PR may be exposed without being covered by the second partition wall PW2. The upper surface of the photoresist pattern PR may be exposed without being covered by the second partition wall PW2. The upper surface of the photoresist pattern PR and the upper surface of the second partition wall PW2 may be connected to each other to be flat.

The second partition wall PW2 may be around (e.g., surround) sides of the photoresist pattern PR. The lower surface of the second partition wall PW2 may be in direct contact with the upper surface of the first partition wall PW1 and an upper edge and sides of the common electrode CE_1.

Figure 25:
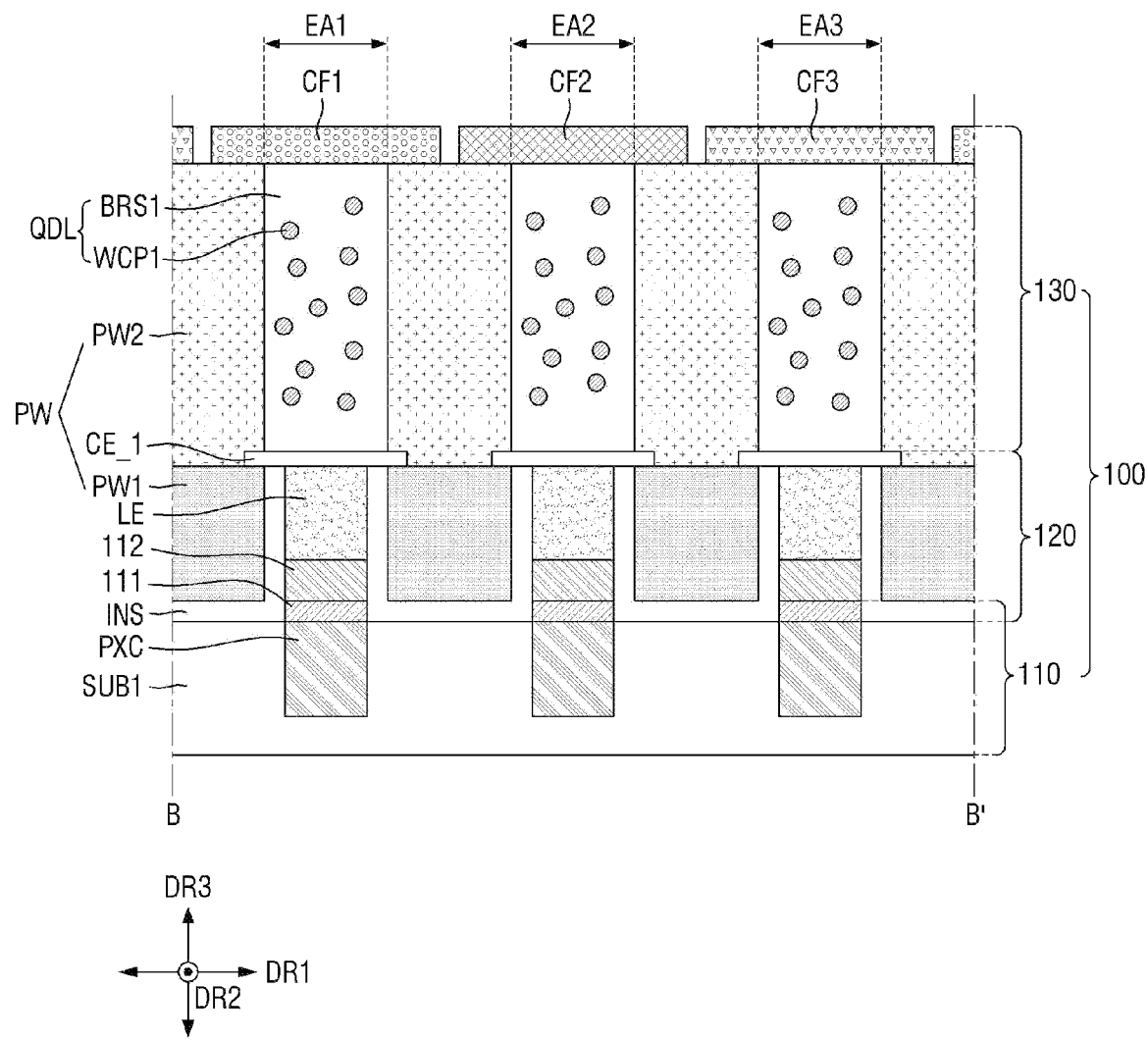

Tenth, as shown in FIG. 25, the photoresist pattern PR is removed, the wavelength conversion layer QDL is formed in the area partitioned by the second partition wall PW2, and color filters CF1, CF2, and CF3 are formed on the wavelength conversion layer QDL (S1020 of FIG. 21).

Because the step S1020 of FIG. 21 is substantially the same as the step S1010 described with reference to FIG. 9, its description will be omitted.

Figure 26:
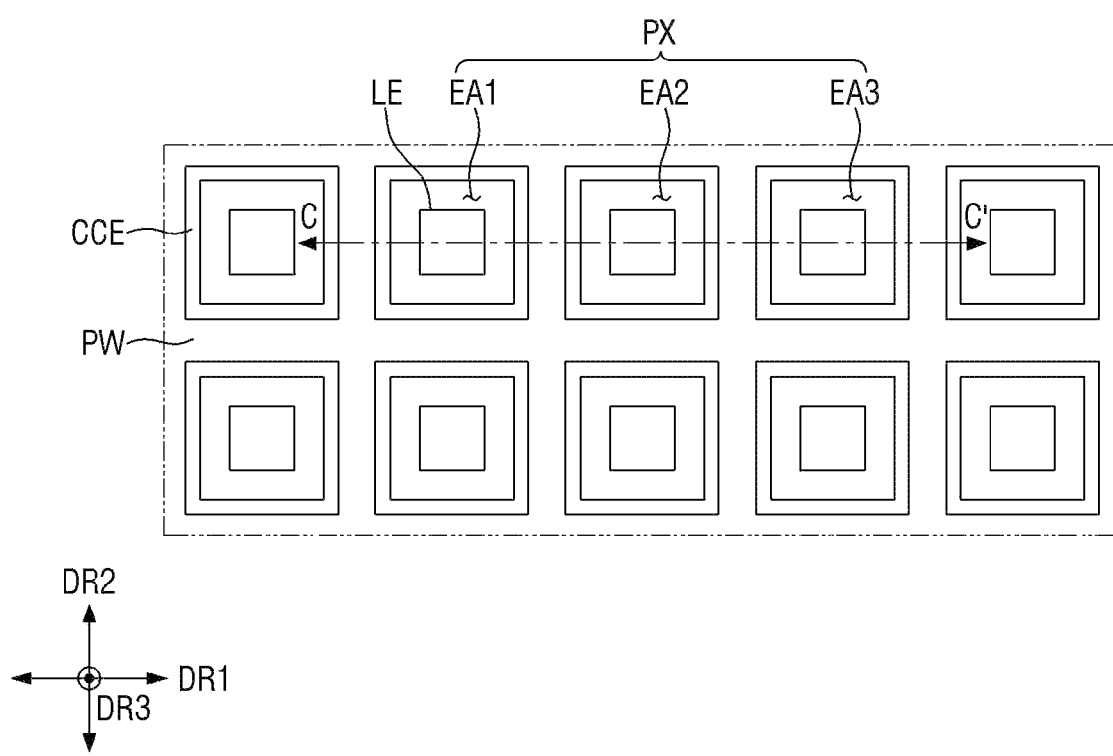
FIG. 26 is a layout view illustrating pixels of a display panel according to one or more embodiments.

FIG. 26 is a layout view illustrating pixels of a display panel according to another one or more embodiments.

The embodiment of FIG. 26 is different from the embodiment of FIG. 3 in that the display area DA of the display panel 100 further includes a common connection electrode CCE disposed to be around (e.g., surround) each of the light emitting elements LE. In FIG. 26, the description duplicated with FIG. 3 will be omitted.

The common connection electrode CCE may be disposed to overlap the partition wall PW in the third direction DR3. The common connection electrode CCE may be disposed to be around (e.g., surround) the light emitting element LE. The common connection electrode CCE may be disposed to be spaced from the light emitting element LE in the first direction DR1 and the second direction DR2. The common connection electrode CCE may have a meshed plane shape, a net plane shape, or a lattice plane shape.

A width of the common connection electrode CCE in the first direction DR1 and the second direction DR2 may be wider than that of the partition wall PW. Therefore, the partition wall PW may completely overlap the common connection electrode CCE in the third direction DR3. A portion of the common connection electrode CCE may overlap the partition wall PW in the third direction DR3.

Figure 27:
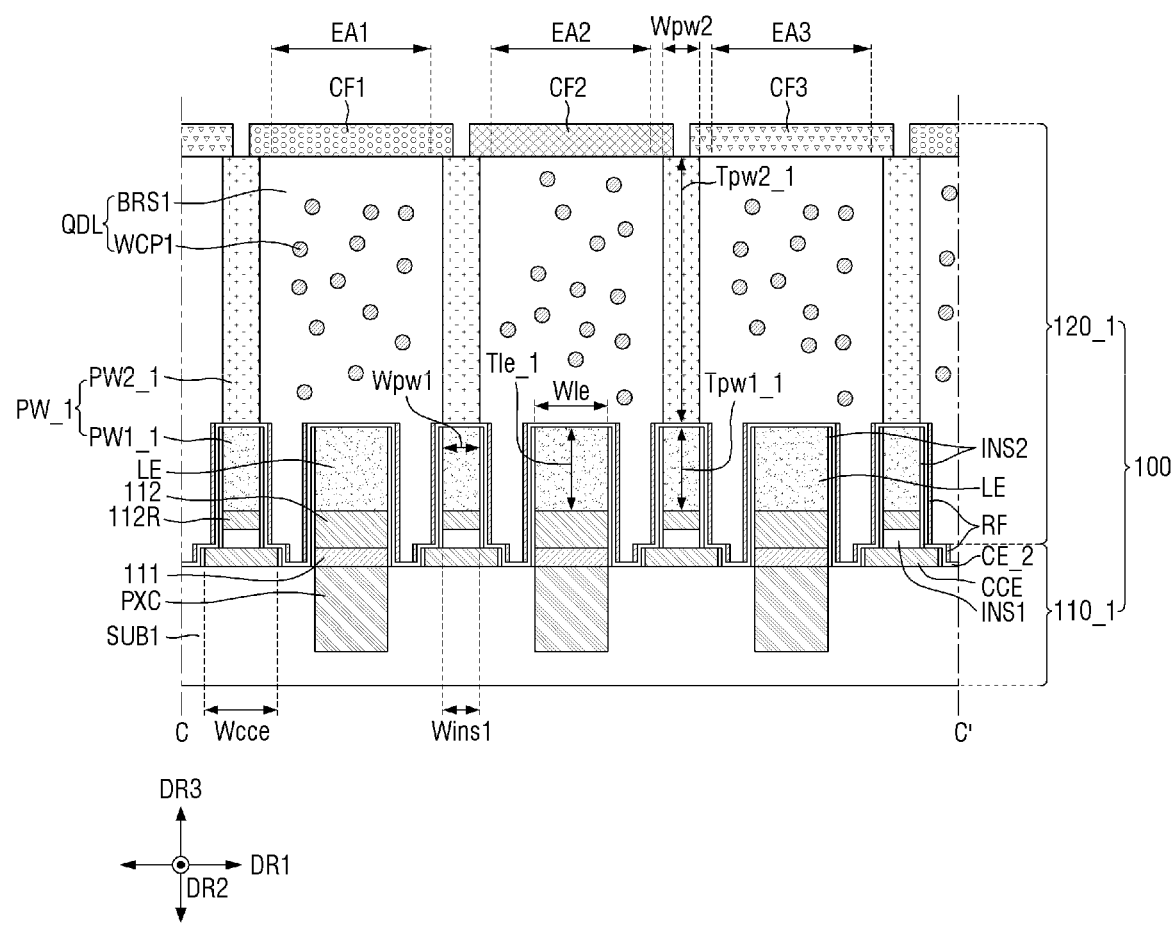
FIG. 27 is a cross-sectional view illustrating an example of a display panel taken along the line C-C' of FIG. 26.

FIG. 27 is a cross-sectional view illustrating an example of a display panel taken along the line C-C' of FIG. 26.

The embodiment of FIG. 27 is different from the embodiment of FIG. 5 in the first partition wall PW1, the second partition wall PW2, the common connection electrode CCE, the first insulating film INS1, the second insulating film INS2, and the reflection film RF. Because the embodiment of FIG. 27 is substantially the same as the embodiment of FIG. 5, its description duplicated with FIG. 5 will be omitted.

Referring to FIG. 27, the display panel 100 includes a semiconductor circuit board 110_1 and a light emitting element layer 120_1. The semiconductor circuit board 110_1 may include a first substrate SUB1, a plurality of pixel circuit areas PXC, and pixel electrodes 111. In one or more embodiments, the semiconductor circuit board 110_1 may also include and a common connection electrode CCE. Because the first substrate SUB1, the plurality of pixel circuit areas PXC, and the pixel electrodes 111 of the semiconductor circuit board 110_1 are substantially the same as those described with reference to FIG. 5, their description will be omitted.

The light emitting element layer 120_1 may include connection electrodes 112, light emitting elements LE, a first insulating film INS1, a conductive pattern 112R, a partition wall PW_1, a second insulating film INS2, a common electrode CE_2, a reflection film RF, a wavelength conversion layer QDL, and a plurality of color filters CF1, CF2, and CF3. The partition wall PW_1 may include a first partition wall PW1_1 and a second partition wall PW2_1. Because the connection electrodes 112, the light emitting elements LE, the wavelength conversion layer QDL and the plurality of color filters CF1, CF2, and CF3 of the light emitting element layer 120_1 are substantially the same as those described with reference to FIG. 5, their description will be omitted.

The common connection electrode CCE may be disposed to be spaced from the pixel electrodes 111. The common connection electrode CCE may be disposed to be around (e.g., surround) each of the pixel electrodes 111.

The common connection electrode CCE may include the same material as that of the connection electrodes 112. For example, the common connection electrode CCE may include at least one of gold (Au), copper (Cu), aluminum (Al), silver (Ag), or tin (Sn). When each of the connection electrodes 112 includes a first layer and a second layer, the common connection electrode CCE may include the same material as that of the first layer of each of the connection electrodes 112.

In one or more embodiments, the common connection electrode CCE may be connected to any one of the first pads PD1 of the first pad area PDA1 of the non-display area NDA or any one of the second pads of the second pad area PDA2 to receive a common voltage.

The first insulating film INS1 may be disposed on the common connection electrode CCE. The first insulating film INS1 may be formed of an inorganic film such as a silicon oxide film ($SiO_2$), an aluminum oxide film ($Al_2O_3$), or a hafnium oxide film (HfOX).

The conductive pattern 112R may be disposed on the first insulating film INS1. The conductive pattern 112R may be disposed between the first insulating film INS1 and the partition wall PW_1 in the third direction DR3. A width of the conductive pattern 112R may substantially be the same as a width Wins1 of the first insulating film INS1 or a width Wpw1 of the first partition wall PW1_1.

The conductive pattern 112R corresponds to a residue formed by the same process as that of the connection electrodes 112 and the common connection electrode CCE. Thus, the conductive pattern 112R may include the same material as that of the connection electrodes 112 and the common connection electrode CCE. For example, the conductive pattern 112R may include at least one of gold (Au), copper (Cu), aluminum (Al), silver (Ag), or tin (Sn). When each of the connection electrodes 112 includes a first layer and a second layer, the conductive pattern 112R may include the same material as that of the second layer of each of the connection electrodes 112.

The light emitting element layer 120_1 may include the first light emission areas EA1, the second light emission areas EA2, and the third light emission areas EA3, which are partitioned by the partition wall PW_1. The light emitting element LE, the wavelength conversion layer QDL, and any one of the plurality of color filters CF1, CF2, and CF3 may be disposed in each of the first light emission areas EA1, the second light emission areas EA2, and the third light emission areas EA3.

The partition wall PW_1 includes a first partition wall PW1_1 and a second partition wall PW2_1. Each of the width Wpw1 of the first partition wall PW1_1 and a width Wpw2 of the second partition wall PW2_1 may be narrower than a width Wcce of the common connection electrode CCE. The width Wpw1 of the first partition wall PW1_1 may substantially be the same as a width of the conductive pattern 112R and a width Wins1 of the first insulating film INS1. Also, the width Wpw1 of the first partition wall PW1_1 may be different from the width Wpw2 of the second partition wall PW2_1, but the present disclosure is not limited thereto. The width Wpw1 of the first partition wall PW1_1 may substantially be the same as the width Wpw2 of the second partition wall PW2_1.

The width Wpw1 of the first partition wall PW1_1 may be narrower than a width Wle of the light emitting element LE. Because the first partition wall PW1_1 is formed by the same process as that of the light emitting elements LE, a thickness Tpw1_1 of the first partition wall PW1_1 may substantially be the same as a thickness Tle_1 of the light emitting element LE.

The first partition wall PW1_1 may be disposed to be spaced from the light emitting element LE disposed in each of the first light emission areas EA1, the second light emission areas EA2, and the third light emission areas EA3. The first partition wall PW1_1 may be disposed to be around (e.g., surround) the light emitting element LE disposed in each of the first light emission areas EA1, the second light emission areas EA2, and the third light emission areas EA3.

The first partition wall PW1_1 may be disposed on the conductive pattern 112R. Because the first partition wall PW_1 is formed by the same process as that of the light emitting element LE, the first partition wall PW1_1 may include the same material as that of the light emitting element LE. The first partition wall PW1_1 may be formed to be substantially the same as the light emitting element LE.

Figure 28:
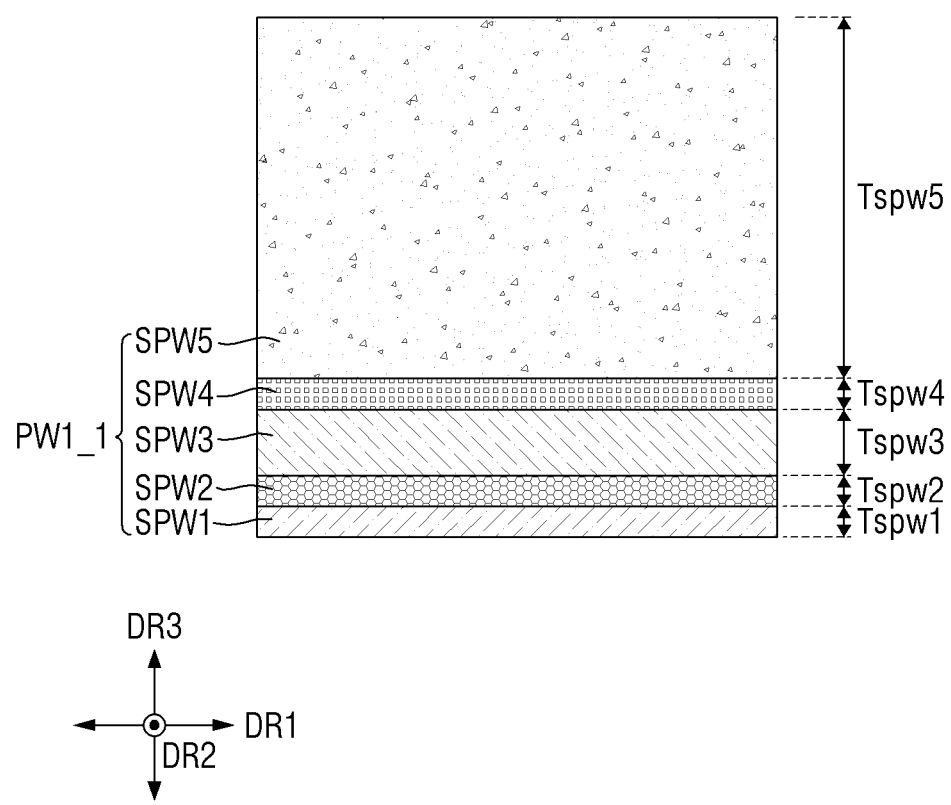
FIG. 28 is a detailed enlarged cross-sectional view illustrating an example of a first partition wall of FIG. 27.

As shown in FIG. 28, the first partition wall PW1_1 may include a plurality of sub-partition walls SPW1 to SPW5 sequentially deposited in the third direction DR3. For example, the first partition wall PW1_1 may include a first sub-partition wall SPW1, a second sub-partition wall SPW2, a third sub-partition wall SPW3, a fourth sub-partition wall SPW4, a fifth sub-partition wall SPW5.

The first sub-partition wall SPW1 may be formed of the same material as that of the first semiconductor layer SEM1 of the light emitting element LE. The first sub-partition wall SPW1 may be formed by the same process as that of the first semiconductor layer SEM1 of the light emitting element LE. A thickness Tspw1 of the first sub-partition wall SPW1 may substantially be the same as the thickness Tsem1 of the first semiconductor layer SEM1 of the light emitting element LE.

The second sub-partition wall SPW2 may be formed of the same material as that of the electron blocking layer EBL of the light emitting element LE. The second sub-partition wall SPW2 may be formed by the same process as that of the electron blocking layer EBL of the light emitting element LE. A thickness Tspw2 of the second sub-partition wall SPW2 may be substantially the same as a thickness Tebl of the electron blocking layer EBL of the light emitting element LE. When the electron blocking layer EBL is omitted, the second sub-partition wall SPW2 may also be omitted.

The third sub-partition wall SPW3 may be formed of the same material as that of the active layer MQW of the light emitting element LE. The third sub-partition wall SPW3 may be formed by the same process as that of the active layer MQW of the light emitting element LE. A thickness Tspw3 of the third sub-partition wall SPW3 may be substantially the same as a thickness Tmqw of the active layer MQW of the light emitting element LE.

The fourth sub-partition wall SPW4 may be formed of the same material as that of the superlattice layer SLT of the light emitting element LE. The fourth sub-partition wall SPW4 may be formed by the same process as that of the superlattice layer SLT of the light emitting element LE. A thickness Tspw4 of the fourth sub-partition wall SPW4 may be substantially the same as a thickness Tslt of the superlattice layer SLT of the light emitting element LE.

The fifth sub-partition wall SPW5 may be formed of the same material as that of the second semiconductor layer SEM2 of the light emitting element LE. The fifth sub-partition wall SPW5 may be formed by the same process as that of the second semiconductor layer SEM2 of the light emitting element LE. Because the fifth sub-partition wall SPW5 is not removed but a portion of the second semiconductor layer SEM2 of the light emitting element LE is removed during the fabricating process of the display panel 100, a thickness Tspw5 of the fifth sub-partition wall SPW5 may be thicker than the thickness Tsem2 of the second semiconductor layer SEM2 of the light emitting element LE.

In one or more embodiments, the first partition wall PW1_1 may include a sixth sub-partition wall formed of a semiconductor layer that is not doped with a dopant, that is, an undoped semiconductor layer. For example, the sixth sub-partition wall may be an undoped GaN that is not doped with a dopant. A thickness of the sixth sub-partition wall may be thicker than the thickness Tsem2 of the second semiconductor layer SEM2 of the light emitting element LE. The thickness of the sixth sub-partition wall may be 2 μm to 3 μm, approximately.

The second partition wall PW2_1 may be disposed on the first partition wall PW1_1. The second partition wall PW2_1 may include a conductive material. The second partition wall PW2_1 may include a metal material having high reflectance. In this case, the light emitted from the light emitting element LE may be reflected from the second partition wall PW2_1 and then output to the upper portion of the light emitting element LE. Also, the light converted by the first wavelength conversion particles WCP1 of the wavelength conversion layer QDL and the light scattered by the scatterer may be reflected from the second partition wall PW2_1 and then emitted by passing through the color filter CF1/CF2/CF3. Therefore, emission efficiency of the light from the light emitting element LE may be enhanced due to the second partition wall PW2_1. The second partition wall PW2_1 may include an opaque metal material such as molybdenum (Mo), aluminum (Al), chromium (Cr), gold (Au), titanium (Ti), nickel (Ni), neodymium (Nd), and copper (Cu).

The second insulating film INS2 may be disposed on sides of the common connection electrode CCE, sides of the first partition wall PW1_1, sides of the first insulating layer INS1, sides of each of the pixel electrodes 111, sides of each of the connection electrodes 112, the sides of the conductive pattern 112R, and/or sides of each of the light emitting elements LE. The second insulating film INS2 may be formed of an inorganic film such as a silicon oxide film ($SiO_2$), an aluminum oxide film ($Al_2O_3$), or a hafnium oxide film (HfOX). A thickness of the second insulating film INS2 may be 0.1 µm, approximately.

The common electrode CE_2 may be disposed on the upper surface and sides of each of the light emitting elements LE and the upper surface and sides of the first partition wall PW1_1. That is, the common electrode CE_2 may be disposed to cover the upper surface and sides of each of the light emitting elements LE and the upper surface and sides of the first partition wall PW1_1.

The common electrode CE_2 may be in contact with the second insulating film INS2 disposed on the sides of the common connection electrode CCE, the sides of the first partition wall PW1_1, sides of the first insulating layer INS1, the sides of each of the pixel electrodes 111, the sides of each of the connection electrodes 112, the sides of the conductive patterns 112R, and/or the sides of each of the light emitting elements LE. In addition, the common electrode CE_2 may be in contact with the upper surface of the common connection electrode CCE, the upper surface of each of the light emitting elements LE, and the upper surface of the first partition wall PW1_1. The common electrode CE_2 may be disposed between the first partition wall PW1_1 and the second partition wall PW2_1.

The width Wins1 of the first insulating film INS1 in the first direction DR1 or the second direction DR2 may be narrower than the width Wcce of the common connection electrode CCE. For this reason, a portion of the upper surface of the common connection electrode CCE may be exposed without being covered by the first insulating film INS1. Therefore, the common electrode CE_2 may be in contact with the upper surface of the common connection electrode CCE and the upper surface of the light emitting element LE, which are exposed without being covered by the second insulating film INS2. Therefore, the common voltage supplied to the common connection electrode CCE may be applied to the light emitting element LE. That is, one end of the light emitting element LE may be supplied with a pixel voltage or an anode voltage of the pixel electrode 111 through the connection electrode 112, and the other end thereof may be supplied with a common voltage through the common electrode CE_2. The light emitting element LE may emit light with a desired luminance (e.g., a predetermined luminance) in accordance with a voltage difference between the pixel voltage and the common voltage.

The common electrode CE_2 may include a transparent conductive material. The common electrode CE_2 may be formed of a transparent conductive oxide (TCO) such as indium tin oxide (ITO) or indium zinc oxide (IZO). A thickness of the common electrode CE_2 may be 0.1 µm, approximately.

The reflection film RF serves to reflect light moving to upper and lower regions of left and right sides and not to an upper direction from among the light emitted from the light emitting element LE. The reflection film RF may include a metal material having high reflectance, such as aluminum (Al). A thickness of the reflection film RF may be 0.1 µm, approximately.

The reflection film RF may be disposed on the sides of the common connection electrode CCE, the sides of the partition wall PW_1, sides of the first insulating layer INS1, the sides of each of the pixel electrodes 111, the sides of each of the connection electrodes 112, the sides of the conductive pattern 112R, and/or the sides of each of the light emitting elements LE. The reflection film RF may be in contact with the common electrode CE_2 disposed on the sides of the common connection electrode CCE, the sides of the partition wall PW, sides of the first insulating layer INS1, the sides of each of the pixel electrodes 111, the sides of each of the connection electrodes 112, the sides of the conductive pattern 112R, and/or the sides of each of the light emitting elements LE.

The second partition wall PW2_1 may partition the first light emission areas EA1, the second light emission areas EA2, and the third light emission areas EA3 together with the first partition wall PW1_1. The second partition wall PW2_1 may be disposed between the wavelength conversion layers QDL that are adjacent to each other in the first direction DR1 and the second direction DR2. The second partition wall PW2_1 may be around (e.g., surround) the sides of each of the wavelength conversion layers QDL. Sides of the second partition wall PW2_1 may be in contact with the sides of each of the wavelength conversion layers QDL.

The second partition wall PW2_1 may be disposed on the common electrode CE_2 disposed on the upper surface of the first partition wall PW1_1. A lower surface of the second partition wall PW2_1 may be in contact with the common electrode CE_2.

The second partition wall PW2_1 may include a conductive material. The second partition wall PW2_1 may include a metal material having high reflectance. The second partition wall PW2_1 may include an opaque metal material such as molybdenum (Mo), aluminum (Al), chromium (Cr), gold (Au), titanium (Ti), nickel (Ni), neodymium (Nd), and copper (Cu). In this case, the light converted by the first wavelength conversion particles WCP1 of the wavelength conversion layer QDL and the light scattered by the scatterer may be reflected from the second partition wall PW2_1 and then emitted by passing through the color filter CF1/CF2/CF3. Therefore, emission efficiency of the light from the light emitting element LE may be enhanced due to the second partition wall PW2_1.

The width Wpw2 of the second partition wall PW2_1 may be narrower than the width Wle of the light emitting element LE. A thickness Tpw2_1 of the second partition wall PW2_1 may be different from the thickness Tpw1_1 of the first partition wall PW1_1. For example, the thickness Tpw2_1 of the second partition wall PW2_1 may be thicker than the thickness Tpw1_1 of the first partition wall PW1_1. As the thickness Tpw2_1 of the second partition wall PW2 is increased, a content of the first wavelength conversion particles WCP1 contained in the wavelength conversion layer QDL is increased, whereby light conversion efficiency of the wavelength conversion layer QDL may be increased. Therefore, in order to enhance light conversion efficiency of the light emitting element LE, the thickness Tpw2_1 of the second partition wall PW2_1 may be thicker than the thickness Tpw1_1 of the first partition wall PW1_1, but the present disclosure is not limited thereto. The thickness Tpw2_1 of the second partition wall PW2_1 may be set in consideration of light conversion efficiency.

The wavelength conversion layer QDL may be disposed on the light emitting element LE in each of the first light emission areas EA1, the second light emission areas EA2, and the third light emission areas EA3. The wavelength conversion layer QDL may be disposed between the light emitting element LE and the first partition wall PW1_1 in each of the first light emission areas EA1, the second light emission areas EA2, and the third light emission areas EA3. The wavelength conversion layer QDL may be in contact with the common electrode CE_2 disposed on the upper surface of the light emitting element LE and the reflection film RF disposed on the sides of the light emitting element LE. Also, the wavelength conversion layer QDL may be in contact with the common electrode CE_2 disposed on the upper surface of the first partition wall PW1_1 and the upper surface of the common connection electrode CCE. Also, the wavelength conversion layer QDL may be in contact with the reflection film RF disposed on the sides of the common connection electrode CCE, the sides of the first insulating film INS1, the sides of the conductive pattern 112R, and the sides of the first partition wall PW1_1. Also, the wavelength conversion layer QDL may be in contact with the sides of the second partition wall PW2_1.

Although FIG. 27 illustrates that one wavelength conversion layer QDL is disposed in each of the first light emission areas EA1, the second light emission areas EA2, and the third light emission areas EA3, the present disclosure is not limited thereto. For example, as shown in FIG. 7, the wavelength conversion layer QDL may include a first wavelength conversion layer QDL1 and a second wavelength conversion layer QDL2 in each of the first light emission areas EA1, the second light emission areas EA2, and the third light emission areas EA3. Alternatively, as shown in FIG. 8, the light transmitting layer TPL may be disposed in each of the first light emission areas EA1, the first wavelength conversion layer QDL1 may be disposed in each of the second light emission areas EA2, and the second wavelength conversion layer QDL2 may be disposed in each of the third light emission areas EA3.

As shown in FIG. 27, the second partition wall PW2_2 is formed of a metal material having high reflectance, whereby the light converted by the first wavelength conversion particles WCP1 of the wavelength conversion layer QDL and the light scattered by the scatterer may be reflected from the second partition wall PW2_2 and then emitted by passing through the color filter CF1/CF2/CF3. Therefore, emission efficiency of the light from the light emitting element LE may be enhanced due to the second partition wall PW2_2.

Figure 29:
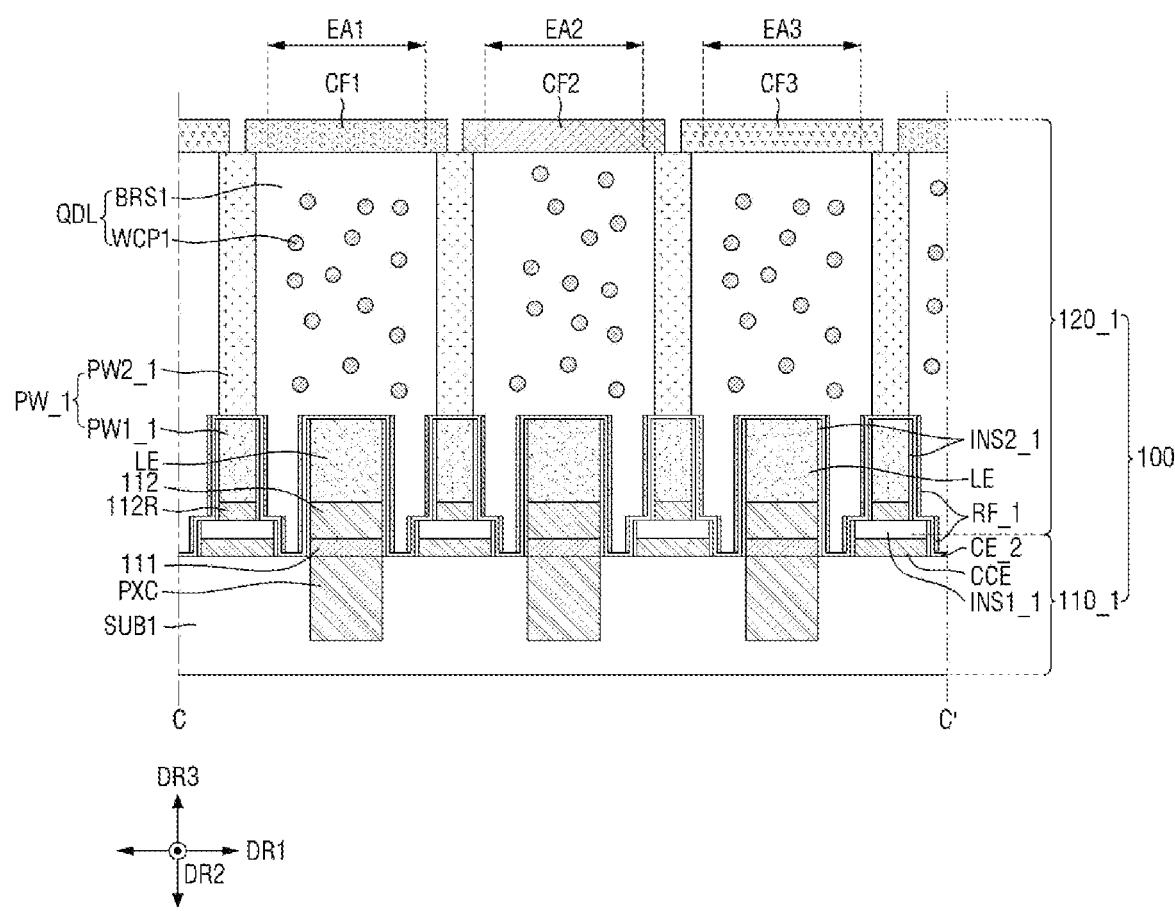
FIG. 29 is a cross-sectional view illustrating an example of a display panel taken along the line C-C' of FIG. 26.

FIG. 29 is a cross-sectional view illustrating an example of a display panel taken along the line C-C' of FIG. 26.

The embodiment of FIG. 29 is different from the embodiment of FIG. 27 in that the first insulating film INS1_1 completely covers the upper surface of the common connection electrode CCE. In FIG. 29, the description duplicated with the embodiment of FIG. 27 will be omitted.

Referring to FIG. 29, the first insulating film INS1_1 may be disposed on the upper surface of the common connection electrode CCE. Because the first insulating film INS1_1 completely covers the upper surface of the common connection electrode CCE, the upper surface of the common connection electrode CCE may not be exposed. For this reason, the common electrode CE_2 may be in contact with the upper surface of the first insulating film INS1_1, and may not be in contact with the upper surface of the common connection electrode CCE. In this case, the common electrode CE_2 may be connected to the common voltage supply portion CVS in the non-display area NDA and then supplied with a common voltage.

The second insulating film INS2_1 may be disposed on the sides of the first insulating film INS1_1, and the reflection film RF_1 may be disposed on the common electrode CE_2 disposed on the sides of the first insulating film INS1_1.

Figure 30:
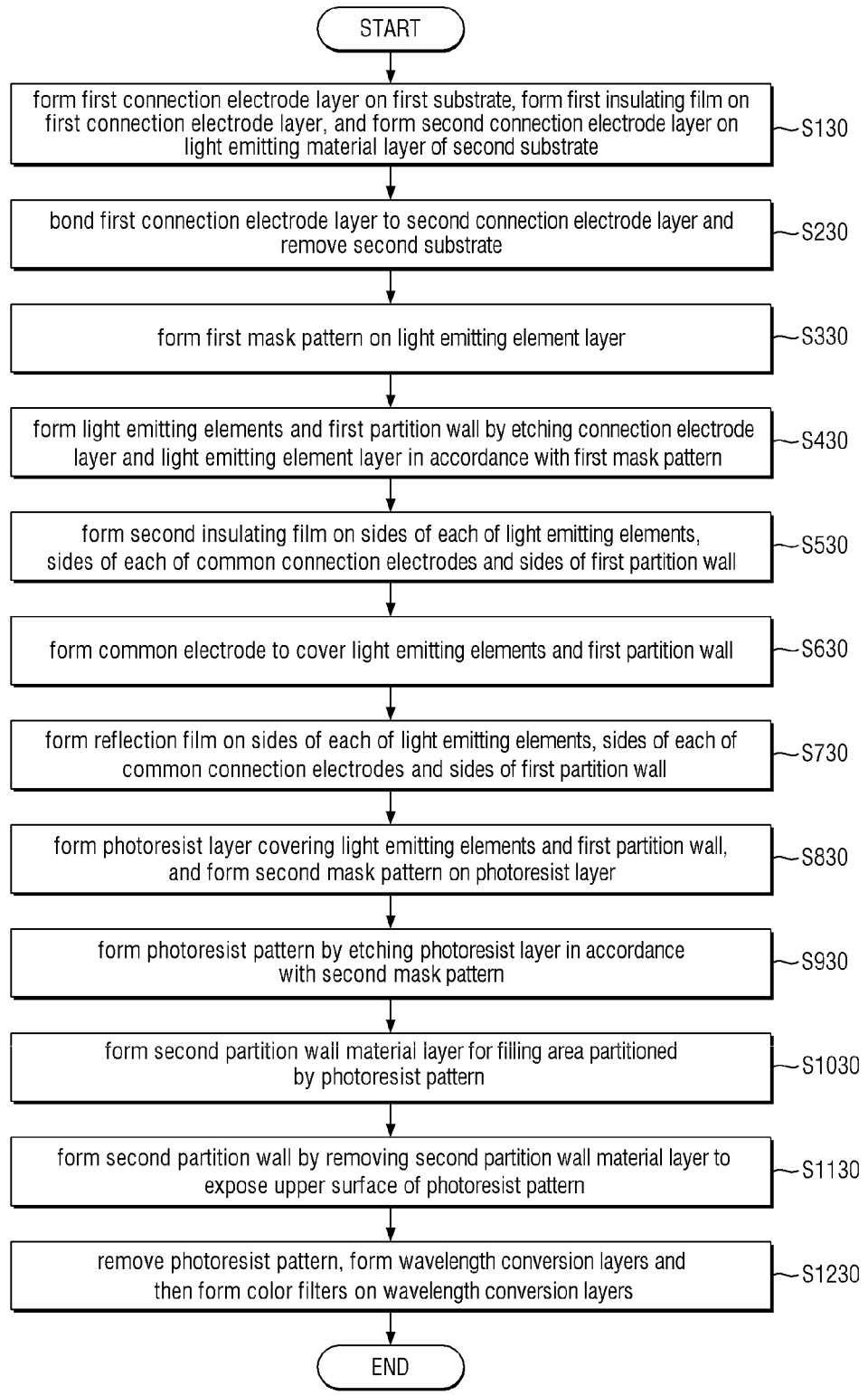
FIG. 30 is a flow chart illustrating a method for fabricating a display device according to one or more embodiments of the present disclosure.

FIG. 30 is a flow chart illustrating a method for fabricating a display device according to one or more embodiments of the present disclosure. FIGS. 31 to 45 are cross-sectional views illustrating a method for fabricating a display device according to one or more embodiments of the present disclosure. In FIGS. 31 to 45, cross-sectional views of a display panel taken along the line C-C' of FIG. 26 are shown. Hereinafter, a method for fabricating a display panel according to one or more embodiments of the present disclosure will be described in detail with reference to FIGS. 30 to 45.

Figure 31:
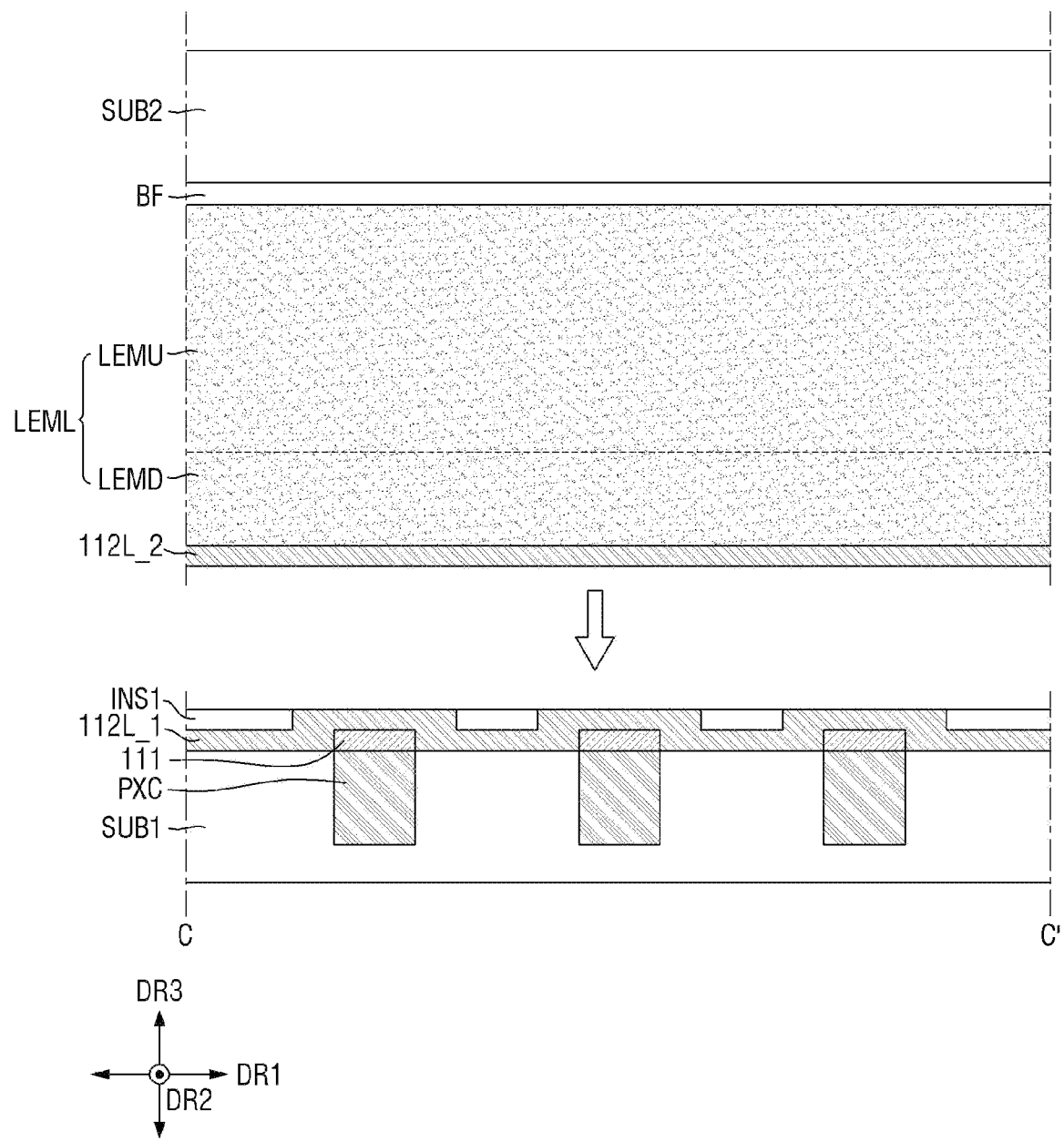
FIGS. 31 to 45 are cross-sectional views illustrating a method for fabricating a display device according to one or more embodiments of the present disclosure.

First, as shown in FIG. 31, a first connection electrode layer 112L_1 is formed on a first substrate SUB1, a first insulating film INS1 is formed on the first connection electrode layer 112L_1, and a second connection electrode layer 112L_2 is formed on a light emitting material layer LEML of a second substrate SUB2 (S130 of FIG. 30).

The first connection electrode layer 112L_1 is deposited to cover the pixel electrodes of the first substrate SUB1. The first connection electrode layer 112L_1 may include gold (Au), copper (Cu), aluminum (Al), silver (Ag) or tin (Sn).

A height difference may occur between an upper surface of the first connection electrode layer 112L_1 disposed on the pixel electrodes 111 and an upper surface of the first connection electrode layer 112L_1 disposed on the first substrate SUB1 in which the pixel electrodes 111 are not disposed, due to a height difference between the upper surface of the first substrate SUB1 and the upper surface of the pixel electrode 111. In order to eliminate the height difference, the first insulating film INS1 may be formed on the first connection electrode layer 112L_1 disposed on the first substrate SUB1. In this case, the upper surface of the first insulating film INS1 and the upper surface of the first connection electrode layer 112L_1 disposed on the pixel electrode 111 may be connected to each other to be flat. The first insulating film INS1 may be formed of an inorganic film such as a silicon oxide film ($SiO_2$), an aluminum oxide film ($Al_2O_3$), or a hafnium oxide film (HfOX).

Also, a buffer film BF may be formed on one surface of the second substrate SUB2. The second substrate SUB2 may be a silicon substrate or a sapphire substrate. The buffer film BF may be formed of an inorganic film such as a silicon oxide film ($SiO_2$), an aluminum oxide film ($Al_2O_3$), or a hafnium oxide film (HfOX).

The light emitting material layer LEML may be disposed on the buffer film BF. The light emitting material layer LEML may include a first semiconductor material layer LEMD and a second semiconductor material layer LEMU. The second semiconductor material layer LEMU may be disposed on the buffer film BF, and the first semiconductor material layer LEMD may be disposed on the second semiconductor material layer LEMU.

As shown in FIG. 6, the first semiconductor material layer LEMD may include a first semiconductor layer SEM1, an electron blocking layer EBL, an active layer MQW, a superlattice layer SLT, and a second semiconductor layer SEM2. The second semiconductor material layer LEMU may be formed of a semiconductor layer that is not doped with a dopant, that is, an undoped semiconductor layer. For example, the second semiconductor material layer LEMU may be undoped-GaN that is not doped with a dopant. A thickness of the second semiconductor material layer LEMU may be thicker than that of the first semiconductor material layer LEMD.

The second connection electrode layer 112L_2 may be deposited on the first semiconductor material layer LEMD. The second connection electrode layer 112L_2 may include gold (Au), copper (Cu), aluminum (Al), silver (Ag), or tin (Sn).

Figure 32:
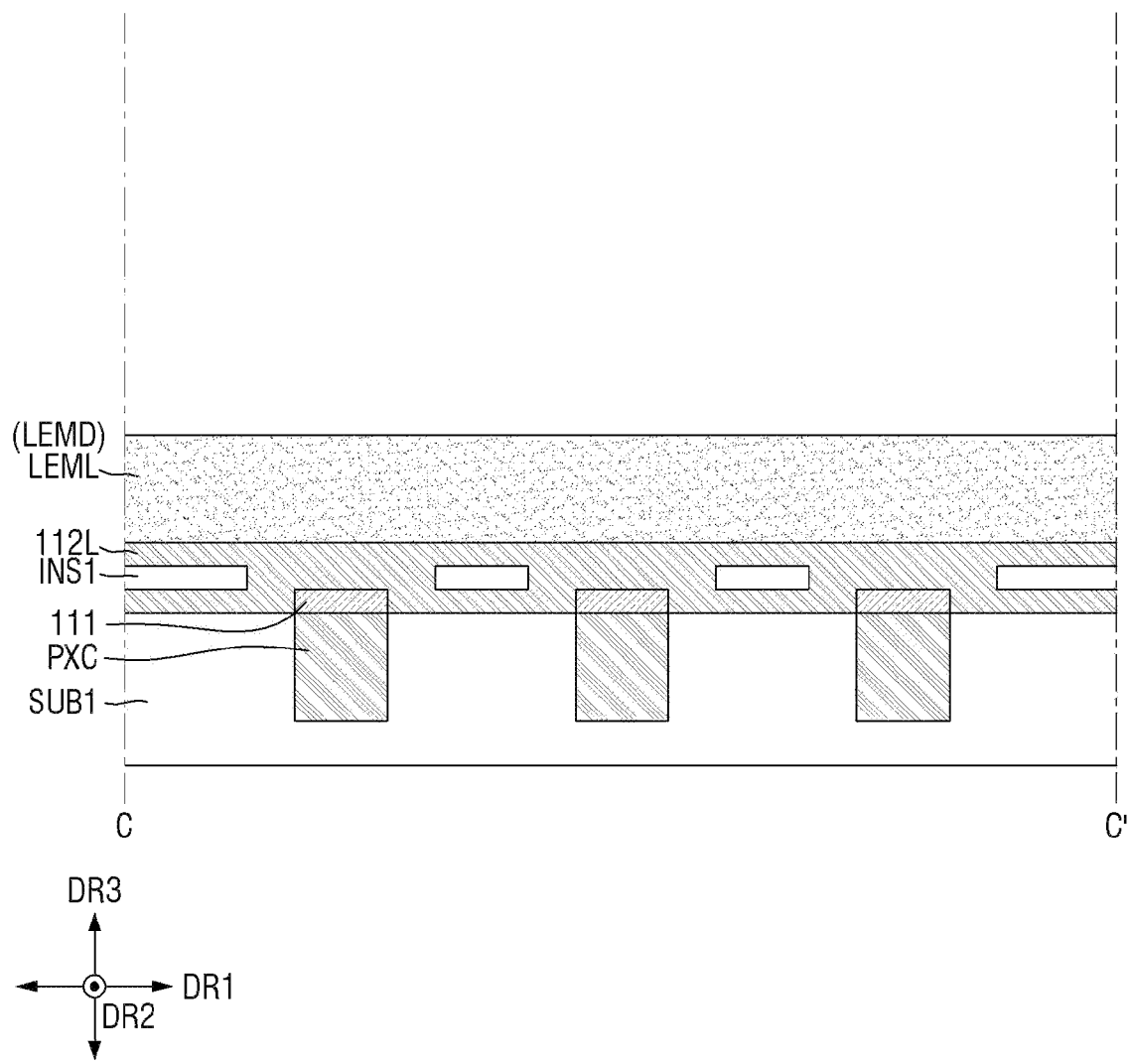

Second, as shown in FIG. 32, the first connection electrode layer 112L_1 and the second connection electrode layer 112L_2 are bonded to each other, and the second substrate SUB2 is removed (S230 of FIG. 30).

The first connection electrode layer 112L_1 of the first substrate SUB1 and the second connection electrode layer 112L_2 of the second substrate SUB2 are brought into contact with each other. Then, the first connection electrode layer 112L_1 and the second connection electrode layer 112L_2 are subjected to melt bonding at a suitable temperature (e.g., a predetermined temperature) to form one connection electrode layer 112L. That is, the connection electrode layer 112L is disposed between the pixel electrodes 111 of the first substrate SUB1 and the light emitting material layer LEML of the second substrate SUB2 and serves as a bonding metal layer for bonding the pixel electrodes 111 of the first substrate SUB1 to the light emitting material layer LEML of the second substrate SUB2.

Also, the first insulating film INS1 may be around (e.g., surrounded) by the connection electrode layer 112L. The upper surface, the lower surface, and the sides of the first insulating film INS1 may be in contact with the connection electrode layer 112L.

Then, the second substrate SUB2 and the buffer film BF may be removed through a polishing process, such as a chemical mechanical polishing (CMP) process, and/or an etching process. In addition, the second semiconductor material layer LEMU of the light emitting material layer LEML may be removed through the polishing process such as the CMP process.

Figure 33:
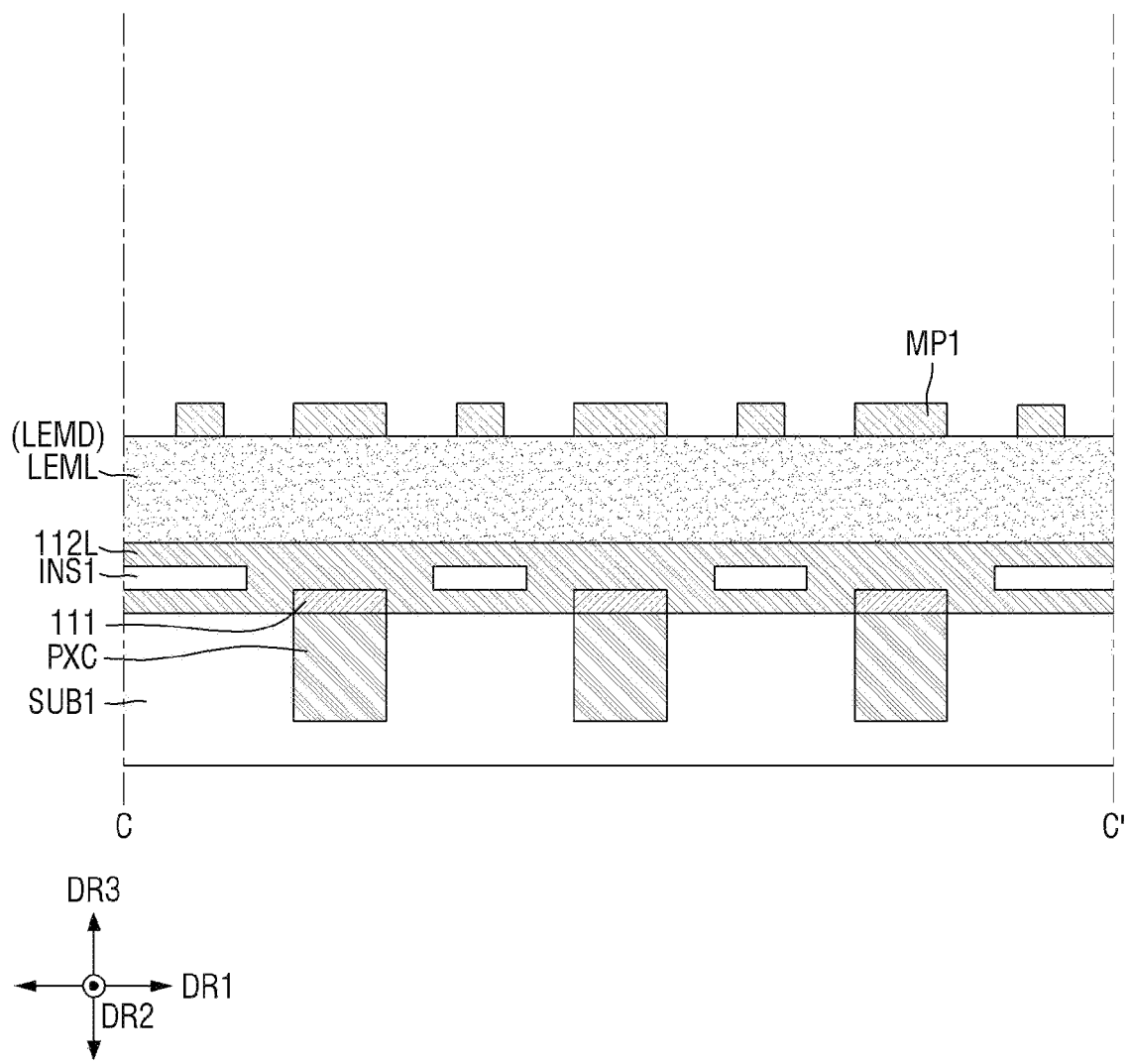

Third, as shown in FIG. 33, a first mask pattern MP1 is formed on the light emitting material layer LEML (S330 of FIG. 30).

The first mask pattern MP1 is formed on the upper surface of the light emitting material layer LEML. The upper surface of the light emitting material layer LEML may be a surface upwardly exposed by removing the second substrate SUB2, the buffer film BF, and the second light emitting material layer LEMU. The first mask pattern MP1 may be disposed in an area where the light emitting elements LE and the first partition wall PW2 are to be formed. As a result, the first mask pattern MP1 may overlap the pixel electrode 111 in the third direction DR3. The first mask pattern MP1 may include a conductive material such as nickel (Ni). A thickness of the first mask pattern MP1 may be 0.01 μm to 1 μm, approximately.

Figure 34:
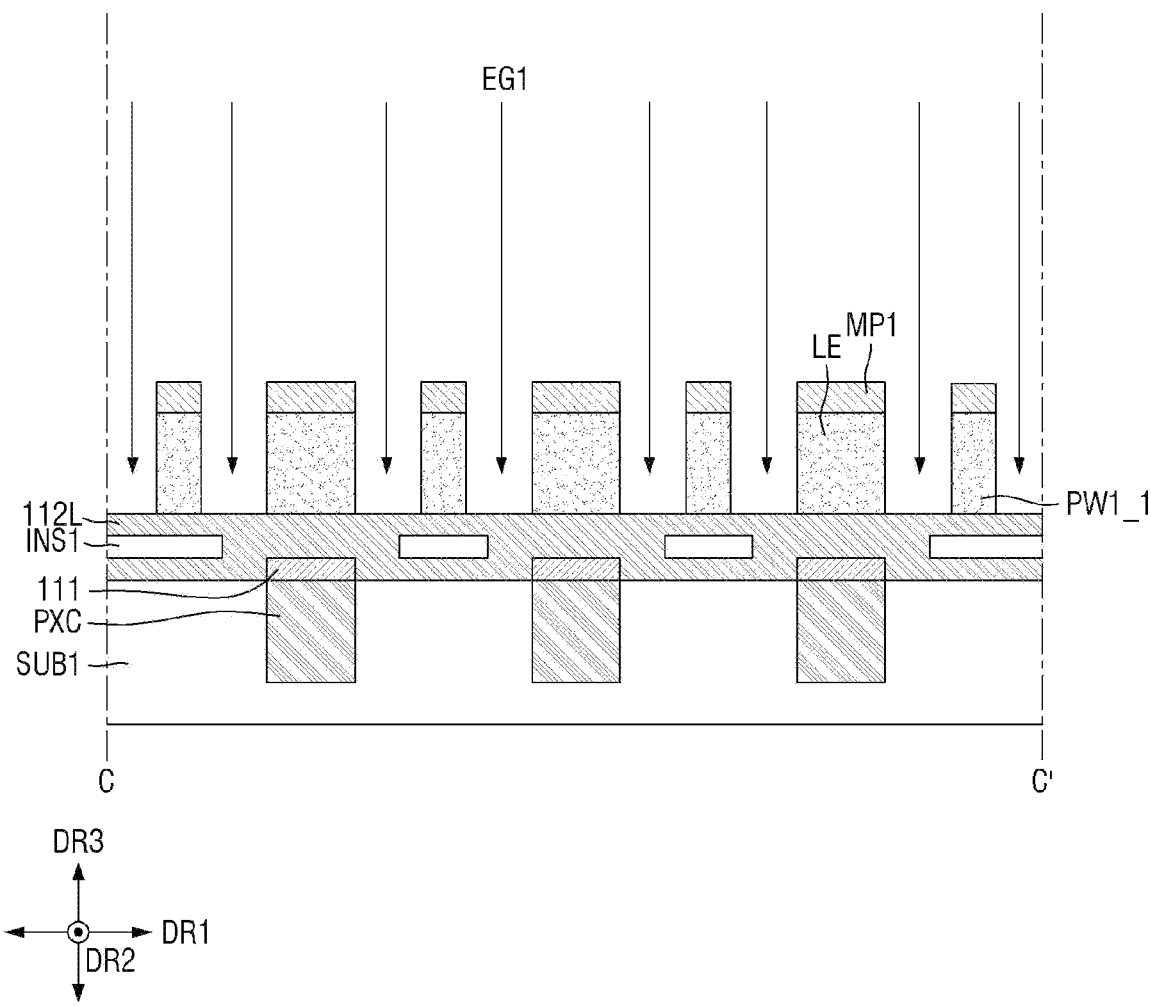
Figure 35:
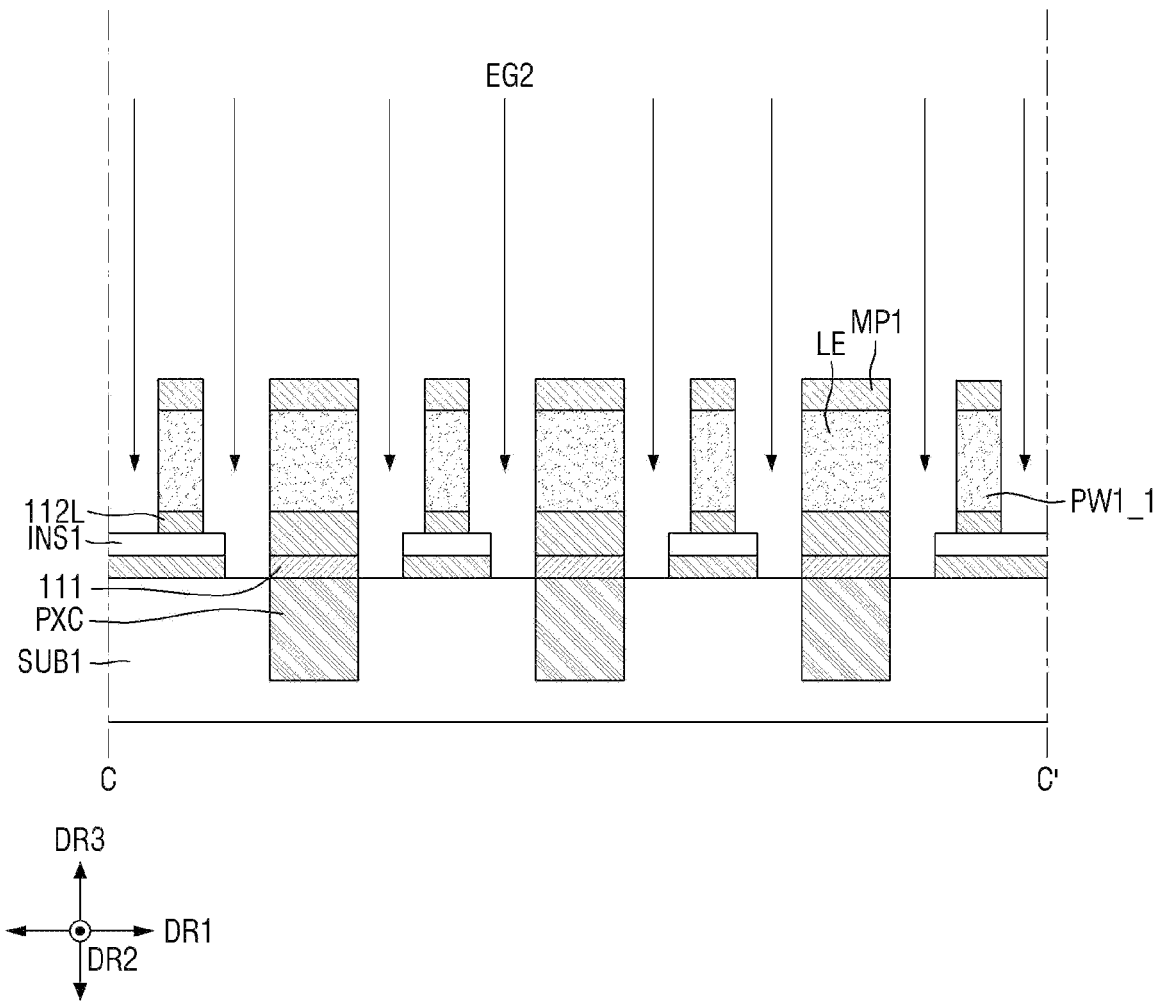
Figure 36:
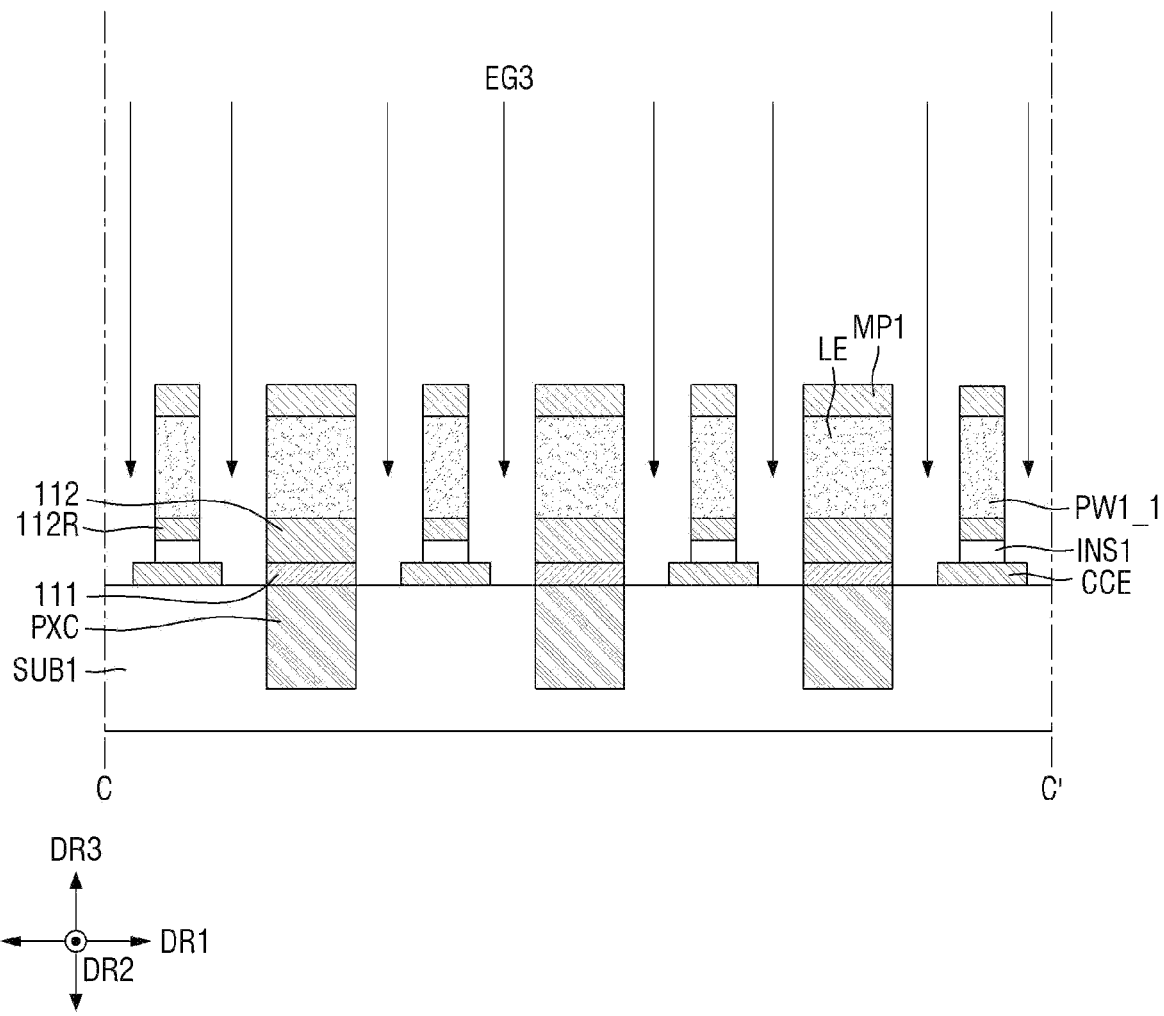

Fourth, as shown in FIGS. 34 to 36, the light emitting material layer LEML and the connection electrode layer 112L are etched in accordance with the first mask pattern MP1 to form the light emitting elements and the first partition wall (S430 of FIG. 30).

As shown in FIG. 34, the first mask pattern MP1 may not be etched by a first etching material EG1 for etching the light emitting material layer LEML. For this reason, the light emitting material layer LEML of the area where the first mask pattern MP1 is disposed may not be etched by the first etching material EG1. Therefore, the light emitting elements LE and the first partition wall PW1 may be formed in the area where the first mask pattern MP1 is disposed.

Also, as shown in FIG. 35, the first mask pattern MP1 and the first insulating film INS1 may not be etched by a second etching material EG2 for etching the connection electrode layer 112L. For this reason, the connection electrode layer 112L of the area where the first insulating film INS1 and the first mask pattern MP1 are disposed may not be etched by the second etching material EG2. The connection electrodes 112 disposed below each of the light emitting elements LE and the common connection electrode CCE disposed below the first insulating film INS1 may be formed.

Also, as shown in FIG. 36, the first mask pattern MP1 and the common connection electrode CCE may not be etched by a third etching material EG3 for etching the first insulating film INS1. The first insulating film INS1 exposed without being covered by the conductive pattern 112R disposed below the first mask pattern MP1 may be etched by the third etching material EG3. Therefore, a portion of the upper surface of the common connection electrode CCE may be exposed without being covered by the first insulating film INS1.

Figure 37:
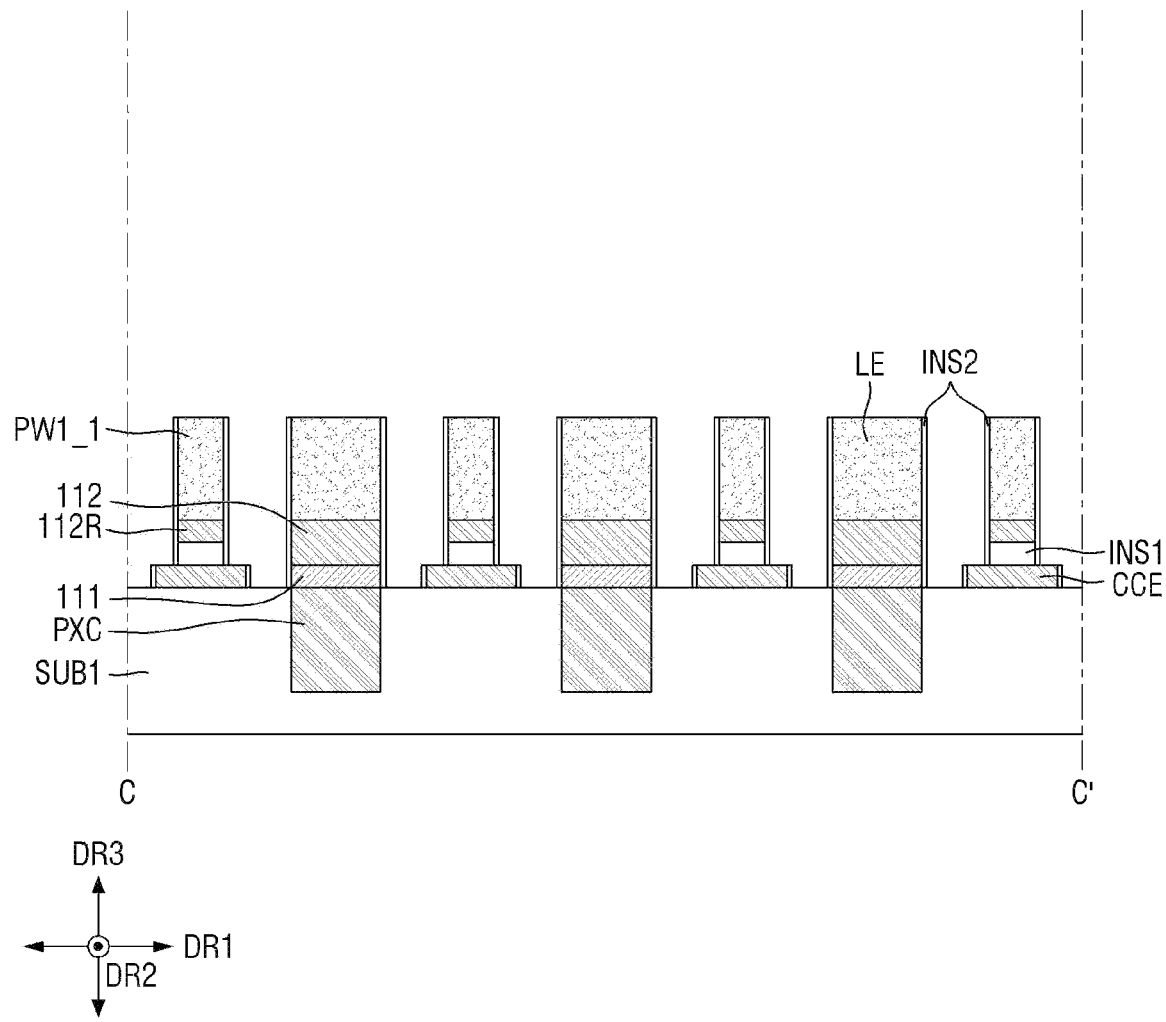

Fifth, as shown in FIG. 37, the second insulating film INS2 is formed on the sides of each of the light emitting elements LE, the sides of each of the common connection electrodes CCE, and the sides of the first partition wall PW1_1 (S530 of FIG. 30).

The first mask pattern MP1 is removed, and then a second insulating film layer is deposited to cover the light emitting elements LE and the first partition wall PW1_1. The second insulating film layer INS2 may be disposed on the upper surface and sides of each of the common connection electrode CCE, the upper surface and sides of the first partition wall PW1_1, the sides of each of the pixel electrodes 111, the sides of the connection electrodes 112, the upper surface and sides of each of the light emitting elements LE, sides of the first insulating layer INS1, sides of the conductive pattern 112R, and/or the upper surface of the first substrate SUB1 between the pixel electrode 111 and the common connection electrode CCE.

Then, a big voltage difference is formed in the third direction DR3 without a separate mask, and when the second insulating film layer is etched by a suitable etching material (e.g., a predetermined etching material), the suitable etching material (e.g., a predetermined etching material) etches the second insulating film layer INS2 while moving in the third direction DR3. For this reason, the second insulating film layer INS2 disposed on a horizontal plane defined by the first direction DR1 and the second direction DR2 is removed, whereas the second insulating film layer disposed on a vertical plane defined in the third direction DR3 may not be removed. Therefore, the second insulating film layer disposed on the upper surface of the common connection electrode CCE, the upper surface of the first partition wall PW1_1, the upper surface of each of the light emitting elements LE, and the upper surface of the first substrate SUB1 between the pixel electrode 111 and the common connection electrode CCE may be removed. In contrast, the second insulating film layer disposed on the sides of the common connection electrode CCE, the sides of the first partition wall PW1_1, the sides of each of the pixel electrodes 111, the sides of each of the connection electrodes 112, sides of the first insulating layer INS1, sides of the conductive pattern 112R, and the sides of each of the light emitting elements LE may not be removed. Therefore, the second insulating film INS2 may be formed on the sides of the common connection electrode CCE, the sides of the first partition wall PW1_1, the sides of each of the pixel electrodes 111, the sides of each of the connection electrodes 112, sides of the first insulating layer INS1, sides of the conductive pattern 112R, and/or the sides of each of the light emitting elements LE.

The second insulating film INS2 may be formed of an inorganic film such as a silicon oxide film ($SiO_2$), an aluminum oxide film ($Al_2O_3$), or a hafnium oxide film (HfOX). A thickness of the second insulating film INS2 may be 0.1 µm, approximately.

Because a portion of an upper portion of the second insulating film layer INS2 disposed on the sides of the first partition wall PW1_1 may be removed by the second etching material EG2, a height of the second insulating film INS2 disposed on the sides of the first partition wall PW1_1 may be lower than that of the upper surface of the first partition wall PW1_1. Similarly, because a portion of an upper portion of the second insulating film layer INS2 disposed on the sides of each of the light emitting elements LE may be removed by the second etching material EG2, a height of the second insulating film INS2 disposed on the sides of each of the light emitting elements LE may be lower than that of the upper surface of the light emitting element LE.

Figure 38:
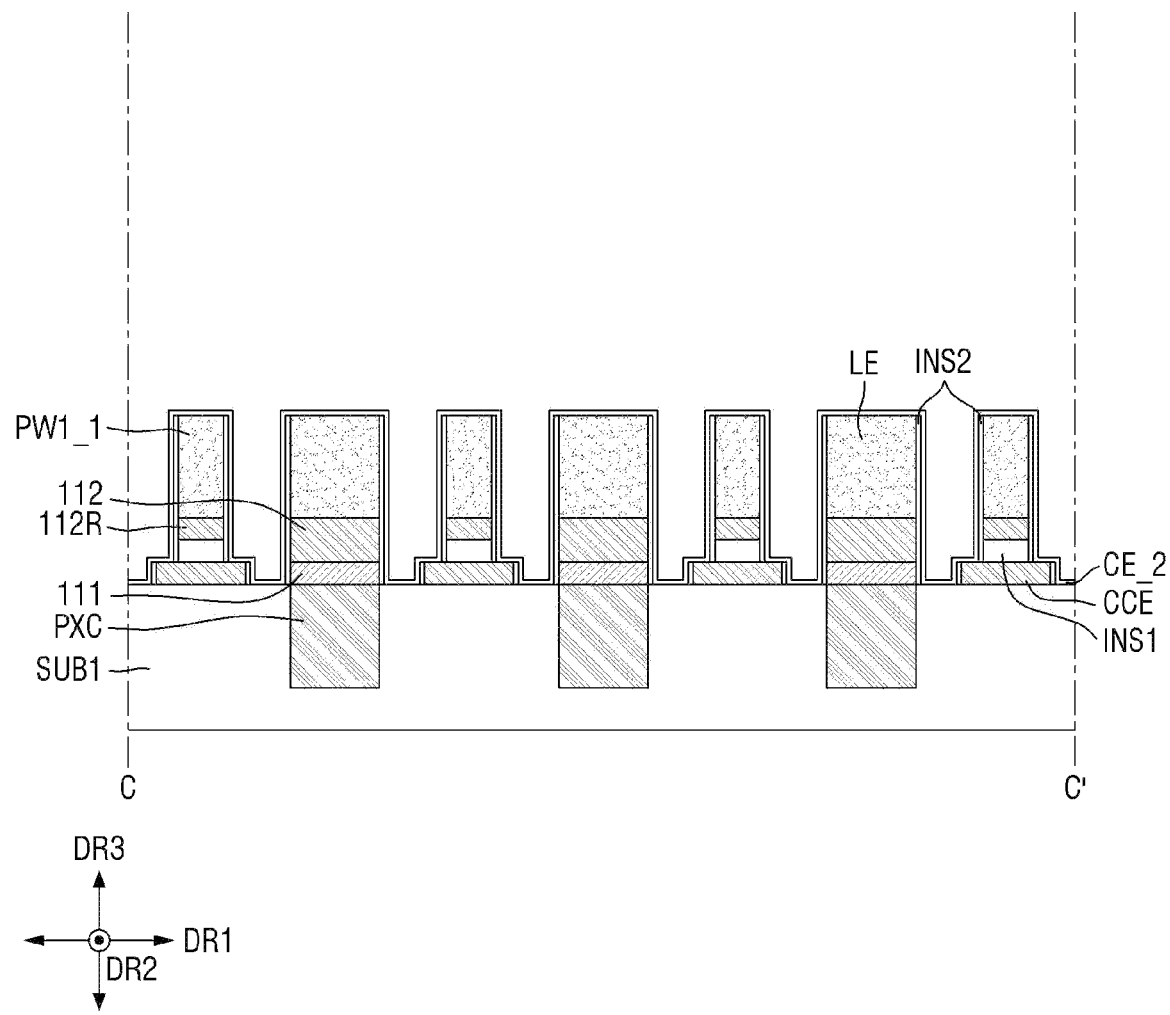

Sixth, as shown in FIG. 38, the common electrode CE is formed to cover the light emitting elements LE and the first partition wall PW1_1 (S630 of FIG. 30).

The common electrode CE_2 is deposited on the light emitting elements LE and the first partition wall PW1_1. In this case, the common electrode CE_2 may be disposed on the upper surface of the common connection electrode CCE, the upper surface of the first partition wall PW1_1, and the upper surface of the first substrate SUB1 disposed between the pixel electrode 111 and the common connection electrode CCE. The common electrode CE_2 may also be disposed on the second insulating film INS2 disposed on the sides of the common connection electrode CCE, the sides of the first partition wall PW1_1, the sides of each of the pixel electrodes 111, the sides of each of the connection electrodes 112, sides of the first insulating layer INS1, sides of the conductive pattern 112R, and/or the sides of each of the light emitting elements LE.

A portion of the upper surface of the common connection electrode CCE, which is exposed without being covered by the first insulating film INS1, may be in contact with the common electrode CE_2. Therefore, the common electrode CE_2 may be connected to the common connection electrode CCE.

The common electrode CE_2 may include a transparent conductive material. The common electrode CE_2 may be formed of a transparent conductive oxide (TCO) such as indium tin oxide (ITO) or indium zinc oxide (IZO). A thickness of the common electrode CE_2 may be 0.1 µm, approximately.

Figure 39:
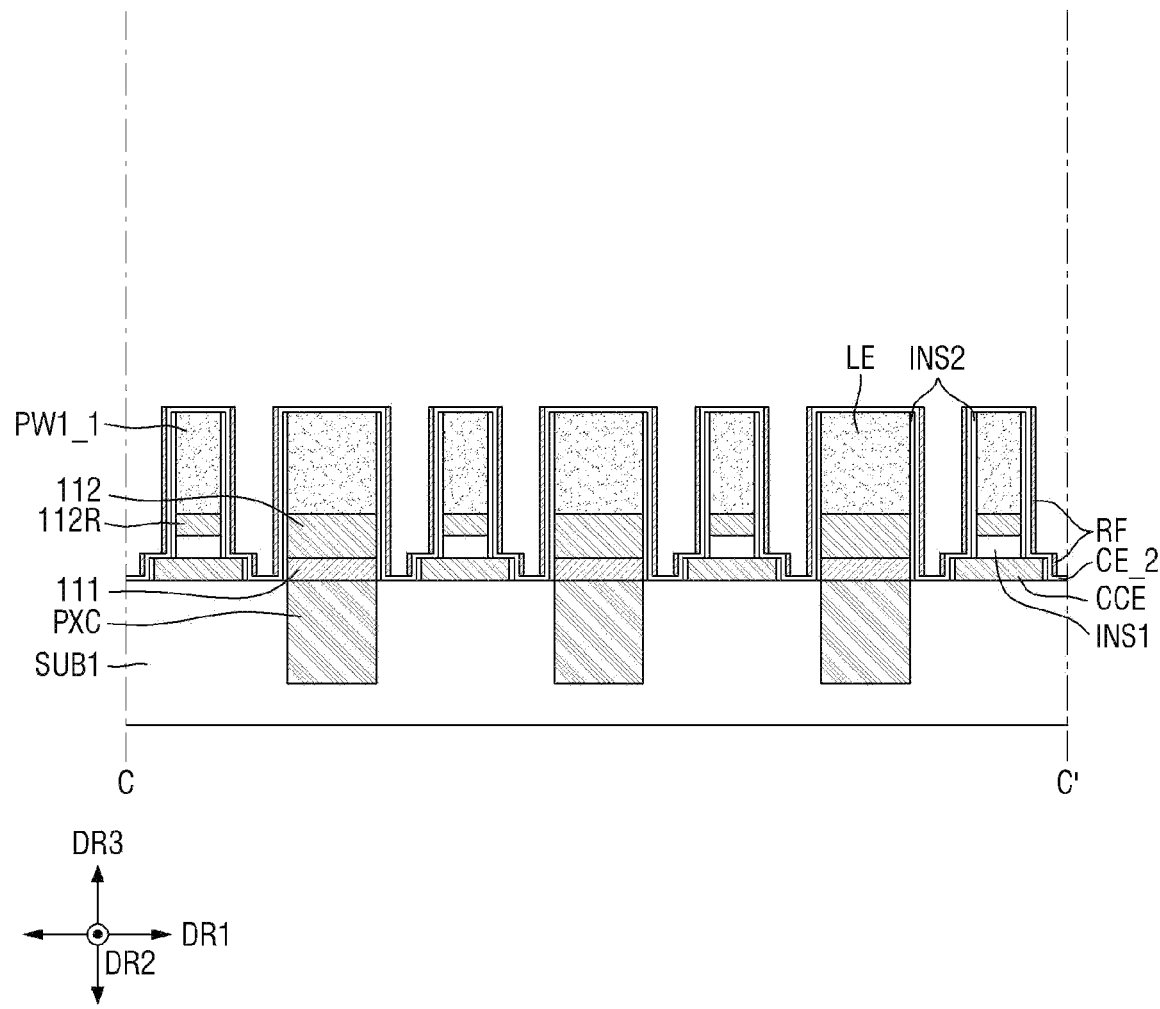

Seventh, as shown in FIG. 39, the reflection film RF is formed on the sides of each of the light emitting elements LE, the sides of each of the common connection electrodes CCE and the sides of the first partition wall PW1_1 (S730 of FIG. 30).

A reflection layer is entirely deposited to cover the light emitting elements LE and the first partition wall PW1_1. In this case, the reflection layer may be disposed on the common electrode CE disposed on the upper surface and sides of the common connection electrode CCE, the upper surface and sides of the first partition wall PW1_1, the sides of each of the pixel electrodes 111, the sides of each of the connection electrodes 112, the upper surface and sides of each of the light emitting elements LE, sides of the first insulating layer INS1, sides of the conductive pattern 112R, and/or the upper surface of the first substrate SUB1 disposed between the pixel electrode 111 and the common connection electrode CCE.

Then, a big voltage difference is formed in the third direction DR3 without a separate mask, and when the reflection layer is etched using a suitable etching material (e.g., a predetermined etching material), the suitable etching material (e.g., a predetermined etching material) etches the reflection layer while moving in the third direction DR3. Therefore, the reflection layer RF disposed on a horizontal plane defined by the first direction DR1 and the second direction DR2 is removed, whereas the reflection layer RF disposed on a vertical plane defined by the third direction DR3 may not be removed. For this reason, the reflection layer RF disposed on the upper surface of the common connection electrode CCE, the upper surface of the first partition wall PW1_1, the upper surface of each of the light emitting elements LE, and the upper surface of the first substrate SUB1 disposed between the pixel electrode 111 and the common connection electrode CCE may be removed. In contrast, the reflection layer disposed on the sides of the common connection electrode CCE, the sides of the first partition wall PW1_1, the sides of each of the pixel electrodes 111, the sides of each of the connection electrodes 112, sides of the first insulating layer INS1, sides of the conductive pattern 112R, and/or the sides of each of the light emitting elements LE may not be removed. Therefore, the reflection film RF may be disposed on the common electrode CE_2 disposed on the sides of the common connection electrode CCE, the sides of the first partition wall PW1_1, the sides of each of the pixel electrodes 111, the sides of each of the connection electrodes 112, sides of the first insulating layer INS1, sides of the conductive pattern 112R, and/or the sides of each of the light emitting elements LE.

The reflection film RF may include a metal material having high reflectance, such as aluminum (Al). A thickness of the reflection film RF may be 0.1 µm, approximately.

Because a portion of an upper portion of the reflection layer disposed on the sides of the first partition wall PW1_1 may be removed, a height of the reflection film RF disposed on the sides of the first partition wall PW1_1 may be lower than that of the upper surface of the first partition wall PW1_1. Similarly, because a portion of an upper portion of the reflection layer disposed on the sides of each of the light emitting elements LE may be removed, a height of the reflection film RF disposed on the sides of each of the light emitting elements LE may be lower than that of the upper surface of the light emitting element LE.

Figure 40:
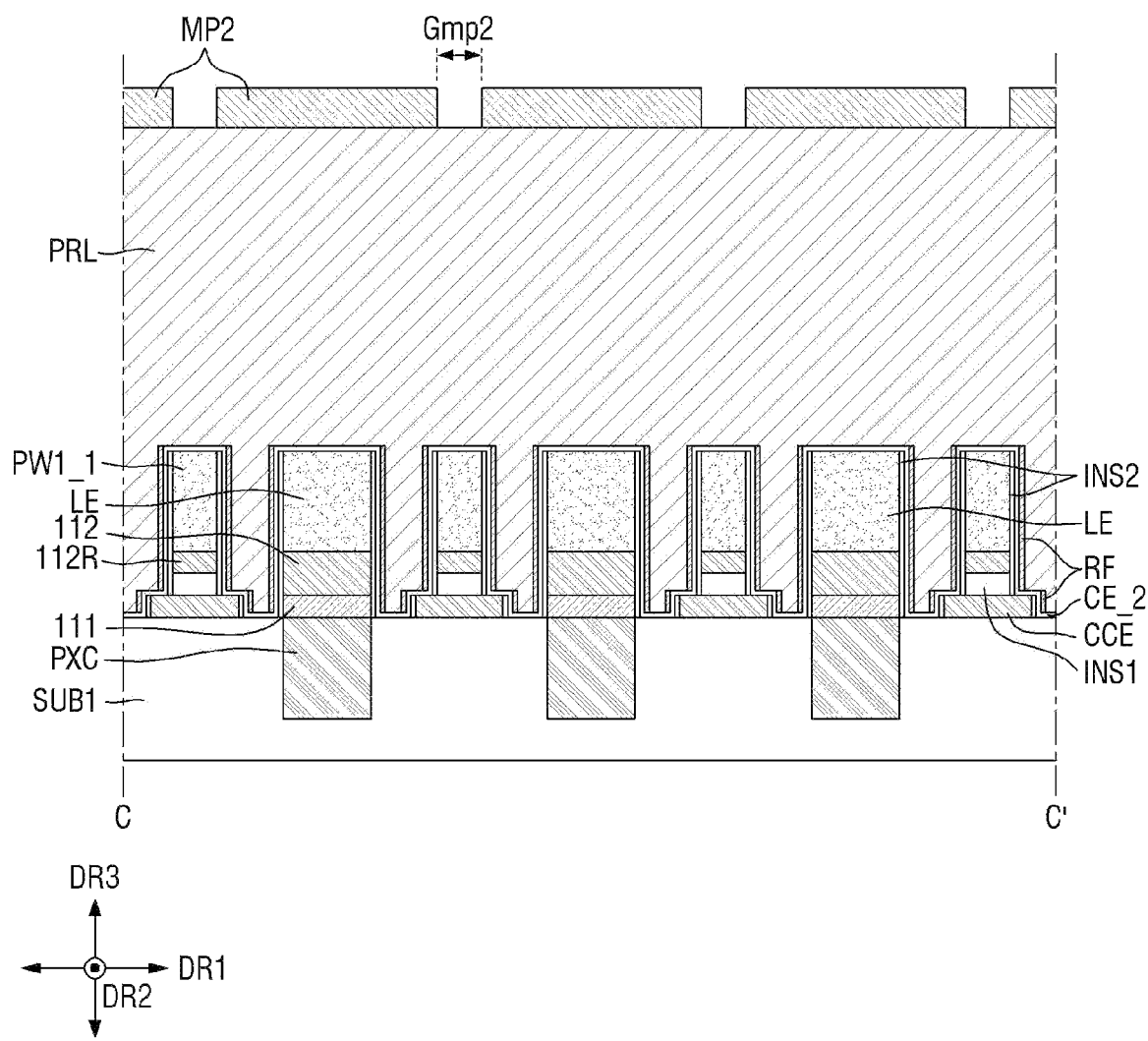

Eighth, as shown in FIG. 40, a photoresist layer PRL covering the light emitting elements LE and the first partition wall PW1_1 is formed, and a second mask pattern MP2 is formed on the photoresist layer PRL (S830 of FIG. 30).

The photoresist layer PRL may be a negative photosensitive resin in which an area to which light is irradiated remains, or may be a positive photosensitive resin from which an area to which light is irradiated is removed. Although the description of FIG. 40 is based on that the photoresist layer PRL is a positive photosensitive resin, the second mask pattern MP2 may be disposed to overlap the light emitting elements LE in the third direction DR3. A gap area Gmp2 in which the second mask pattern MP2 is not disposed may overlap the first partition wall PW1_1 in the third direction DR3.

Figure 41:
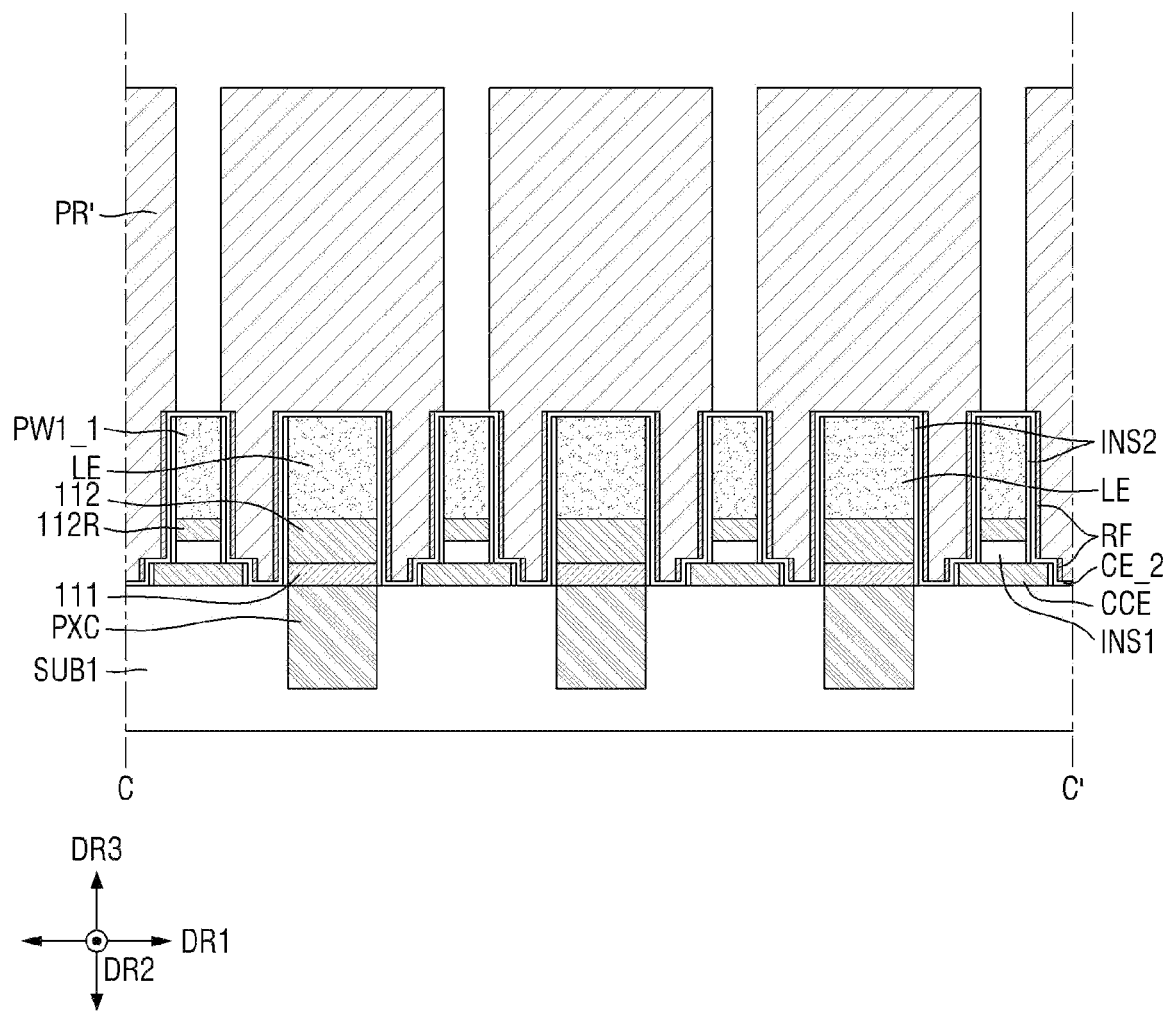

Ninth, as shown in FIG. 41, the photoresist layer PRL is etched in accordance with the second mask pattern MP2 to form a photoresist pattern PR' (S930 of FIG. 30).

When the photoresist layer PRL is a positive photosensitive resin, light may be irradiated to an area that is not covered by the second mask pattern MP2. For this reason, the area that is not covered by the second mask pattern MP2 may be removed when the photoresist layer PRL is developed.

For this reason, the photoresist pattern PR' may be disposed to cover the light emitting elements LE. Also, the photoresist pattern PR' may cover an upper edge of the first partition wall PW1_1. A portion of the upper surface of the first partition wall PW1_1 may be exposed without being covered by the photoresist pattern PR'. After the photoresist pattern PR' is formed, the second mask pattern MP2 may be removed.

Figure 42:
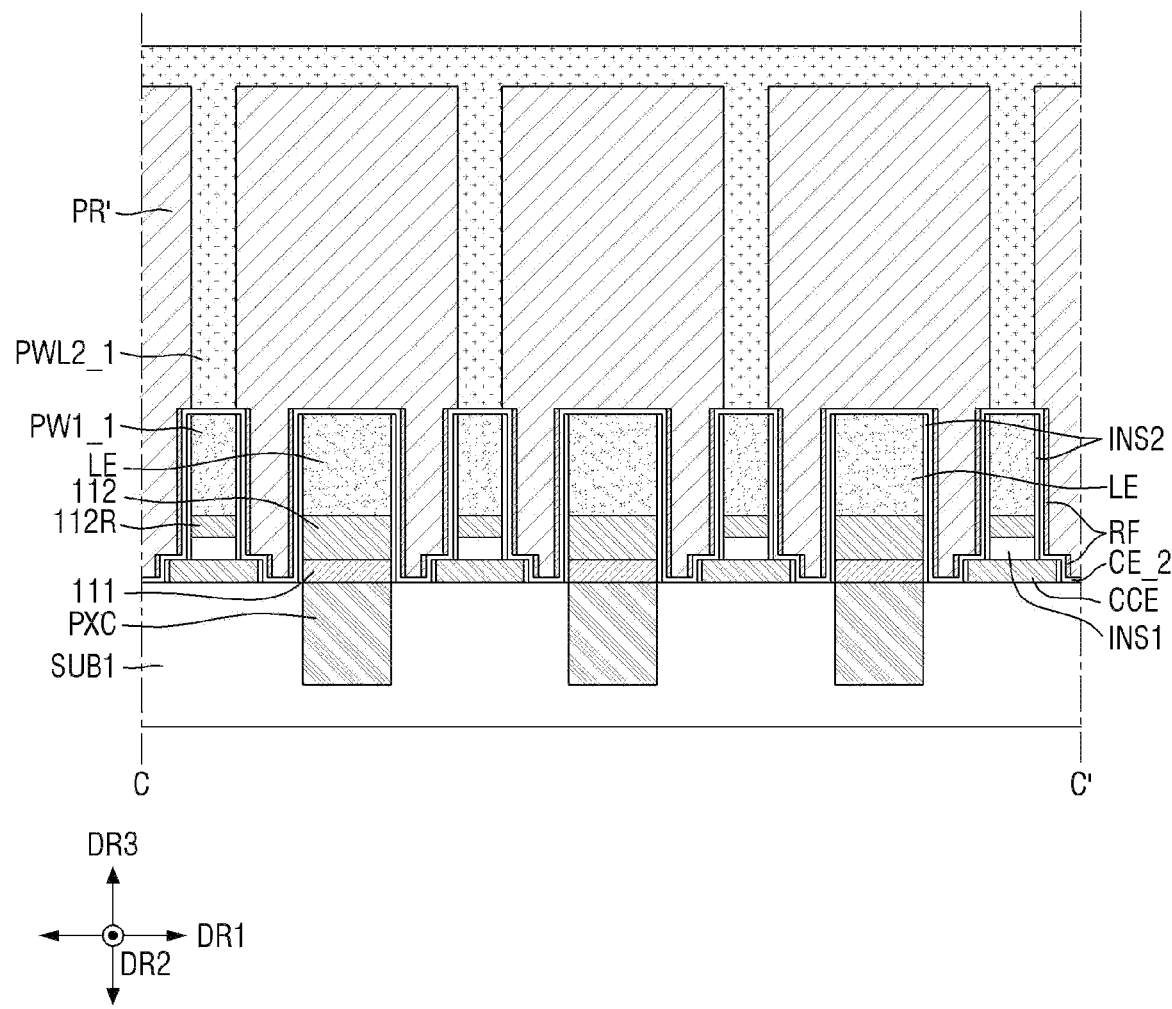

Tenth, as shown in FIG. 42, a second partition wall material layer PWL2_1 for filling the area partitioned by the photoresist pattern PR' is formed (S1030 of FIG. 30).

The second partition wall material layer PWL2_1 may be formed on the photoresist pattern PR' by electro-plating or electroless-plating.

A thickness of the second partition wall material layer PWL2_1 may be thicker than that of the photoresist pattern PR'. For example, an upper surface of the photoresist pattern PR' may be covered by the second partition wall material layer PWL2_1. The second partition wall material layer PWL2_1 may include a conductive material, for example, an opaque metal material such as molybdenum (Mo), aluminum (Al), chromium (Cr), gold (Au), titanium (Ti), nickel (Ni), neodymium (Nd), and copper (Cu).

Figure 43:
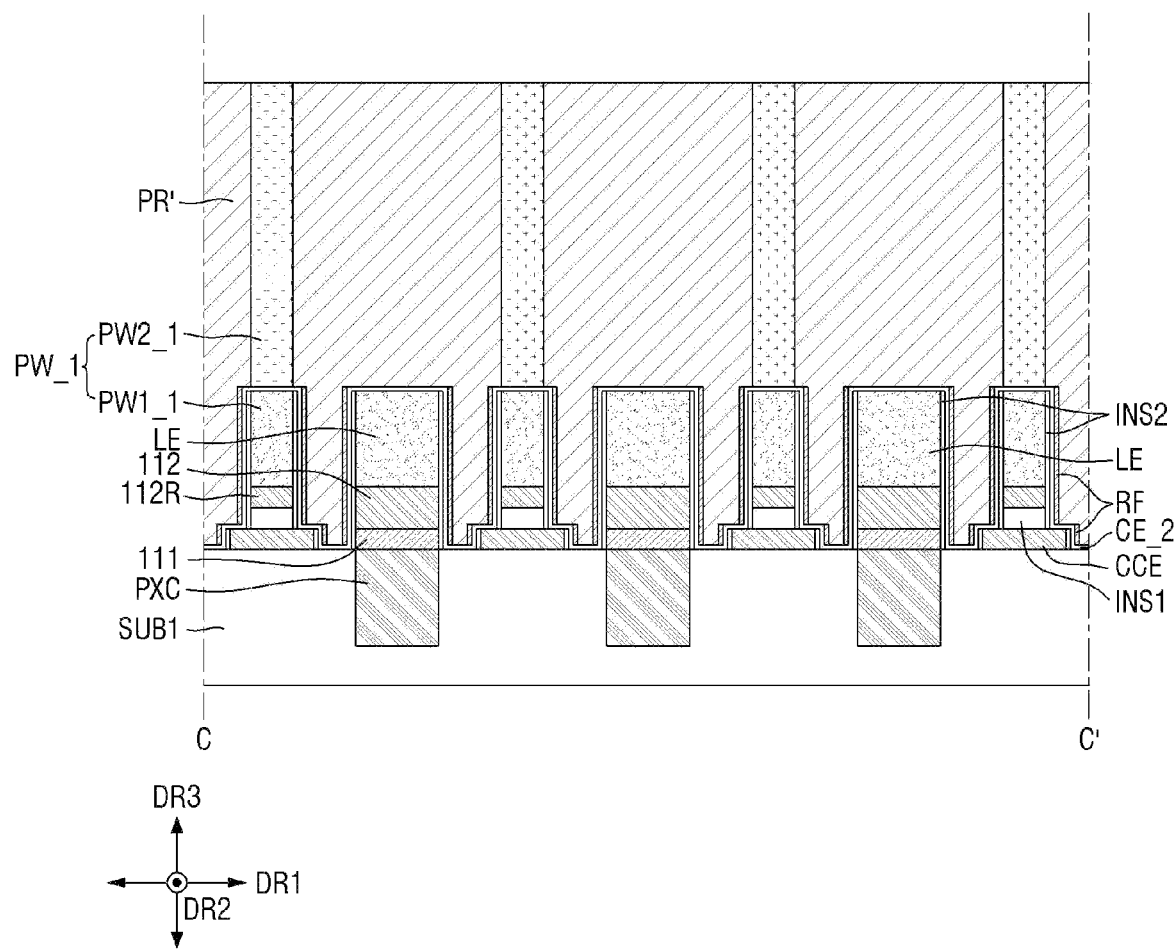

Eleventh, as shown in FIG. 43, the second partition wall material layer PWL2_1 is removed to expose the upper surface of the photoresist pattern PR', whereby the second partition wall PW2_1 is formed (S1130 of FIG. 30).

The second partition wall material layer PWL2_1 is removed to expose the upper surface of the photoresist pattern PR', whereby the second partition wall PW2_1 is formed. The second partition wall material layer PWL2_1 disposed on the photoresist pattern PR' is removed by a polishing process such as a CMP process. For this reason, the upper surface of the photoresist pattern PR' may be exposed without being covered by the second partition wall PW2_1. The upper surface of the photoresist pattern PR' and the upper surface of the second partition wall PW2_1 may be connected to each other to be flat.

The second partition wall PW2_1 may be around (e.g., surround) sides of the photoresist pattern PR'. The lower surface of the second partition wall PW2_1 may be in contact with the common electrode CE_2.

Figure 44:
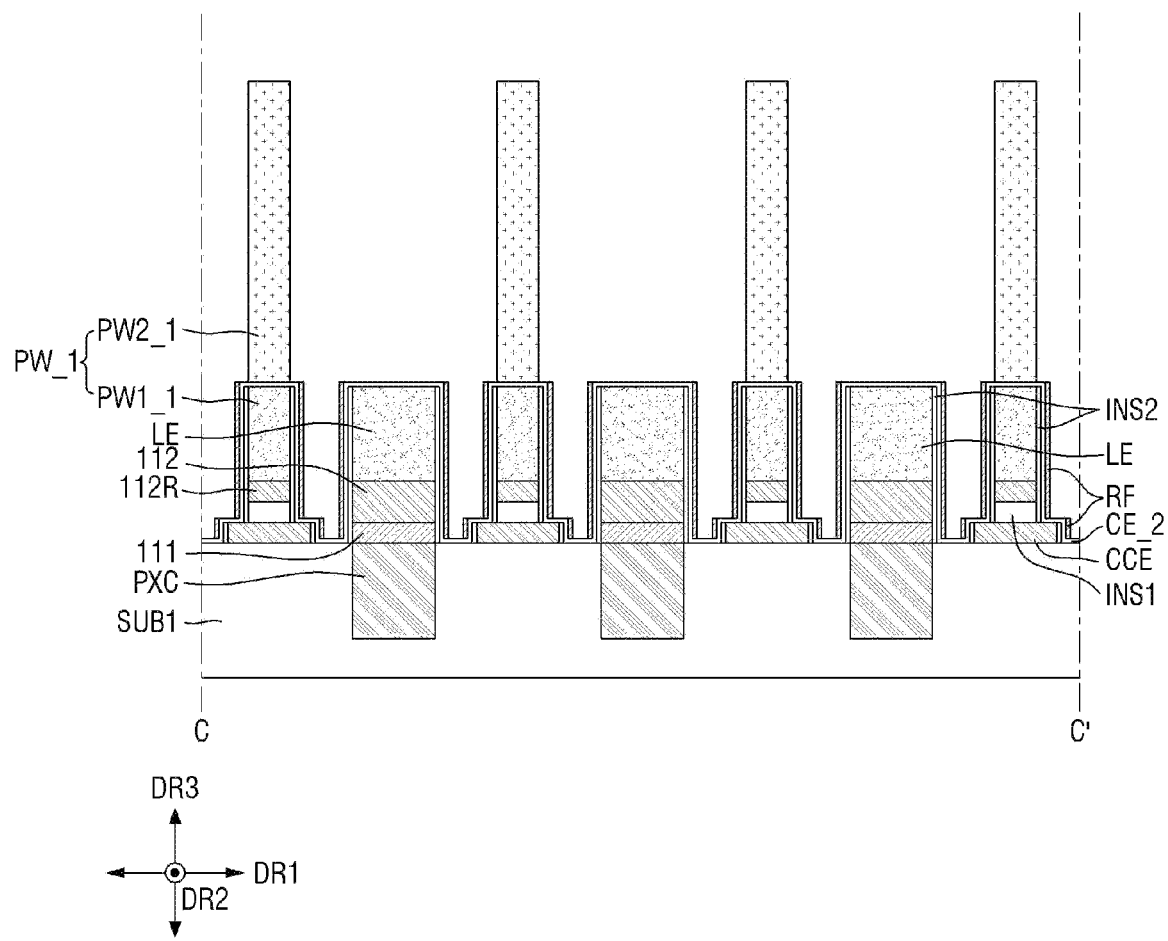
Figure 45:
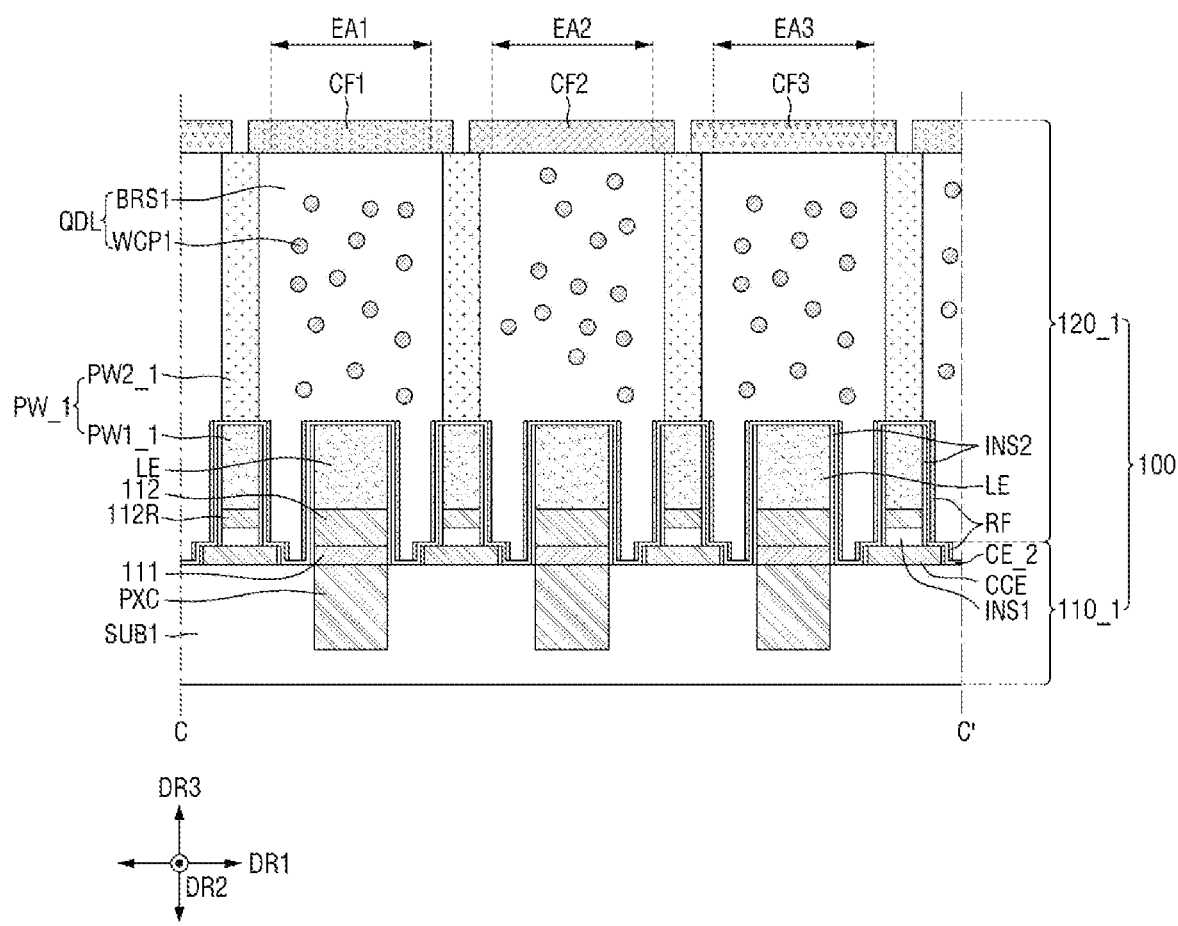

Twelfth, the photoresist pattern PR' is removed as shown in FIG. 44, the wavelength conversion layer QDL is formed in the area partitioned by the second partition wall PW2_1 as shown in FIG. 45, and color filters CF1, CF2, and CF3 are formed on the wavelength conversion layer QDL (S1230 of FIG. 30).

Since the step S1230 of FIG. 30 is similar to the step S1010 described with reference to FIG. 9, its description will be omitted.

Figure 46:
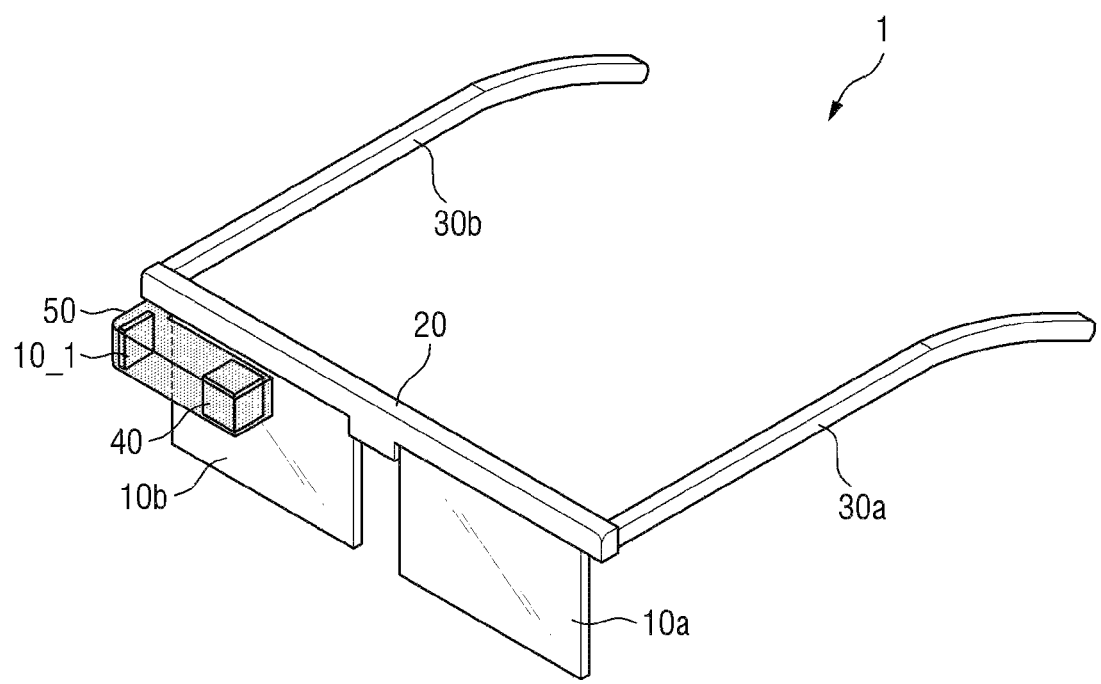
FIG. 46 is an example view illustrating a virtual reality device including a display device according to one or more embodiments.

FIG. 46 is an example view illustrating a virtual reality device including a display device according to one or more embodiments. In FIG. 46, a virtual reality device 1 to which a display device 10_1 according to one or more embodiments is applied is shown.

Referring to FIG. 46, the virtual reality device 1 according to one or more embodiments may be a glasses-type device. The virtual reality device 1 according to one or more embodiments may include a display device 10_1, a left-eye lens 10*a*, a right-eye lens 10*b*, a support frame 20, glasses frame legs 30*a* and 30*b*, a reflection member 40, and a display device accommodating portion 50.

Although FIG. 46 illustrates the virtual reality device 1 that includes glasses frame legs 30*a* and 30*b*, the virtual reality device 1 according to one or more embodiments may be applied to a head mounted display including a head mounting band, which may be mounted on a head, instead of the glasses frame legs 30*a* and 30*b*. That is, the virtual reality device 1 according to one or more embodiments is not limited to that shown in FIG. 46, and is applicable to various electronic devices in various forms.

The display device accommodating portion 50 may include a display device 10_1 and a reflection member 40. An image displayed on the display device 10_1 may be reflected from the reflection member 40 and provided to a user's right eye through the right-eye lens 10*b*. For this reason, the user may view a virtual reality image displayed on the display device 10_1 through the right eye.

Although FIG. 46 illustrates that the display device accommodating portion 50 is disposed at a right end of the support frame 20, the present disclosure is not limited thereto. For example, the display device accommodating portion 50 may be disposed at a left end of the support frame 20, and in this case, the image displayed on the display device 10_1 may be reflected from the reflection member 40 and provided to the user's left eye through the left-eye lens 10*a*. For this reason, the user may view the virtual reality image displayed on the display device 10_1 through the left eye. Alternatively, the display device accommodating portion 50 may be disposed at both the left end and the right end of the support frame 20, and in this case, the user may view the virtual reality image displayed on the display device 10_1 through both the left eye and the right eye.

Figure 47:
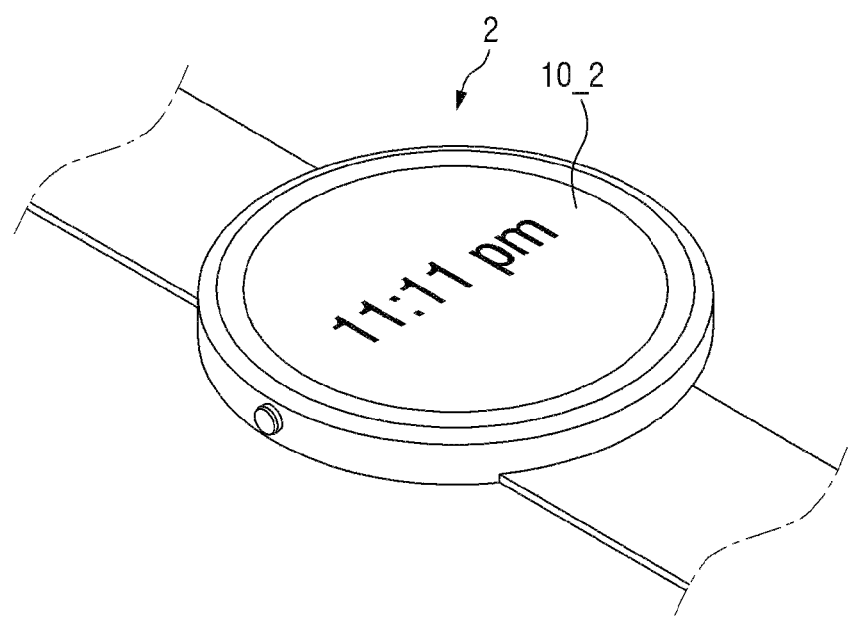
FIG. 47 is an example view illustrating a smart device including a display device according to one or more embodiments.

FIG. 47 is an example view illustrating a smart device including a display device according to one or more embodiments.

Referring to FIG. 47, a display device 10_2 according to one or more embodiments may be applied to a smart watch 2, which is one of the smart device.

Figure 48:
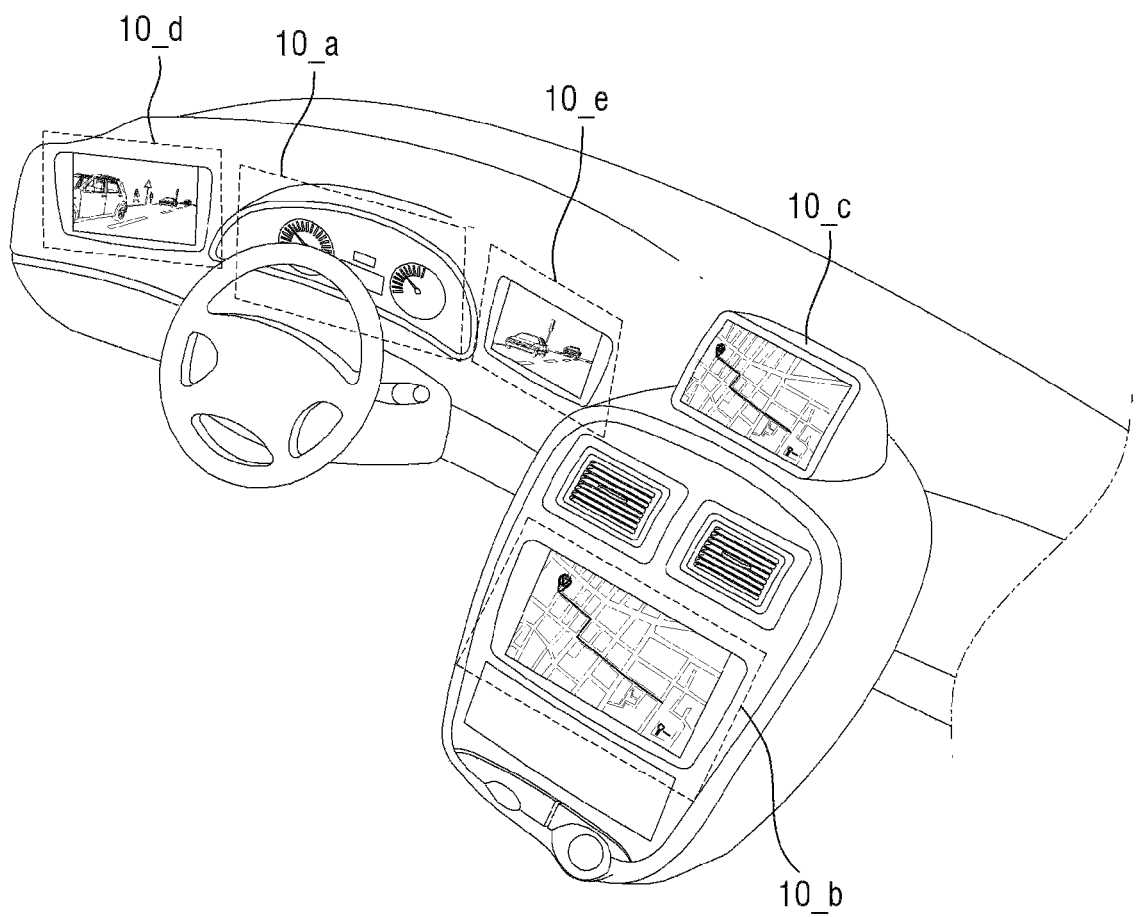
FIG. 48 is an example view illustrating a vehicle dashboard and a center fascia including a display device according to one or more embodiments.

FIG. 48 is an example view illustrating a vehicle dashboard and a center fascia including a display device according to one or more embodiments. A vehicle to which display devices 10_*a*, 10_*b*, 10_*c*, 10_*d* and 10_*e* according to one or more embodiments are applied is shown in FIG. 48.

Referring to FIG. 48, the display devices 10_*a*, 10_*b*, and 10_*c* according to one or more embodiments may be applied to a dashboard of the vehicle, applied to a center fascia of the vehicle, or applied to a center information display (CID) disposed on the dashboard of the vehicle. In addition, the display devices 10_*d* and 10_*e* according to one or more embodiments may be applied to a room mirror display that replaces a side mirror of the vehicle.

Figure 49:
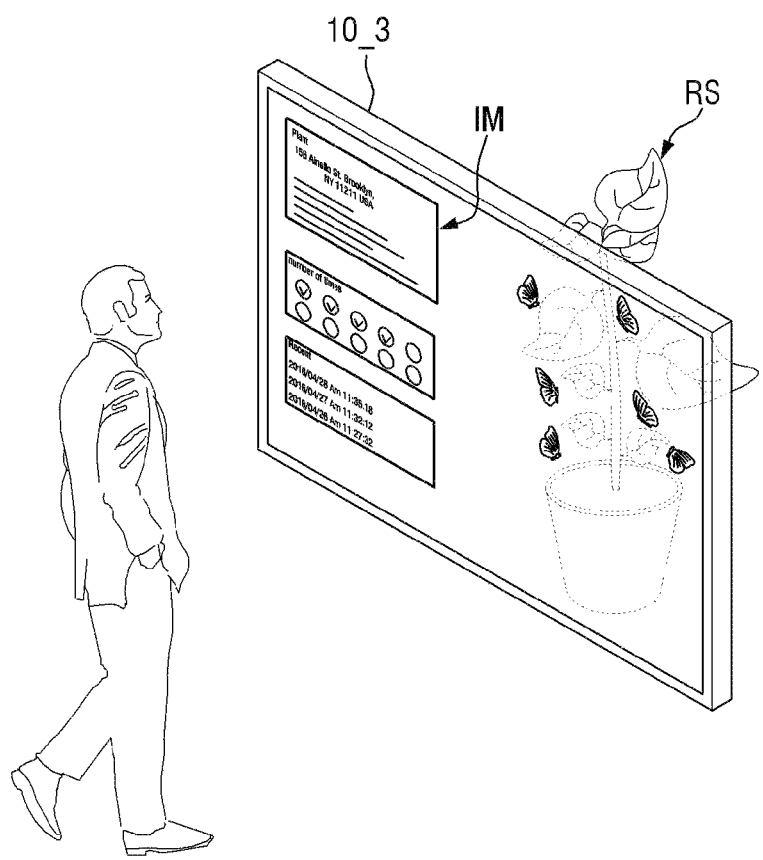
FIG. 49 is an example view illustrating a transparent display device including a display device according to one or more embodiments.

FIG. 49 is an example view illustrating a transparent display device including a display device according to one or more embodiments.

Referring to FIG. 49, a display device 10_3 according to one or more embodiments may be applied to the transparent display device. The transparent display device may display an image IM and at the same time transmit light. Therefore, a user located on a front surface of the transparent display device may not only view the image IM displayed on the display device 10_3 but also view an object RS or background located at a rear surface of the transparent display device. When the display device 10_3 is applied to the transparent display device, the first substrate SUB1 of the display device 10_3 shown in FIG. 5 may include a light transmitting portion capable of transmitting light or may be formed of a material capable of transmitting light.

Figure 50:
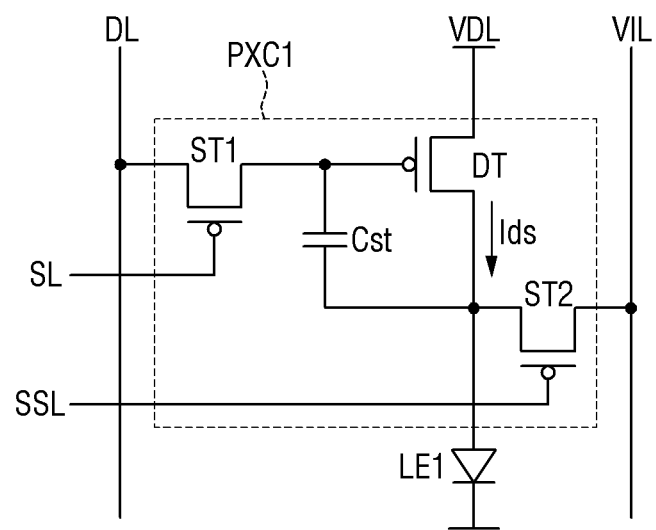
FIG. 50 is a circuit view of a pixel circuit area and a light emitting element according to one or more embodiments.

FIG. 50 is a circuit view of a pixel circuit area and a light emitting element according to one or more embodiments.

An example of the pixel circuit area PXC and the light emitting element LE of FIG. 6 is shown in FIG. 50.

Referring to FIG. 50, the light emitting element LE emits light in accordance with a driving current Ids. The emission amount of the light emitting element LE may be proportional to the driving current Ids. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a source electrode of a driving transistor DT, and the cathode electrode thereof may be connected to a second power line VSL to which a low potential voltage lower than a high potential voltage is supplied.

The driving transistor DT adjusts a current flowing from a first power line VDL, to which a first power voltage is supplied, to the light emitting element LE in accordance with a voltage difference between a gate electrode and the source electrode of the driving transistor DT. The gate electrode of the driving transistor DT may be connected to a first electrode of a first transistor ST1, its source electrode may be connected to the anode electrode of the light emitting element LE, and its drain electrode may be connected to the first power line VDL to which a high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, its first electrode may be connected to the gate electrode of the driving transistor DT, and its second electrode may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, its first electrode may be connected to the initialization voltage line VIL, and its second electrode may be connected to the source electrode of the driving transistor DT.

Although the first electrode of each of the first and second transistors ST1 and ST2 may be a source electrode and the second electrode thereof may be a drain electrode, but it should be noted that they are not limited thereto. That is, the first electrode of each of the first and second transistors ST1 and ST2 may be a drain electrode, and the second electrode thereof may be a source electrode.

A capacitor Cst is formed between the gate electrode and the source electrode of the driving transistor DT. The capacitor Cst stores a differential voltage between a gate voltage and a source voltage of the driving transistor DT.

Although the driving transistor DT and the first and second transistors ST1 and ST2 are formed of P-type metal oxide semiconductor field effect transistors (MOSFETs) in FIG. 50, it should be noted that the transistors are not limited thereto. The driving transistor DT and the first and second transistors ST1 and ST2 may be formed of N-type MOSFETs.

Figure 51:
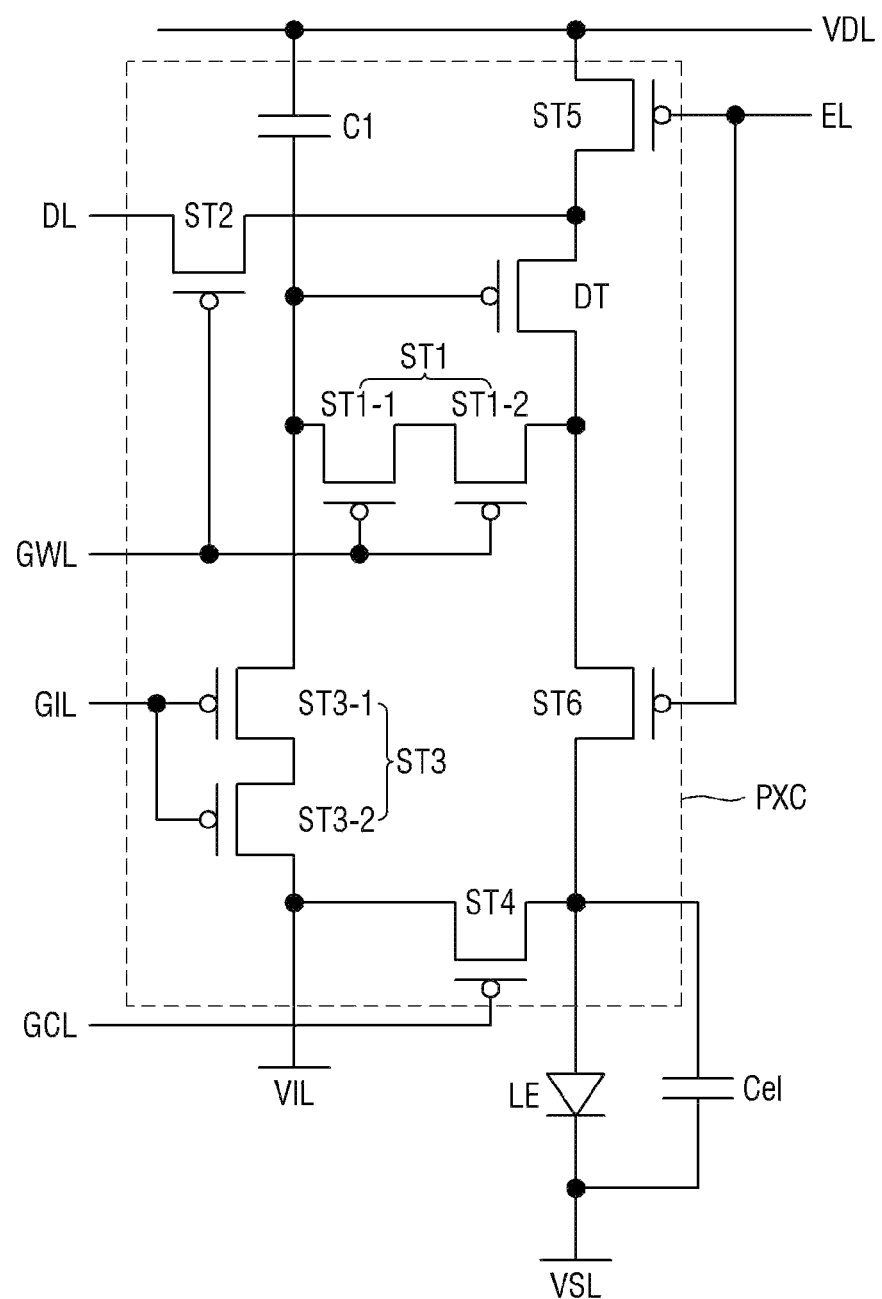
FIG. 51 is a circuit view of a pixel circuit area and a light emitting element according to one or more embodiments.

FIG. 51 is a circuit view of a pixel circuit area and a light emitting element according to another embodiment.

Another example of the pixel circuit area PXC and the light emitting element LE of FIG. 6 is shown in FIG. 51.

Referring to FIG. 51, the light emitting element LE emits light in accordance with the driving current Ids. The emission amount of the light emitting element LE may be proportional to the driving current Ids. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a first electrode of a fourth transistor ST4 and a second electrode of a sixth transistor ST6, and the cathode electrode thereof may be connected to the second power line VSL. A parasitic capacitance Cel may be formed between the anode electrode and the cathode electrode of the light emitting element LE.

The pixel circuit area PXC includes a driving transistor DT, switch elements, and a capacitor C1. The switch elements include first to sixth transistors ST1, ST2, ST3, ST4, ST5, and ST6.

The driving transistor DT includes a gate electrode, a first electrode, and a second electrode. The driving transistor DT controls a drain-source current Ids (hereinafter, referred to as "driving current") flowing between the first electrode and the second electrode in accordance with a data voltage applied to the gate electrode.

The capacitor C1 is formed between the gate electrode of the driving transistor DT and the first power line VDL. One electrode of the capacitor C1 may be connected to the gate electrode of the driving transistor DT, and the other electrode thereof may be connected to the first power line VDL.

When a first electrode of each of the first to sixth transistors ST1, ST2, ST3, ST4, ST5, and ST6 and the driving transistor DT is a source electrode, a second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

An active layer of each of the first to sixth transistors ST1, ST2, ST3, ST4, ST5, and ST6 and the driving transistor DT may be formed of any one of poly silicon, amorphous silicon, and oxide semiconductor. When the semiconductor layer of each of the first to sixth transistors ST1, ST2, ST3, ST4, ST5, and ST6 and the driving transistor DT is formed of poly silicon, a process of forming the same may be a low temperature poly silicon (LTPS) process.

Although the first to sixth transistors ST1, ST2, ST3, ST4, ST5, and ST6 and the driving transistor DT are formed of P-type MOSFETs in FIG. 51, the transistors are not limited thereto, and may be formed of N-type MOSFETs.

Moreover, the first power voltage of the first power line VDL, a second power voltage of the second power line VSL, and a third power voltage of a third power line VIL may be set in consideration of characteristics of the driving transistor DT, characteristics of the light emitting element LE, and the like.

Figure 52:
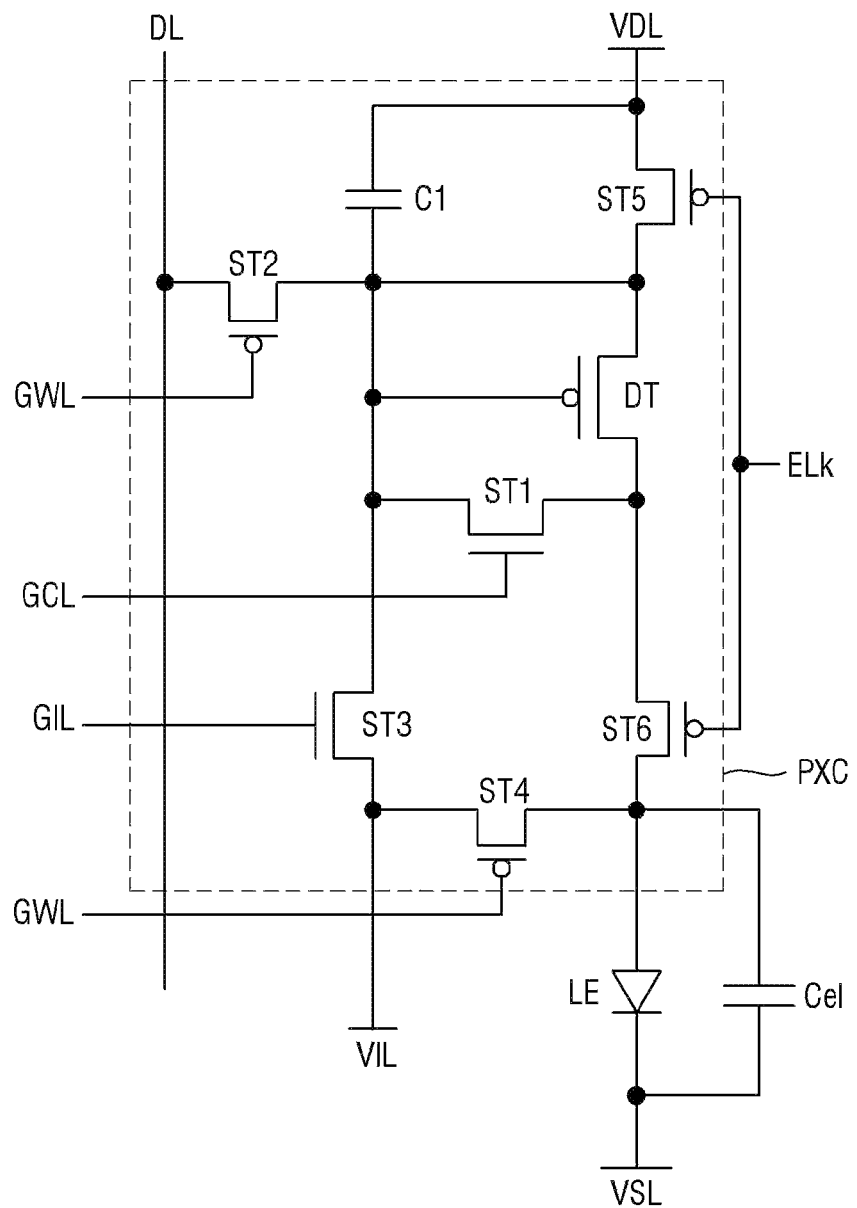
FIG. 52 is a circuit view of a pixel circuit area and a light emitting element according to one or more embodiments.

FIG. 52 is a circuit view of a pixel circuit area and a light emitting element according to one or more embodiments.

Other example of the pixel circuit area PXC and the light emitting element LE of FIG. 5 is shown in FIG. 52.

The embodiment of FIG. 52 is different from the embodiment of FIG. 51 in that the driving transistor DT, the second transistor ST2, the fourth transistor ST4, the fifth transistor ST5, and the sixth transistor ST6 are formed of P-type MOSFETs, and the first transistor ST1 and the third transistor ST3 are formed of N-type MOSFETs.

Referring to FIG. 52, the active layer of each of the driving transistor DT, the second transistor ST2, the fourth transistor ST4, the fifth transistor ST5, and the sixth transistor ST6, which are formed of P-type MOSFETs, may be formed of poly silicon, and the active layer of each of the first transistor ST1 and the third transistor ST3, which are formed of N-type MOSFETs, may be formed of an oxide semiconductor.

The embodiment of FIG. 52 is different from the embodiment of FIG. 51 in that the gate electrode of the second transistor ST2 and the gate electrode of the fourth transistor ST4 are connected to a write scan line GWL, and the gate electrode of the first transistor ST1 is connected to a control scan line GCL. In FIG. 52, because the first transistor ST1 and the third transistor ST3 are formed of N-type MOSFETs, a scan signal of a gate high voltage may be applied to the control scan line GCL and an initialization scan line GIL. In contrast, because the second transistor ST2, the fourth transistor ST4, the fifth transistor ST5, and the sixth transistor ST6 are formed of P-type MOSFETs, a scan signal of a gate low voltage may be applied to the write scan line GWL and a light emission line EL.

It should be noted that the pixel circuit area PXC according to one or more embodiments of the present disclosure is not limited to that shown in FIGS. 50 to 52. The pixel circuit area PXC according to the described embodiments of the present disclosure may be formed in other circuit structures, which are known and may be adopted by those skilled in the art, in addition to the embodiments shown in FIGS. 50 to 52.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
   a substrate;
   pixel electrodes on the substrate;
   light emitting elements on corresponding ones of the pixel electrodes;
   a first partition wall around sides of each of the light emitting elements;
   a common electrode on an upper surface of each of the light emitting elements;
   wavelength conversion layers on the common electrode; and
   a second partition wall around sides of each of the wavelength conversion layers,
   wherein the first partition wall and the second partition wall are connected to the common electrode and have conductivity.

2. The display device of claim 1, wherein the common electrode is in contact with the first partition wall and the second partition wall.

3. The display device of claim 1, wherein the second partition wall overlaps the first partition wall in a thickness direction of the substrate.

4. The display device of claim 1, wherein the common electrode is between the first partition wall and the second partition wall.

5. The display device of claim 1, wherein any one of the wavelength conversion layers overlaps any one of the light emitting elements in a thickness direction of the substrate.

6. The display device of claim 5, wherein a width of the wavelength conversion layer in a first direction is wider than that of the light emitting element.

7. The display device of claim 1, wherein the second partition wall has conductivity.

8. The display device of claim 7, wherein the first partition wall and the second partition wall comprise an opaque metal material.

9. The display device of claim 1, wherein the first partition wall and the second partition wall comprise a same material.

10. The display device of claim 1, wherein the second partition wall comprises a light-shielding material that absorbs or shields light.

11. The display device of claim 1, wherein the first partition wall is in contact with the second partition wall.

12. The display device of claim 1, wherein a distance between common electrodes that are adjacent to each other in a first direction is shorter than a distance between the light emitting elements that are adjacent to each other in the first direction.

13. The display device of claim 1, wherein a distance between common electrodes adjacent to each other in a first direction is shorter than a width of the first partition wall and a width of the second partition wall in the first direction.

14. A display device comprising:
   a substrate;
   a first partition wall on the substrate;
   a second partition wall on the first partition wall;
   a light emitting element in a light emission area partitioned by the first partition wall and the second partition wall on the substrate and extended in a thickness direction of the substrate; and
   a wavelength conversion layer on the light emitting element in the light emission area to convert a wavelength of light emitted from the light emitting element,
   wherein the second partition wall has conductivity, and
   wherein the wavelength conversion layer is between the light emitting element and the first partition wall.

15. The display device of claim 14, wherein a thickness of the light emitting element is different from that of the second partition wall.

16. The display device of claim 14, wherein a thickness of the light emitting element is the same as that of the first partition wall.

17. The display device of claim 14, wherein the light emitting element comprises:
   a first semiconductor layer on the substrate;
   an active layer on the first semiconductor layer; and
   a second semiconductor layer on the active layer.

18. The display device of claim 14, further comprising a common electrode between the light emitting element and the wavelength conversion layer and between the first partition wall and the second partition wall.

19. A display device comprising:
   a substrate;
   a first partition wall on the substrate;
   a second partition wall on the first partition wall;
   a light emitting element in a light emission area partitioned by the first partition wall and the second partition wall on the substrate and extended in a thickness direction of the substrate; and
   a wavelength conversion layer on the light emitting element in the light emission area to convert a wavelength of light emitted from the light emitting element, wherein the second partition wall has conductivity,
wherein the light emitting element comprises:
- a first semiconductor layer on the substrate;
- an active layer on the first semiconductor layer; and
- a second semiconductor layer on the active layer, and wherein the first partition wall comprises a first sub-partition wall comprising a same material as that of the first semiconductor layer, a second sub-partition wall comprising a same material as that of the active layer, and a third sub-partition wall comprising a same material as that of the second semiconductor layer.

20. An electronic device for providing an image, comprising:
- a display device comprising:
  - a substrate;
  - pixel electrodes on the substrate;
  - light emitting elements on corresponding ones of the pixel electrodes;
  - a first partition wall around sides of each of the light emitting elements;
  - a common electrode on an upper surface of each of the light emitting elements;
  - wavelength conversion layers on the common electrode; and
  - a second partition wall around sides of each of the wavelength conversion layers,
- wherein the first partition wall and the second partition wall are connected to the common electrode and have conductivity.

* * * * *